(12) United States Patent
Kim et al.

(10) Patent No.: US 12,170,333 B2
(45) Date of Patent: Dec. 17, 2024

(54) INTEGRATED CIRCUIT DEVICES HAVING UNIFORMLY FORMED STRUCTURE

(71) Applicant: Samsung Electronics Co., Ltd., Suwon-si (KR)

(72) Inventors: Sungmin Kim, Incheon (KR); Daewon Ha, Seoul (KR)

(73) Assignee: Samsung Electronics Co., Ltd. (KR)

(*) Notice: Subject to any disclaimer, the term of this patent is extended or adjusted under 35 U.S.C. 154(b) by 546 days.

(21) Appl. No.: 17/494,071

(22) Filed: Oct. 5, 2021

(65) Prior Publication Data
US 2022/0293595 A1      Sep. 15, 2022

(30) Foreign Application Priority Data
Mar. 9, 2021   (KR) .................. 10-2021-0030938

(51) Int. Cl.
*H01L 29/78*       (2006.01)
*H01L 29/417*      (2006.01)

(52) U.S. Cl.
CPC .... *H01L 29/7851* (2013.01); *H01L 29/41791* (2013.01)

(58) Field of Classification Search
CPC .......... H01L 29/7851; H01L 29/41791; H01L 29/0673; H01L 29/42392; H01L 29/78696; H01L 27/0886; H01L 21/823437; H01L 29/7854; H01L 29/7848
See application file for complete search history.

(56) References Cited

U.S. PATENT DOCUMENTS

| | | | |
|---|---|---|---|
| 8,436,404 B2 | 5/2013 | Bohr et al. | |
| 8,871,575 B2 | 10/2014 | Wang et al. | |
| 9,484,272 B2 | 11/2016 | Cappellani et al. | |
| 9,875,938 B2 | 1/2018 | Jeong et al. | |
| 10,192,867 B1 | 1/2019 | Frougier et al. | |
| 10,332,986 B2 | 6/2019 | Bi et al. | |
| 10,615,256 B2 | 4/2020 | Cheng et al. | |
| 2008/0277691 A1 | 11/2008 | Ernst et al. | |
| 2020/0075720 A1 | 3/2020 | Cheng et al. | |
| 2020/0303500 A1* | 9/2020 | Loubet ................. | B82Y 10/00 |

FOREIGN PATENT DOCUMENTS

TW      201810659 A      3/2018

* cited by examiner

*Primary Examiner* — Changhyun Yi
(74) *Attorney, Agent, or Firm* — Myers Bigel, P.A.

(57) ABSTRACT

An integrated circuit device according to the inventive concept includes: a fin-type active area protruding from a substrate and extending in a first horizontal direction; a stopper layer that is above and spaced apart from the fin-type active area; a gate electrode extending in a second horizontal direction orthogonal to the first horizontal direction, on the fin-type active area, and in a space between the fin-type active area and the stopper layer; and a gate capping layer on upper surfaces of the gate electrode and the stopper layer.

19 Claims, 39 Drawing Sheets

INTEGRATED CIRCUIT DEVICES HAVING UNIFORMLY FORMED STRUCTURE

CROSS-REFERENCE TO RELATED APPLICATION

This application is based on and claims priority under 35 U.S.C. § 119 to Korean Patent Application No. 10-2021-0030938, filed on Mar. 9, 2021, in the Korean Intellectual Property Office, the disclosure of which is incorporated by reference herein in its entirety.

BACKGROUND

The present disclosure relates to integrated circuit devices. Along with the development of electronics technology, down-scaling of integrated circuit devices has rapidly progressed, and accordingly, components of an integrated circuit device, e.g., a fin-type active area and a line width and a pitch of a gate electrode, have decreased.

Because demand may be high for an integrated circuit device having a fast operating speed and accurate operations, it may be desirable to uniformly form components of the integrated circuit device even when line widths and pitches of the components are reduced.

SUMMARY

The inventive concept provides an integrated circuit device having a structure uniformly formed even when line widths and pitches of components are reduced according to down-scaling of the integrated circuit device.

The inventive concept provides an integrated circuit device as follows. According to the inventive concept, there is provided an integrated circuit device including: a fin-type active area protruding from a substrate and extending in a first horizontal direction; a stopper layer that is above and spaced apart from the fin-type active area; a gate electrode extending in a second horizontal direction orthogonal to the first horizontal direction, on the fin-type active area, and in a space between the fin-type active area and the stopper layer; and a gate capping layer on upper surfaces of the gate electrode and the stopper layer.

According to the inventive concept, there is provided an integrated circuit device including: a plurality of fin-type active areas protruding from a substrate; a plurality of stoppers that are above and spaced apart from the plurality of fin-type active areas; a plurality of gate electrodes on the plurality of fin-type active areas, and between the plurality of fin-type active areas and the plurality of stoppers; a gate insulating layer between the plurality of gate electrodes and the plurality of fin-type active areas; a plurality of gate spacers having the gate insulating layer therebetween, where the plurality of gate spacers are on side surfaces of the plurality of gate electrodes; and a gate capping layer on upper surfaces of the plurality of gate electrodes, at least upper portions of side surfaces of the plurality of stoppers, and upper surfaces of the plurality of stoppers, wherein the upper surfaces of the plurality of gate electrodes are located at a vertical level lower than the upper surfaces of the plurality of stoppers and have a plurality of recesses having a concave shape at central portions thereof, and the gate capping layer is in the plurality of recesses.

According to the inventive concept, there is provided an integrated circuit device including: a plurality of fin-type active areas protruding from a substrate; a plurality of stoppers that are above and spaced apart from the plurality of fin-type active areas; a plurality of gate electrodes on the plurality of fin-type active areas, between the plurality of fin-type active areas and the plurality of stoppers, and having a plurality of recesses of a concave shape in upper surfaces of the plurality of gate electrodes located at a vertical level lower than upper surfaces of the plurality of stoppers and higher than lower surfaces of the plurality of stoppers; a plurality of gate spacers on side surfaces of the plurality of gate electrodes; a first dielectric layer between the plurality of gate electrodes and the plurality of fin-type active areas; a second dielectric layer on the first dielectric layer between the plurality of gate electrodes and the plurality of fin-type active areas, surrounding the plurality of stoppers, between the plurality of gate electrodes and the plurality of gate spacers, and including a material having a dielectric constant greater than that of a material of the first dielectric layer; and a gate capping layer in the plurality of recesses, on upper portions of side surfaces of the plurality of stoppers, and on the upper surfaces of the plurality of stoppers.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 13A:
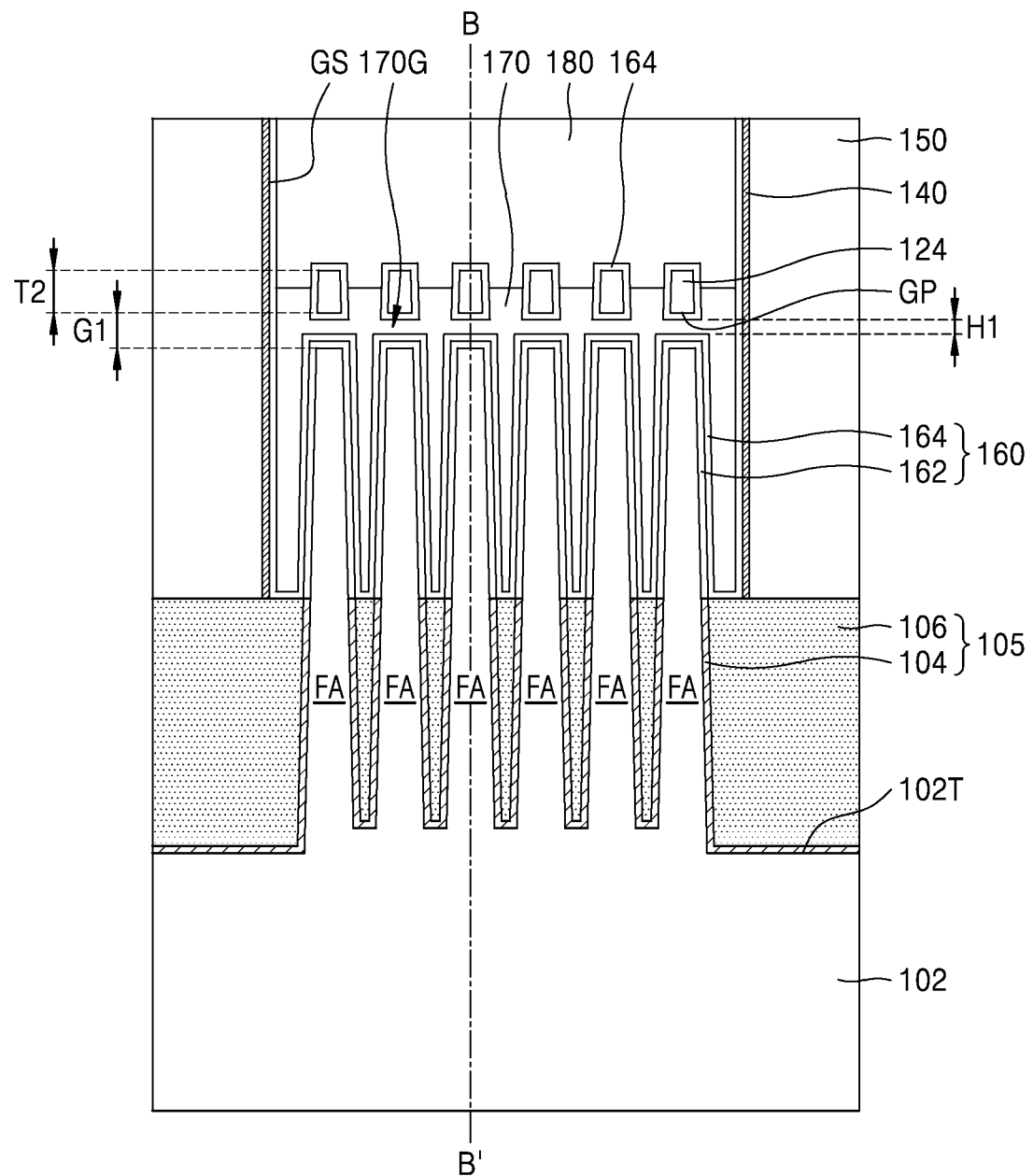
Figure 13B:
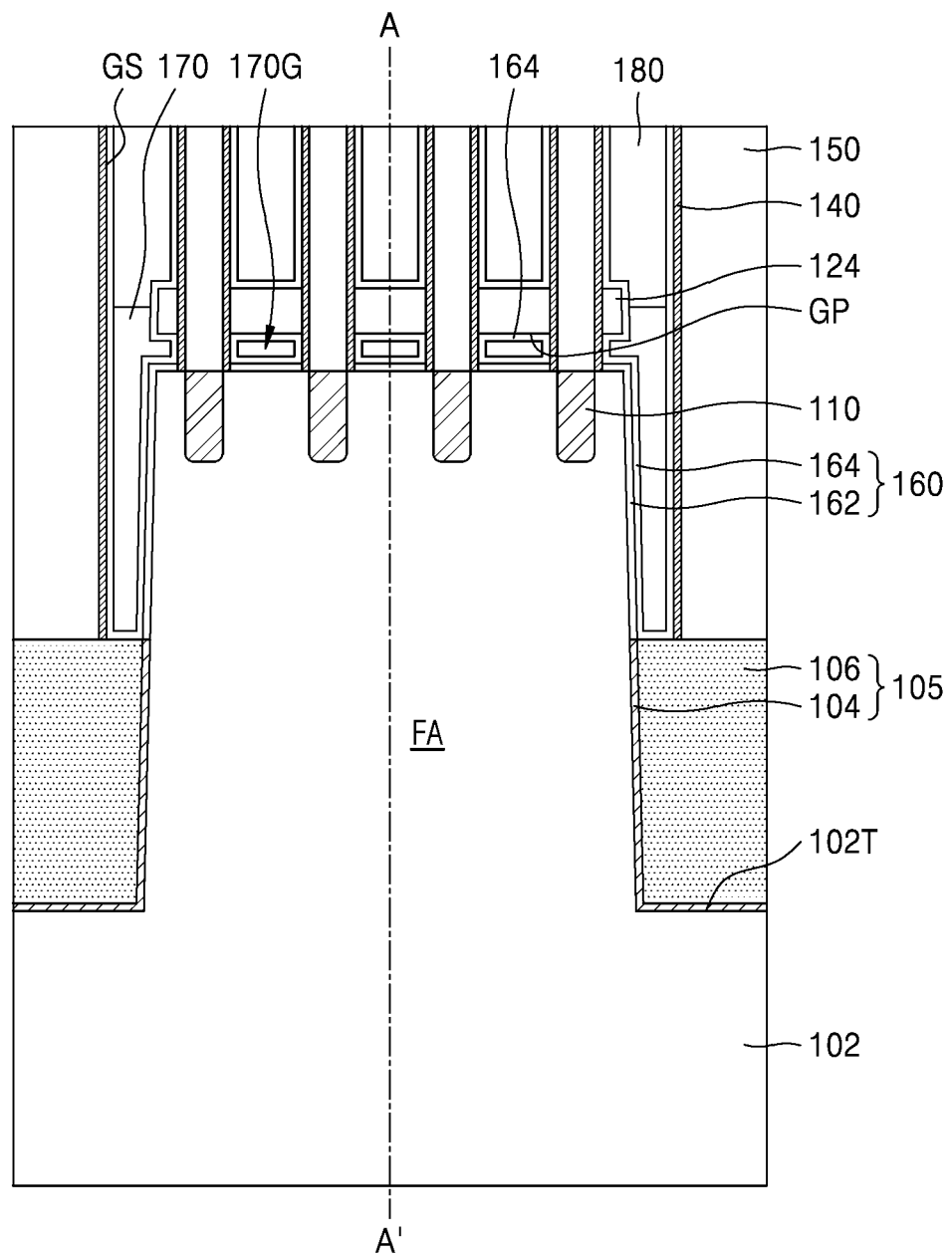
Figure 14A:
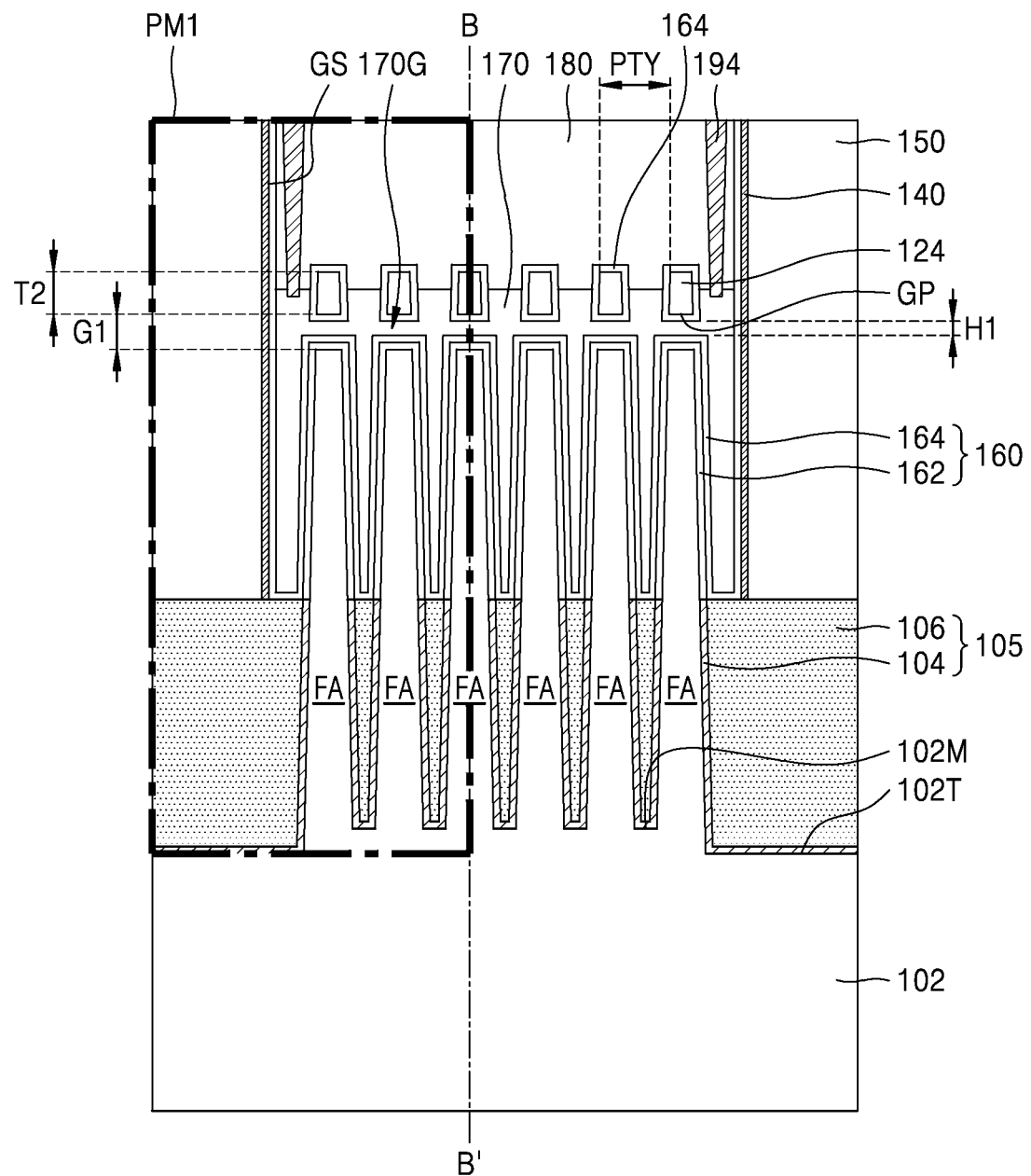
FIGS. 14A, 14B, and 15 are cross-sectional views of an integrated circuit device 1 according to an embodiment of the inventive concept.
Figure 14B:
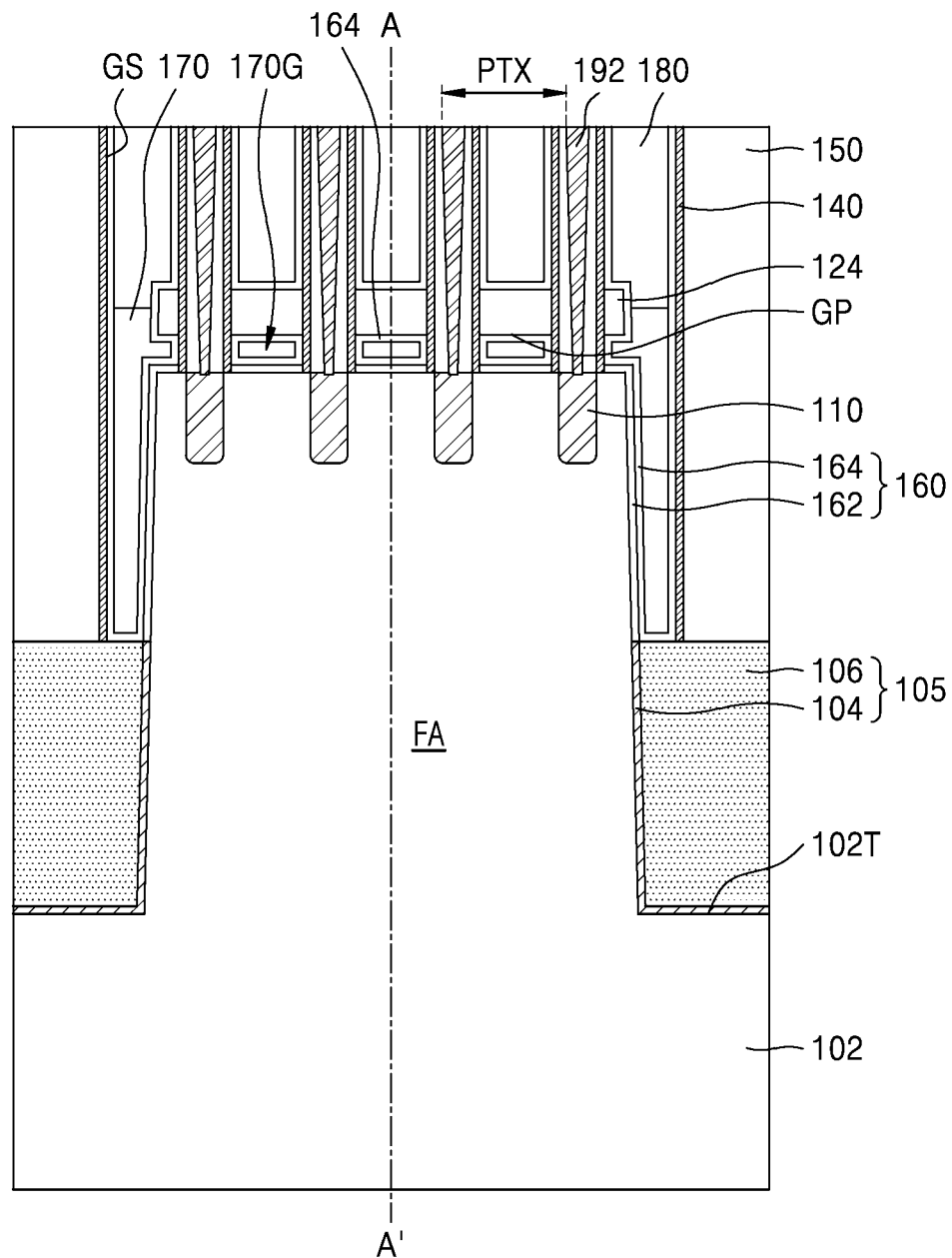
Figure 15:
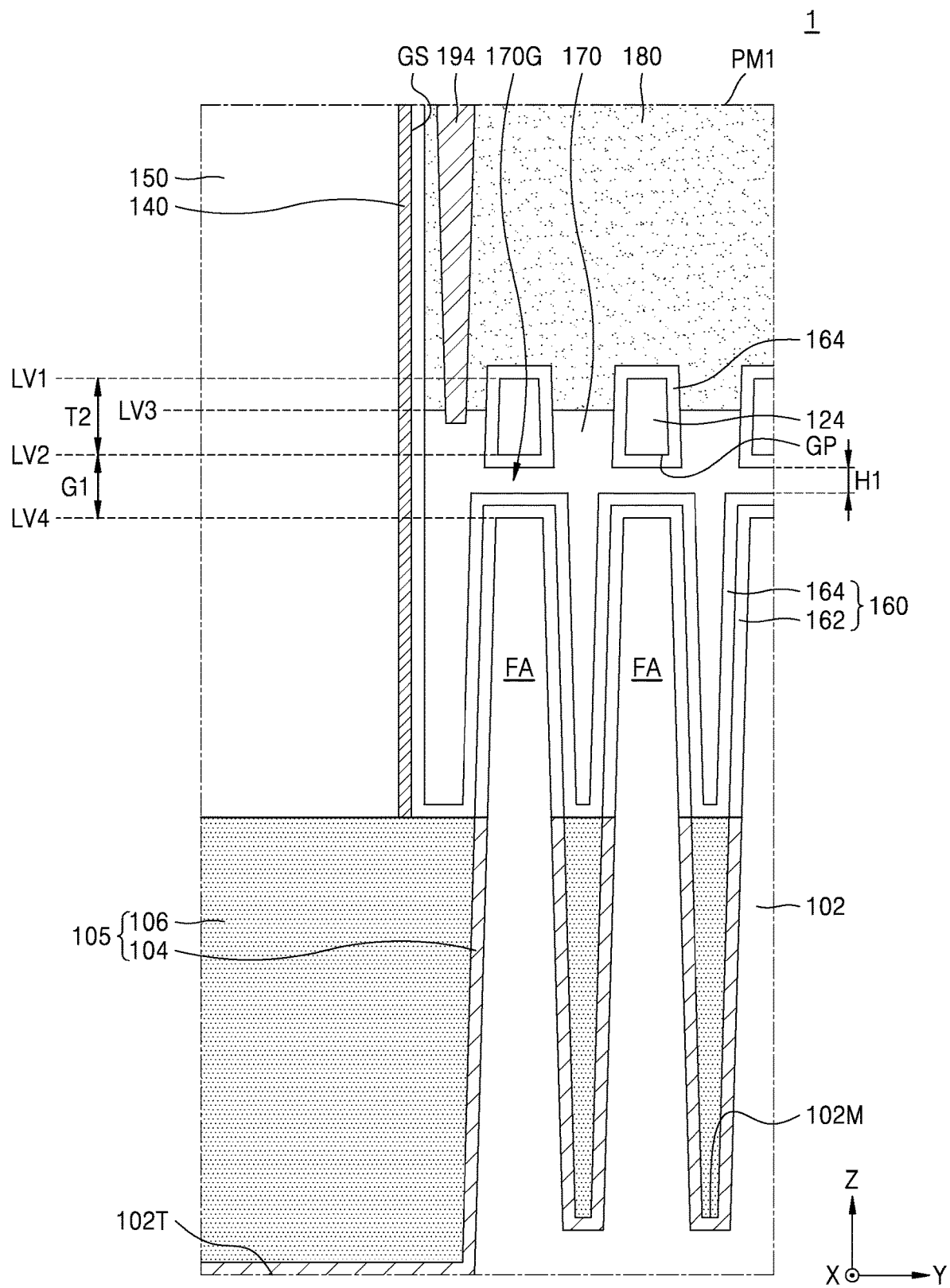

FIGS. 1A to 13B are cross-sectional views for describing, in a process sequence, a method for fabricating an integrated circuit device, according to embodiments of the inventive concept, and FIGS. 14A, 14B, and 15 are cross-sectional views of an integrated circuit device according to an embodiment of the inventive concept. Particularly, FIGS. 1A, 2A, 3A, 4A, 5A, 6A, 7A, 8A, 9A, 10A, 11A, 12A, 13A, and 14A are cross-sectional views taken along line A-A' of FIGS. 1B, 2B, 3B, 4B, 5B, 6B, 7B, 8B, 9B, 10B, 11B, 12B, 13B, and 14B, respectively, and FIGS. 1B, 2B, 3B, 4B, 5B, 6B, 7B, 8B, 9B, 10B, 11B, 12B, 13B, and 14B are cross-sectional views taken along line B-B' of FIGS. 1A, 2A, 3A, 4A, 5A, 6A, 7A, 8A, 9A, 10A, 11A, 12A, 13A, and 14A, respectively, and FIG. 15 is a magnified cross-sectional view of a part PM1 of FIG. 14A.

Figure 1A:
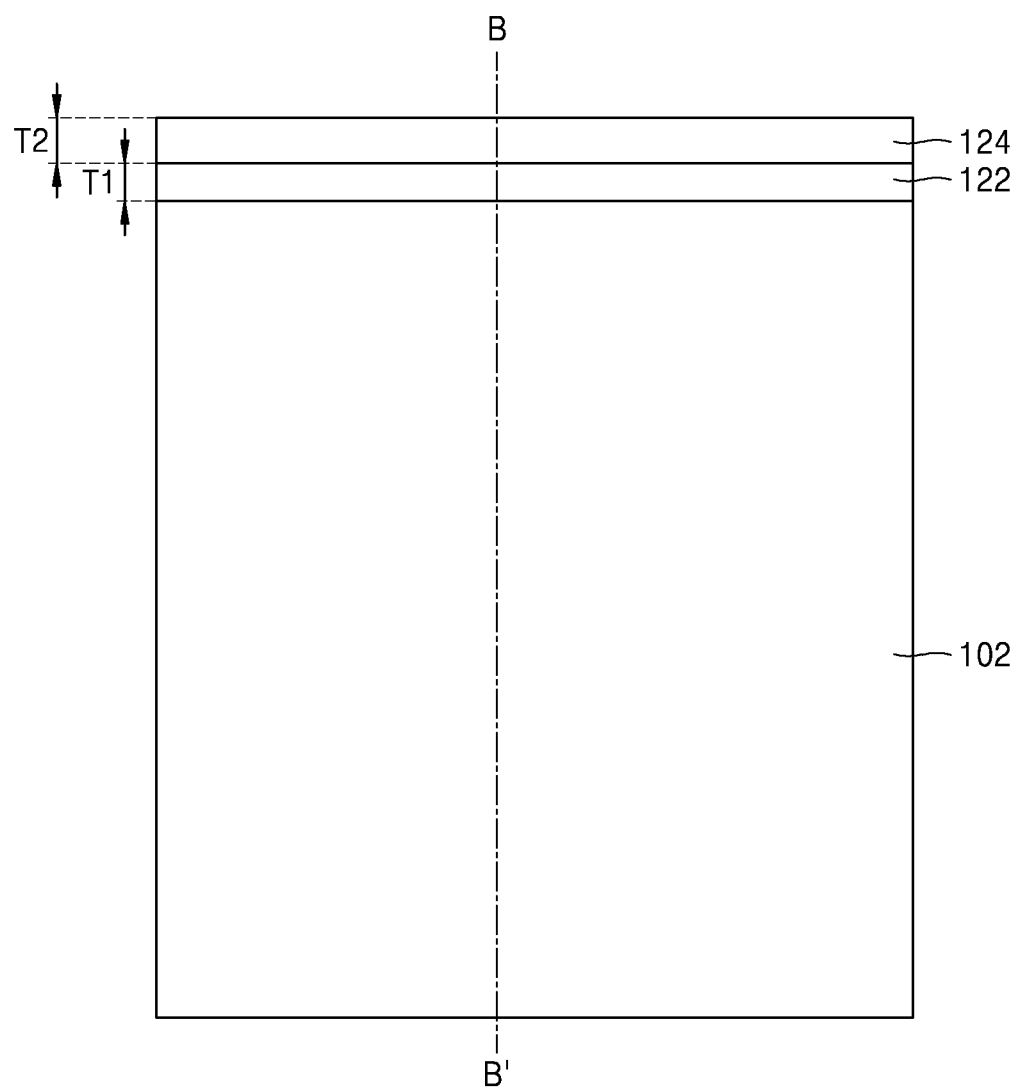
FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, and 13B are cross-sectional views for describing, in a process sequence, a method of fabricating an integrated circuit device, according to embodiments of the inventive concept.
Figure 1B:
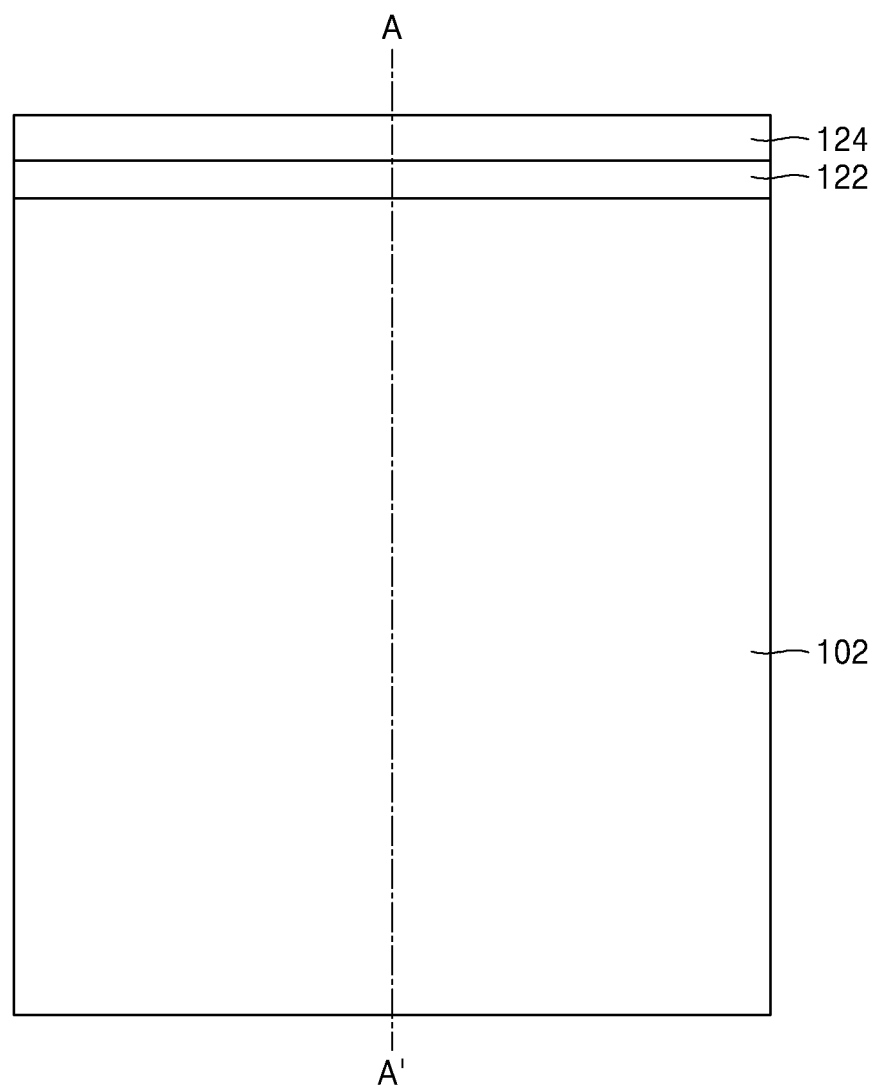

Referring to FIGS. 1A and 1B, a sacrificial layer 122 and a stopper layer 124 are sequentially formed on a substrate 102.

The substrate 102 may include a semiconductor material such as silicon (Si) or germanium (Ge) or a compound semiconductor material such as silicon germanium (SiGe), silicon carbide (SiC), gallium arsenide (GaAs), indium arsenide (InAs), or indium phosphide (InP). In some embodiments, the substrate 102 may include at least one of group III-V materials and group IV materials. The group III-V material may be a binary, ternary, or quaternary compound including at least one group III element and at least one group V element. The substrate 102 may include a conductive area, e.g., an impurity-doped well or an impurity-doped structure.

In some embodiments, the sacrificial layer 122 may be formed to have a first thickness T1 on (e.g., covering) the substrate 102, and the stopper layer 124 may be formed to have a second thickness T2, which is greater than the first thickness T1, on (e.g., covering) the sacrificial layer 122. For example, the first thickness T1 may be about 3 nanometers (nm) to about 10 nm, and the second thickness T2 is greater than the first thickness T1 and may be about 7 nm to about 20 nm.

The sacrificial layer 122 may include a material having an etch selectivity with respect to each of the substrate 102 and the stopper layer 124. In some embodiments, the sacrificial layer 122 may include a different type of semiconductor material or compound semiconductor material from that of the substrate 102. For example, when the substrate 102 includes Si, the sacrificial layer 122 may include Ge or SiGe.

The stopper layer 124 may include a material other than the material of the substrate 102 and a silicon oxide. For example, the stopper layer 124 may include an insulating material such as silicon nitride (SiN), silicon oxynitride (SiON), or silicon carbonitride (SiCN).

Figure 2A:
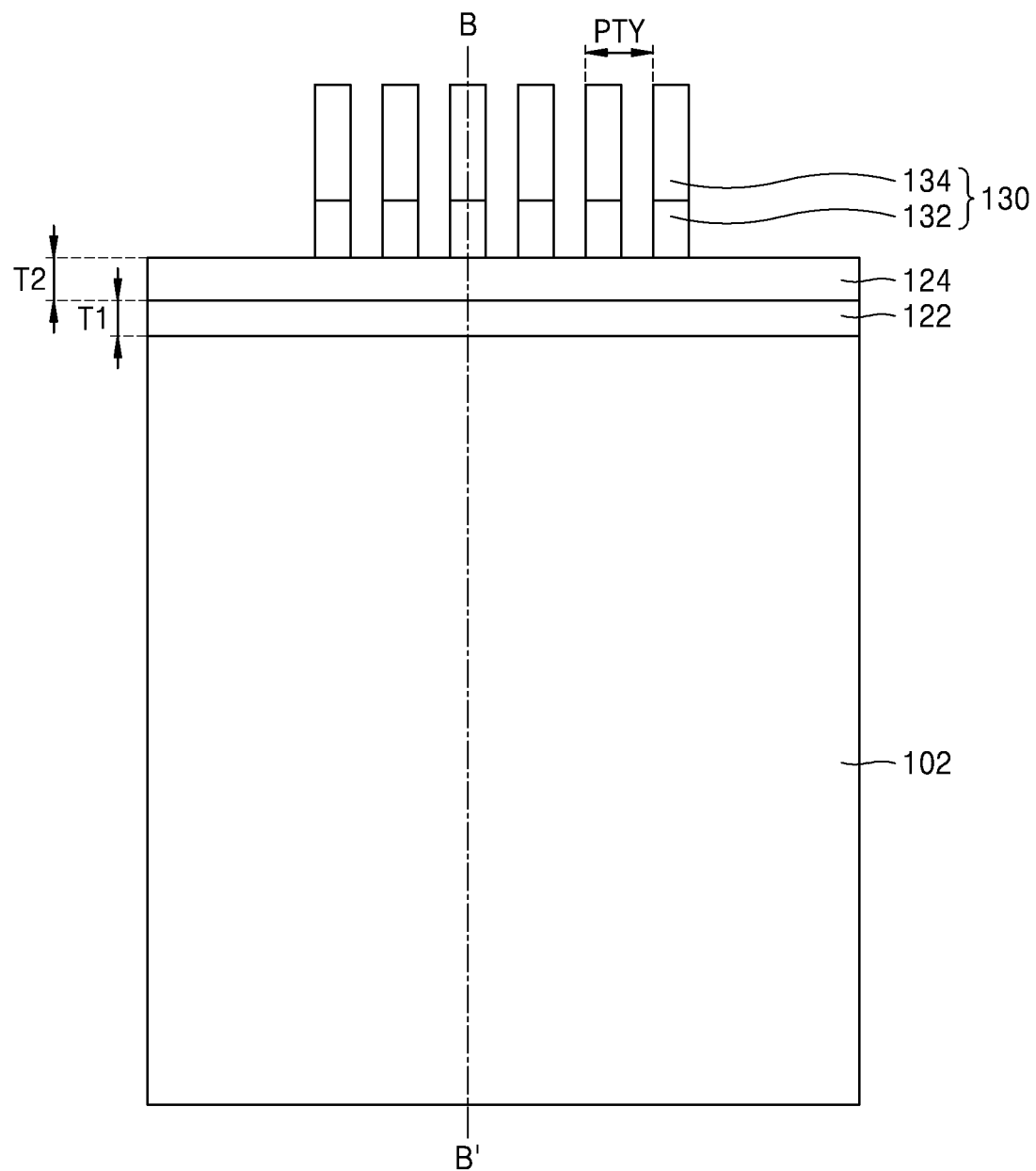
Figure 2B:
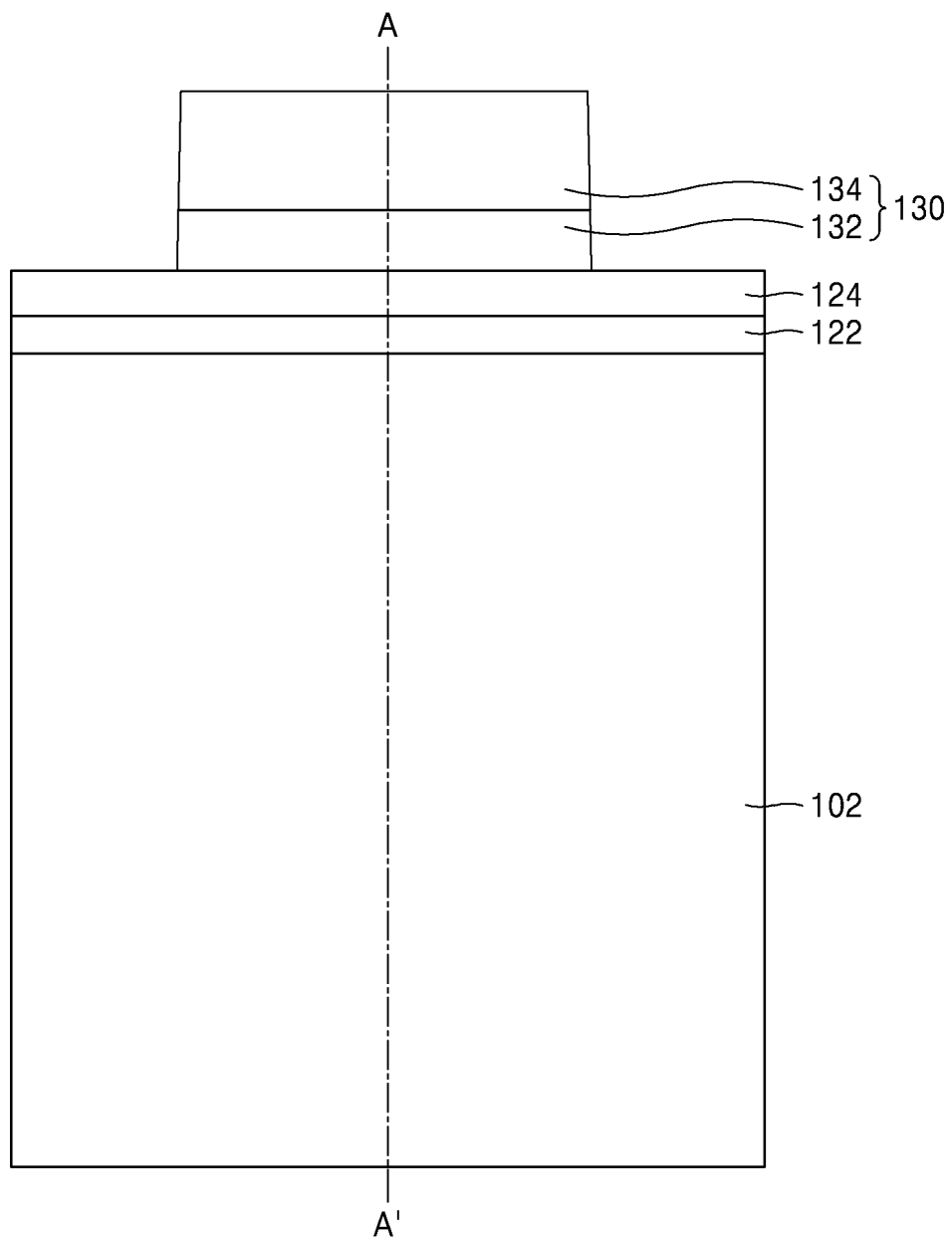

Referring to FIGS. 2A and 2B, a plurality of first hard mask patterns 130 are formed above the substrate 102 on which the sacrificial layer 122 and the stopper layer 124 are stacked. In some embodiments, each of the plurality of first hard mask patterns 130 may have a stacked structure of a first mask pattern 132 and a second mask pattern 134 on the first mask pattern 132.

In some embodiments, the plurality of first hard mask patterns 130 may be formed by using a pattern density increase technology using a spacer, such as double patterning technology (DPT) or quadruple patterning technology (QPT). The first mask pattern 132 and the second mask pattern 134 may include different materials among insulating materials including an oxide, a nitride, an oxynitride, polysilicon, and a carbon-containing layer. The carbon-containing layer may include a spin-on hardmask (SOH) material. The SOH material may include a hydrocarbon compound having a relatively high carbon content of about 85 weight % to about 99 weight % with reference to a total weight of the SOH material or a derivative of the hydrocarbon compound.

The plurality of first hard mask patterns 130 may be formed in parallel to each other to extend in a first horizontal direction (an X direction). The plurality of first hard mask patterns 130 may be arranged parallel to each other with the same first pitch PTY in a second horizontal direction (a Y direction) orthogonal to the first horizontal direction (the X direction).

Referring to FIGS. 2A to 3B, a plurality of fin-type active areas FA limited/defined (e.g., bounded) by a substrate trench 102T and protruding from a main surface 102M of the substrate 102 are formed by using the plurality of first hard mask patterns 130 as an etching mask to remove a portion of the substrate 102. The main surface 102M of the substrate 102 may extend in a horizontal direction (an X-Y plane direction). The plurality of fin-type active areas FA may be arranged parallel to each other with the first pitch PTY in the second horizontal direction (the Y direction) and extend in the first horizontal direction (the X direction). Between the plurality of fin-type active areas FA arranged parallel to each other with the first pitch PTY, a bottom surface of the substrate trench 102T may be located at the same vertical level as the main surface 102M of the substrate 102, and at the other (e.g., outer) portions, the bottom surface of the substrate trench 102T may be located at the same or lower vertical level as (or than) the main surface 102M of the substrate 102.

In some embodiments, the plurality of fin-type active areas FA may have a tapered shape of which a width in the second horizontal direction (the Y direction) gradually decreases away from the main surface 102M of the substrate 102.

Figure 3A:
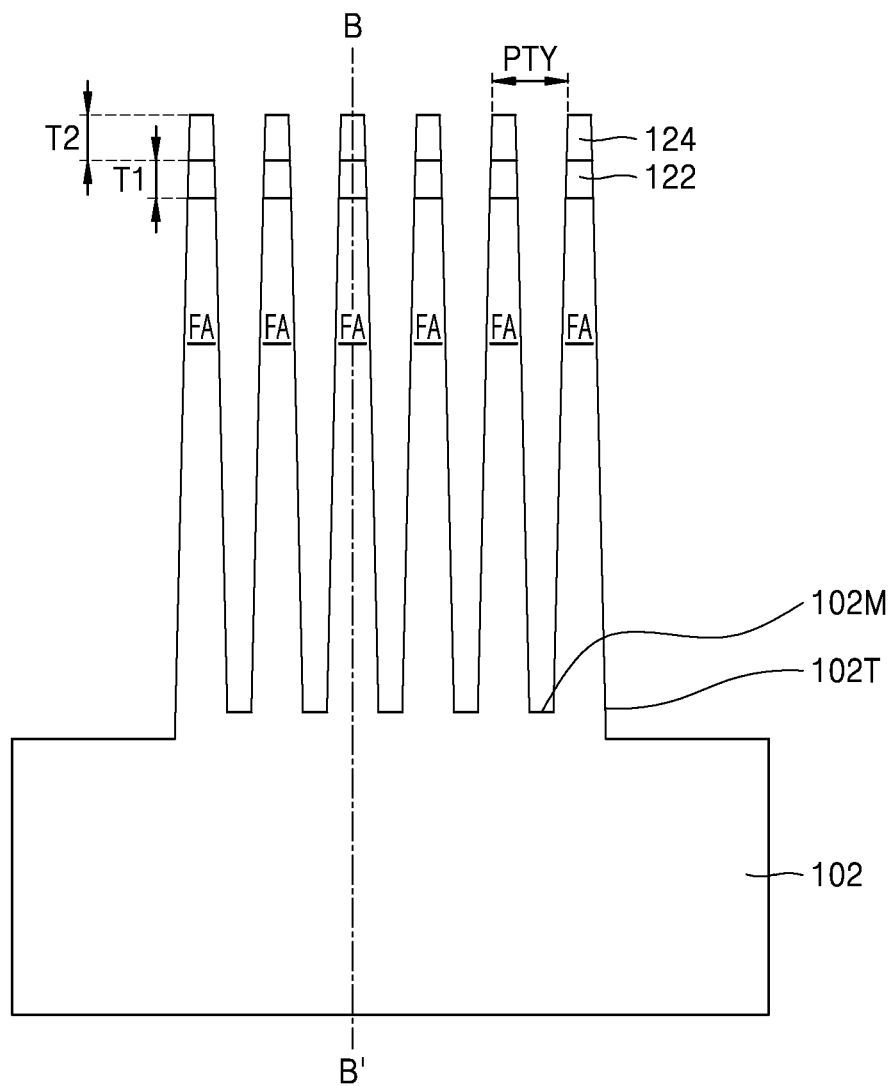
Figure 3B:
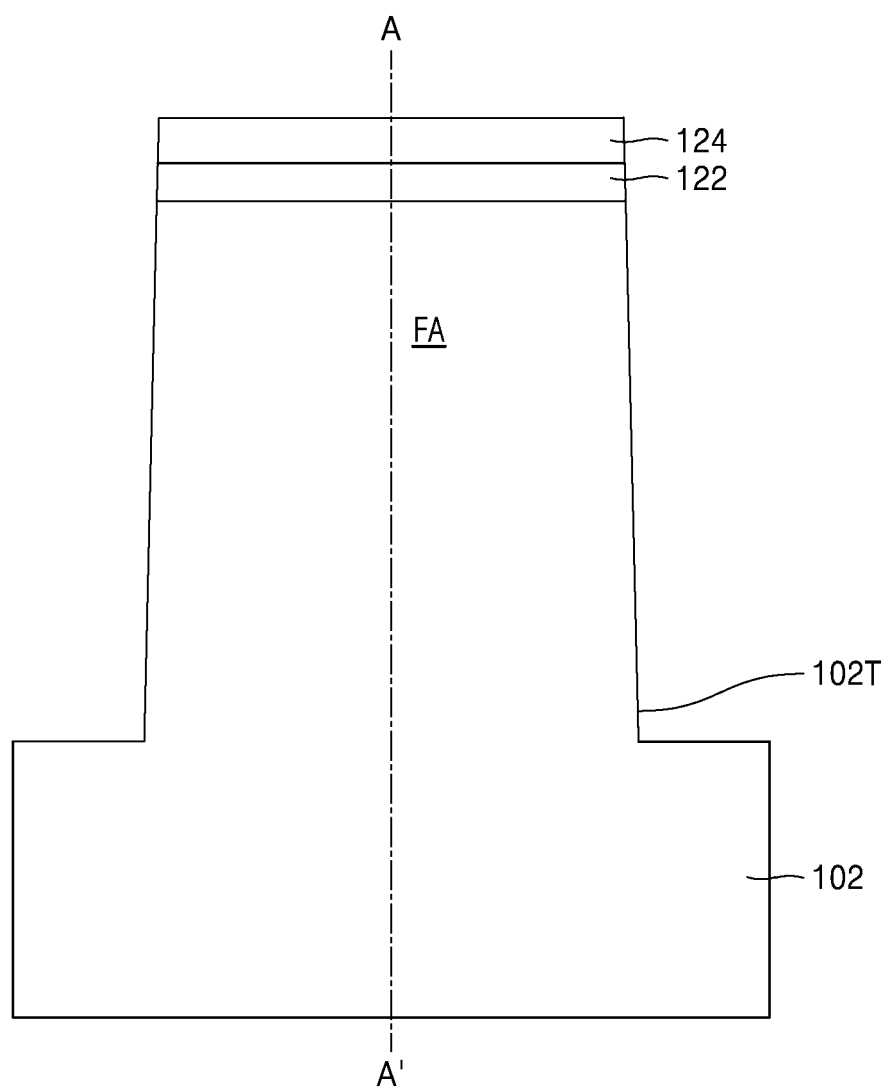

Although FIGS. 3A and 3B show that the plurality of first hard mask patterns 130 do not remain above the plurality of fin-type active areas FA, the inventive concept is not limited thereto. In some embodiments, in a process of forming the plurality of fin-type active areas FA, at least a portion of the plurality of first hard mask patterns 130 is removed, and the other/remaining portion of the plurality of first hard mask patterns 130 may remain above the plurality of fin-type active areas FA, but the remaining portion may be clearly removed during subsequent processes to be described with reference to FIGS. 4A to 12B.

Figure 4A:
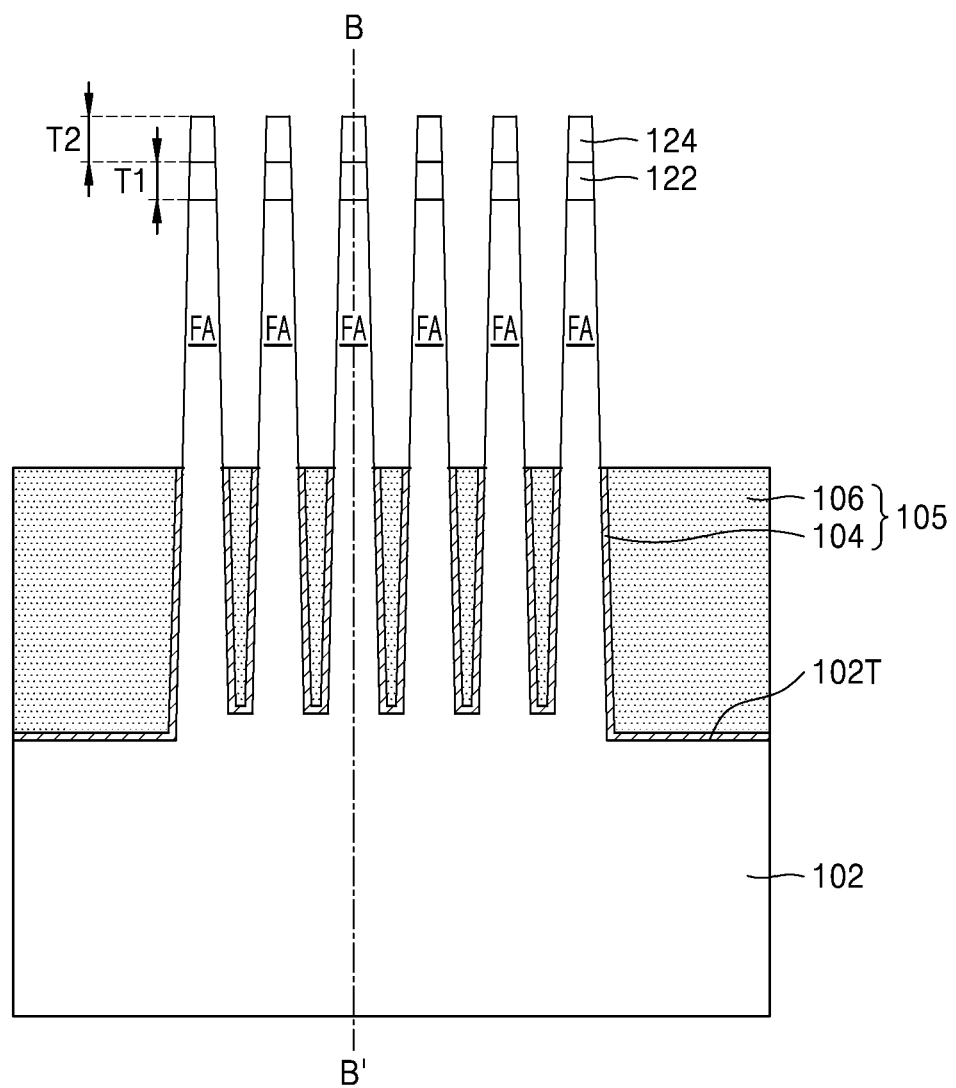
Figure 4B:
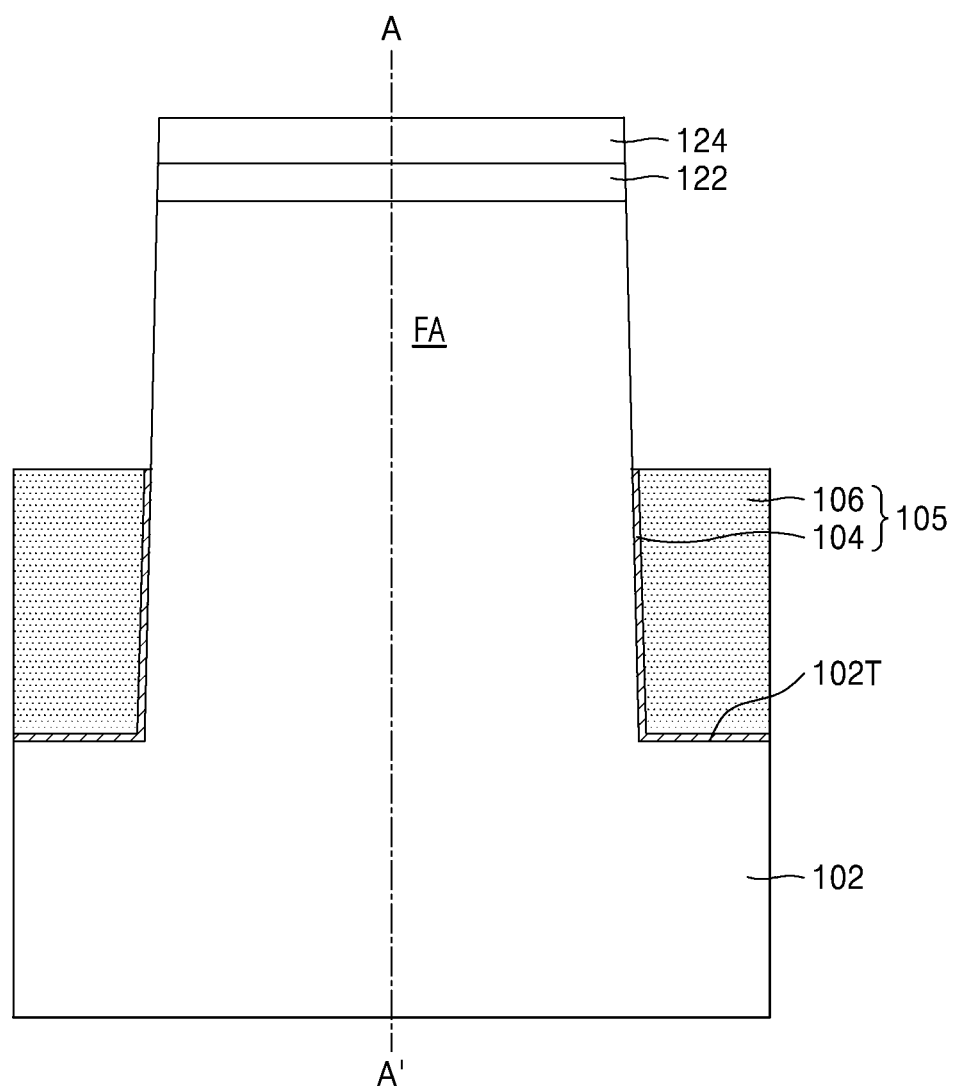

Referring to FIGS. 4A and 4B, a device isolation layer 105 including a liner layer 104 on (e.g., covering) the bottom surface of the substrate trench 102T and a partial lower portion of an inner side surface of the substrate trench 102T and a trench-buried layer 106 on (e.g., covering) the liner layer 104 and in (e.g., filling a part of) a lower portion of the substrate trench 102T is formed. In some embodiments, the liner layer 104 may include an oxide, a nitride, or an oxynitride. For example, the liner layer 104 may include a silicon oxide formed by thermal oxidation, SiN, SiON, silicon boronitride (SiBN), SiC, hydrogenated SiC (SiC:H), SiCN, SiCN:H, silicon oxycarbonitride (SiOCN), SiOCN:H, silicon oxycarbide (SiOC), polysilicon, or a combination thereof but is not limited thereto. The trench-buried layer 106 may include an oxide formed by a deposition process or a coating process. For example, the trench-buried layer 106 may include fluoride silicate glass (FSG), undoped silicate glass (USG), boro-phospho-silicate glass (BPSG), phospho-silicate glass (PSG), flowable oxide (FOX), plasma enhanced tetraethyl-ortho-silicate (PE-TEOS), or tonen silazene (TOSZ) but is not limited thereto.

The liner layer 104 and the trench-buried layer 106 may be formed by forming a preliminary liner layer on (e.g., covering) an upper surface of the substrate 102, i.e., the bottom surface of the substrate trench 102T, and the surfaces of the plurality of fin-type active areas FA and a preliminary trench-buried layer in (e.g., filling) the substrate trench 102T and on (e.g., covering) the plurality of fin-type active areas FA and then removing a partial upper portion of each of the preliminary liner layer and the preliminary trench-buried layer. Partial upper portions of the plurality of fin-type active areas FA may protrude in a fin shape upward from the device isolation layer 105. The device isolation layer 105 may be on (e.g., cover parts of) lower portions of sidewalls of the plurality of fin-type active areas FA.

Figure 5A:
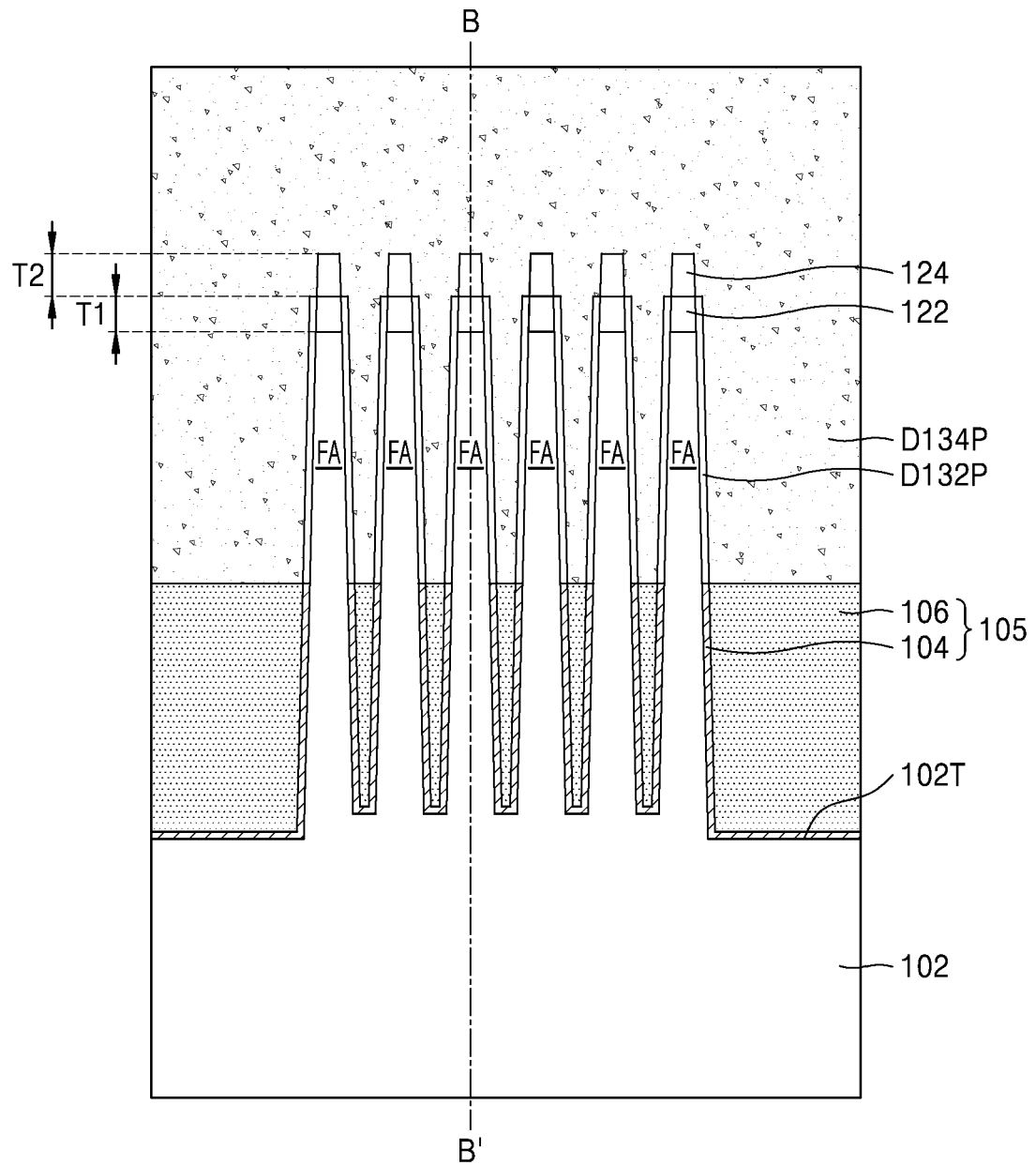
Figure 5B:
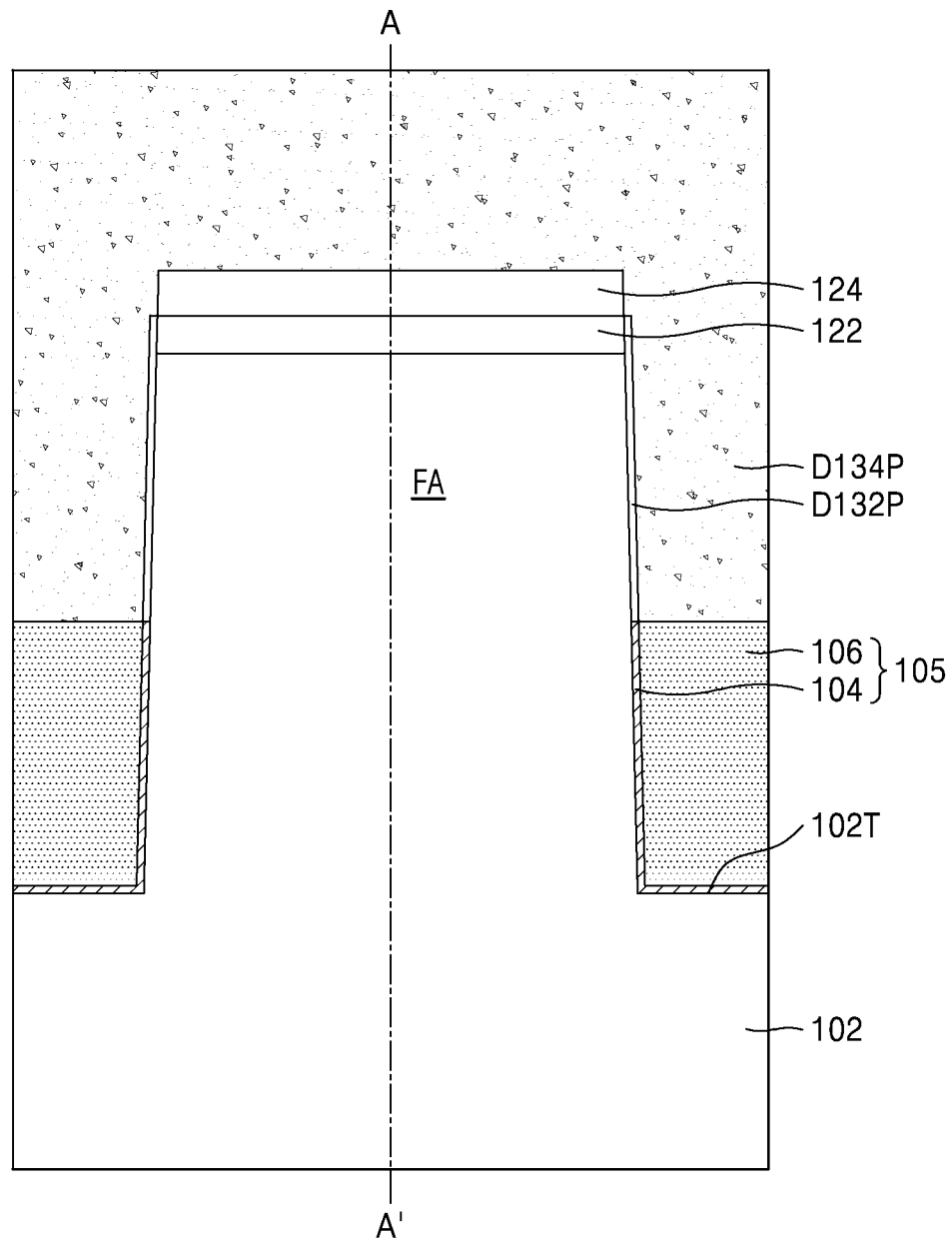
Figure 6A:
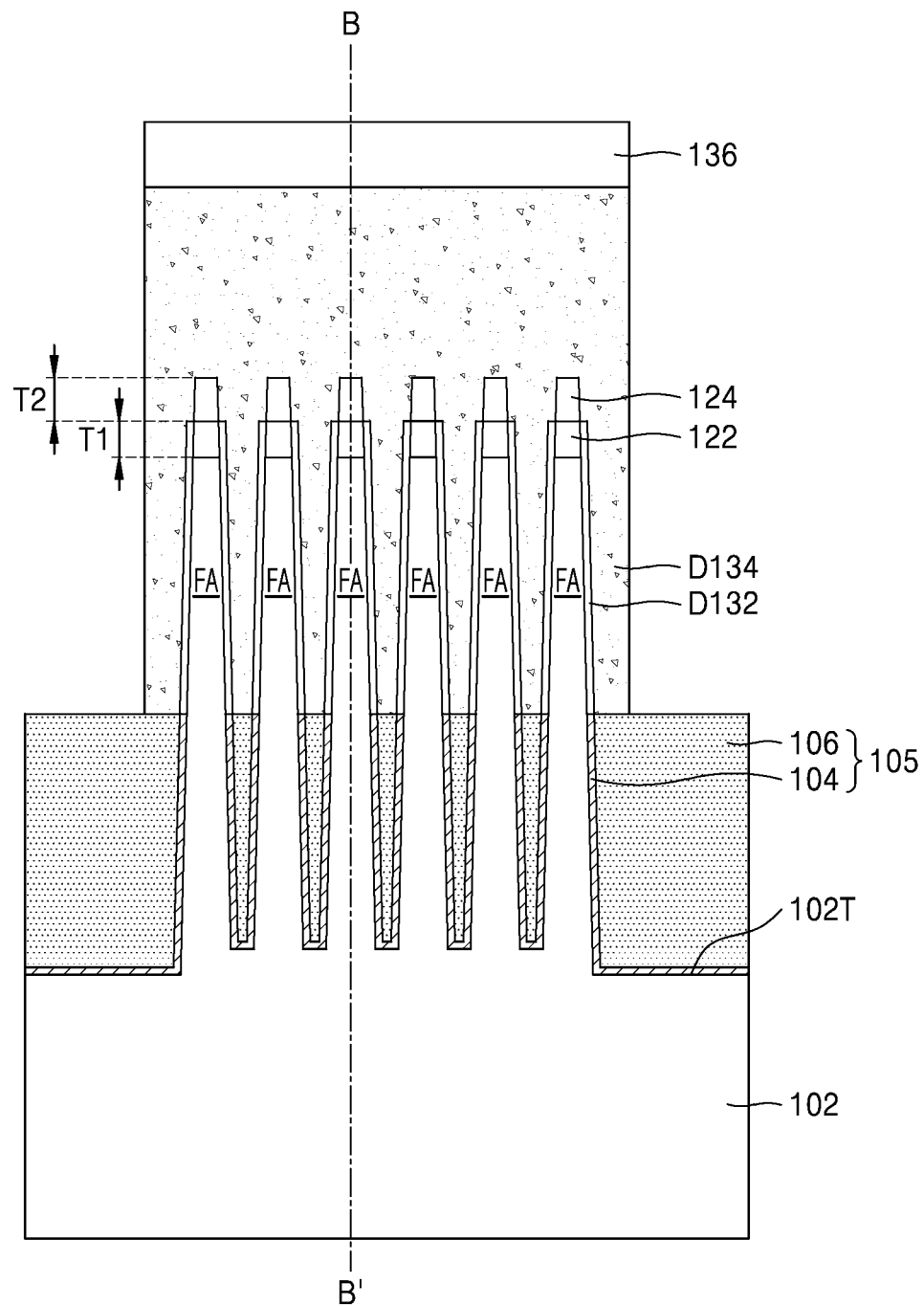
Figure 6B:
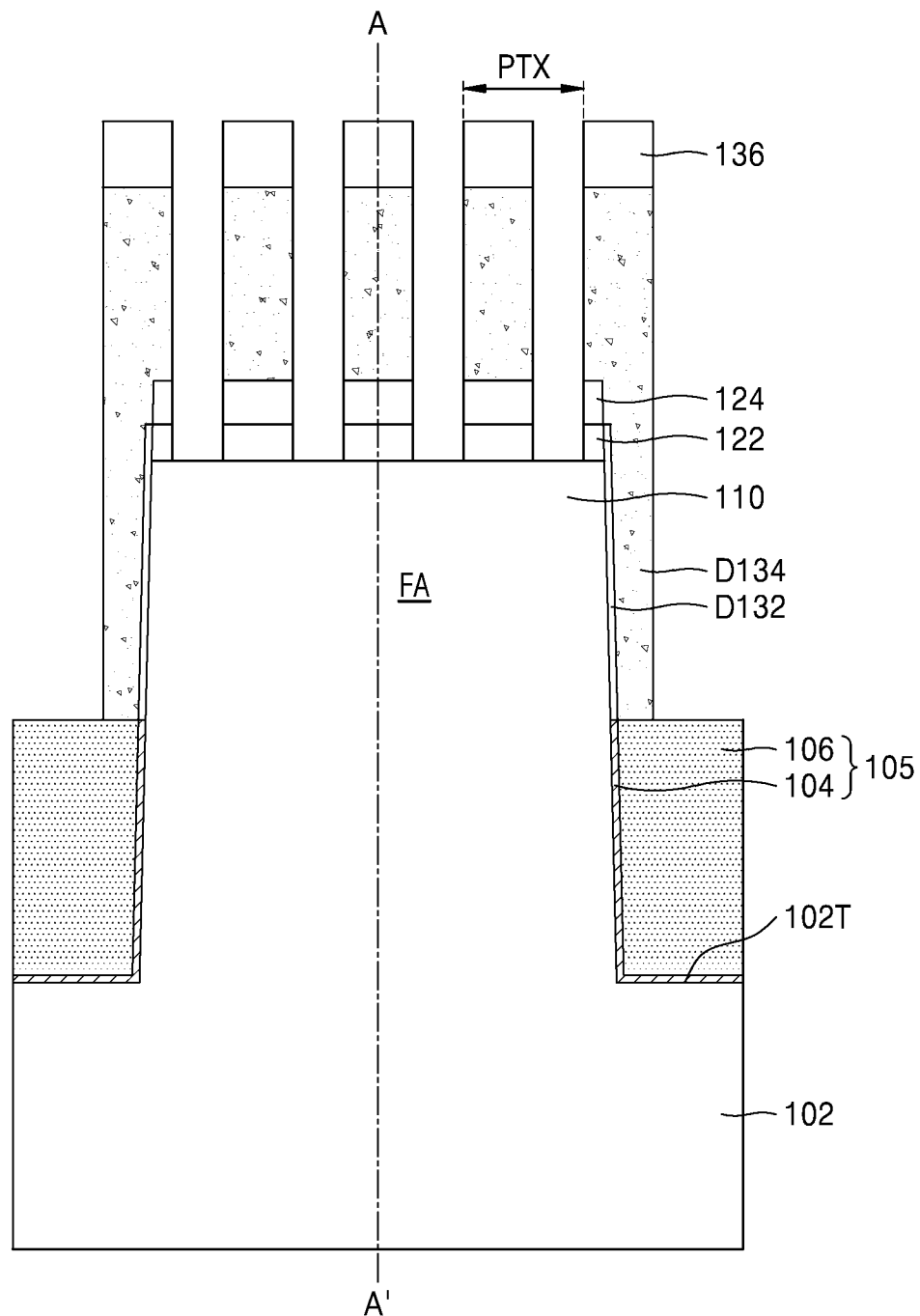

Referring to FIGS. 5A and 5B, a preliminary dummy gate insulating material layer D132P covering the surfaces (e.g., sidewalls) of the plurality of fin-type active areas FA protruding upward from the device isolation layer 105 and a preliminary dummy gate material layer D134P covering the preliminary dummy gate insulating material layer D132P are formed.

The preliminary dummy gate insulating material layer D132P may include, for example, an oxide. In some embodiments, the preliminary dummy gate insulating material layer D132P may be formed to conformally cover the surfaces of parts of the plurality of fin-type active areas FA, the parts protruding upward from the device isolation layer 105 by a thermal oxidation process.

The preliminary dummy gate material layer D134P may include, for example, polysilicon. The preliminary dummy gate material layer D134P may be formed to have a sufficient thickness so that an upper surface of the preliminary dummy gate material layer D134P is located at a vertical level higher than the uppermost ends/points of the plurality of fin-type active areas FA.

Referring to FIGS. 5A to 6B, a plurality of second hard mask patterns 136 are formed on the preliminary dummy gate insulating material layer D132P and the preliminary dummy gate material layer D134P.

In some embodiments, the plurality of second hard mask patterns 136 may be formed in parallel to each other to extend in the second horizontal direction (the Y direction). The plurality of second hard mask patterns 136 may be arranged parallel to each other with the same second pitch PTX in the first horizontal direction (the X direction).

Each of the plurality of second hard mask patterns 136 may be formed with a single layer or have a stacked structure including two or more layers. In some embodiments, the plurality of second hard mask patterns 136 may be formed by using a pattern density increase technology using a spacer, such as the DPT or the QPT. In some embodiments, each of the plurality of second hard mask patterns 136 may have a stacked structure including two or more layers made of different materials among insulating materials including an oxide, a nitride, an oxynitride, polysilicon, and a carbon-containing layer. The carbon-containing layer may include an SOH material. The SOH material may include a hydrocarbon compound having a relatively high carbon content of about 85 weight % to about 99 weight % with reference to a total weight of the SOH material or a derivative of the hydrocarbon compound.

A plurality of dummy gate insulating material layers D132 and a plurality of dummy gate material layers D134 are formed by using the plurality of second hard mask patterns 136 as an etching mask to remove a portion of the preliminary dummy gate insulating material layer D132P and the preliminary dummy gate material layer D134P. In some embodiments, a portion of the plurality of second hard mask patterns 136 may remain on the plurality of dummy gate material layers D134.

In some embodiments, the plurality of dummy gate material layers D134 may be formed in parallel to each other to extend in the second horizontal direction (the Y direction). The plurality of dummy gate material layers D134 may be arranged parallel to each other with the same second pitch PTX in the first horizontal direction (the X direction).

In a process of forming the plurality of dummy gate insulating material layers D132 and the plurality of dummy gate material layers D134, each of the stopper layer 124 and the sacrificial layer 122 may also be patterned in correspondence to the plurality of dummy gate material layers D134.

Figure 7A:
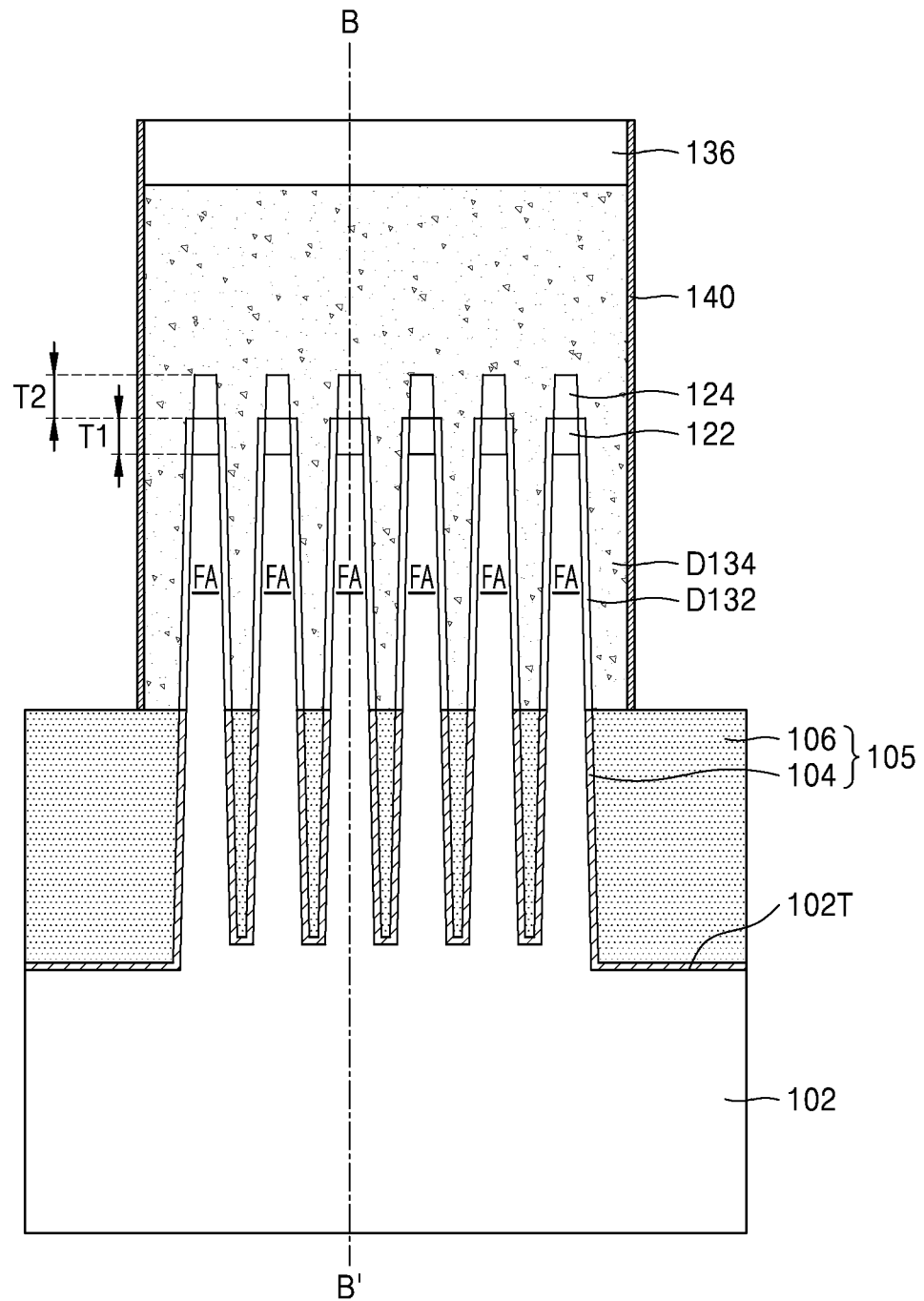
Figure 7B:
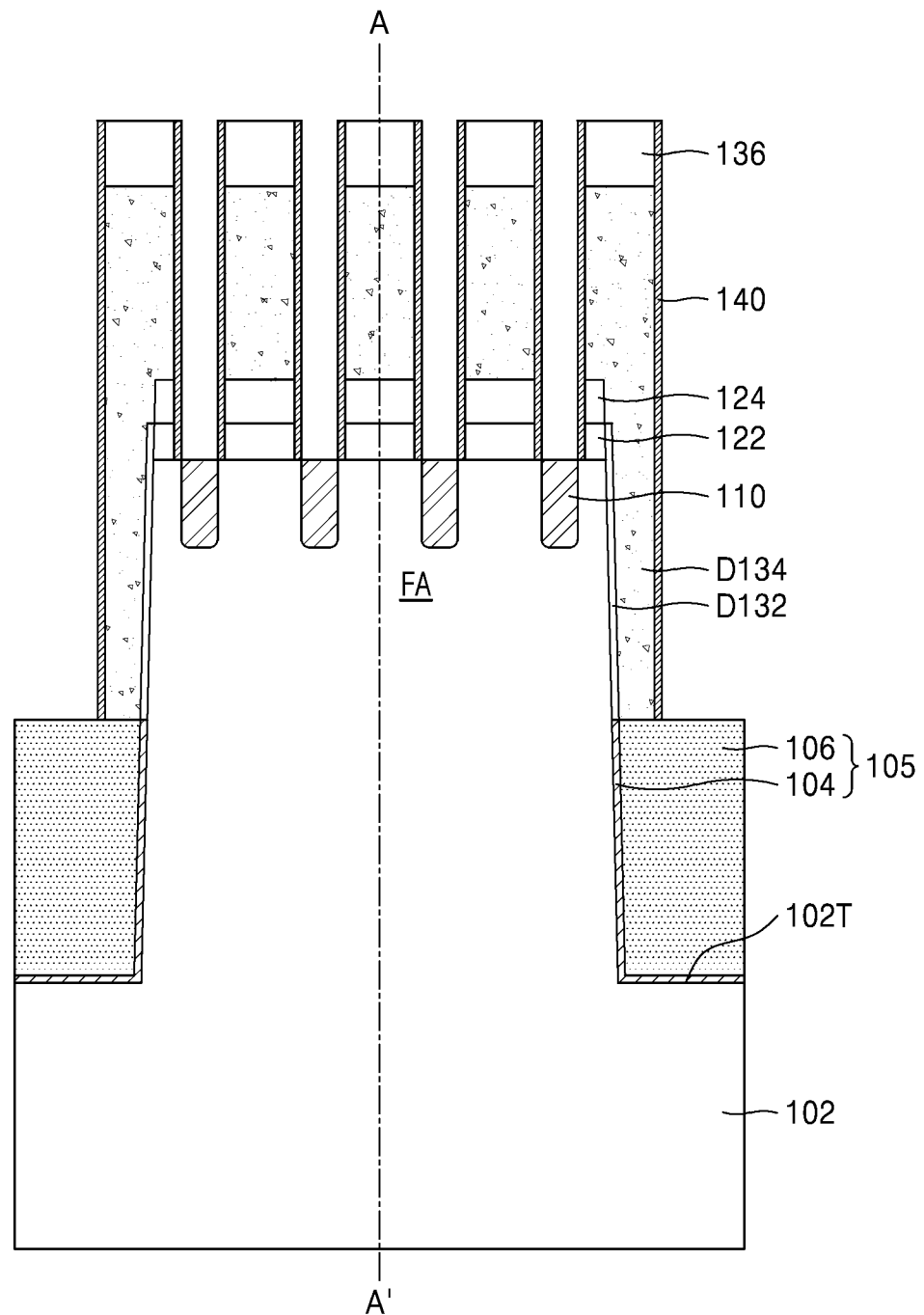
Figure 7B:
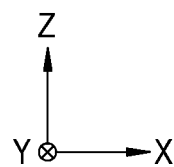

Referring to FIGS. 7A and 7B, a plurality of gate spacers 140 covering opposite side surfaces of stacked structures of the plurality of dummy gate insulating material layers D132 and the plurality of dummy gate material layers D134 are formed. The plurality of gate spacers 140 may include, for example, a nitride.

In some embodiments, when a portion of the plurality of second hard mask patterns 136 remains on the plurality of dummy gate material layers D134, the plurality of gate spacers 140 may be on (e.g., cover) opposite side surfaces of stacked structures of the plurality of dummy gate insulating material layers D132, the plurality of dummy gate material layers D134, and the plurality of second hard mask patterns 136.

A plurality of source/drain areas 110 are formed on portions of each fin-type active area FA, which are exposed between the stacked structures of the plurality of dummy gate insulating material layers D132 and the plurality of dummy gate material layers D134, opposite side surfaces of the stacked structures being covered by the plurality of gate spacers 140.

In some embodiments, the plurality of source/drain areas 110 may be formed by doping impurities into the portions of each fin-type active area FA.

In some other embodiments, the plurality of source/drain areas 110 may be formed by removing portions of each fin-type active area FA that are exposed between the stacked structures of the plurality of dummy gate insulating material layers D132 and the plurality of dummy gate material layers D134, opposite side surfaces of the stacked structures being covered by the plurality of gate spacers 140, to form a plurality of recesses and then filling the plurality of recesses. For example, the plurality of source/drain areas 110 may include an epitaxial-grown impurity-doped SiGe layer, an epitaxial-grown impurity-doped Si layer, and an epitaxial-grown impurity-doped SiC layer, taken alone or in combination.

Figure 8A:
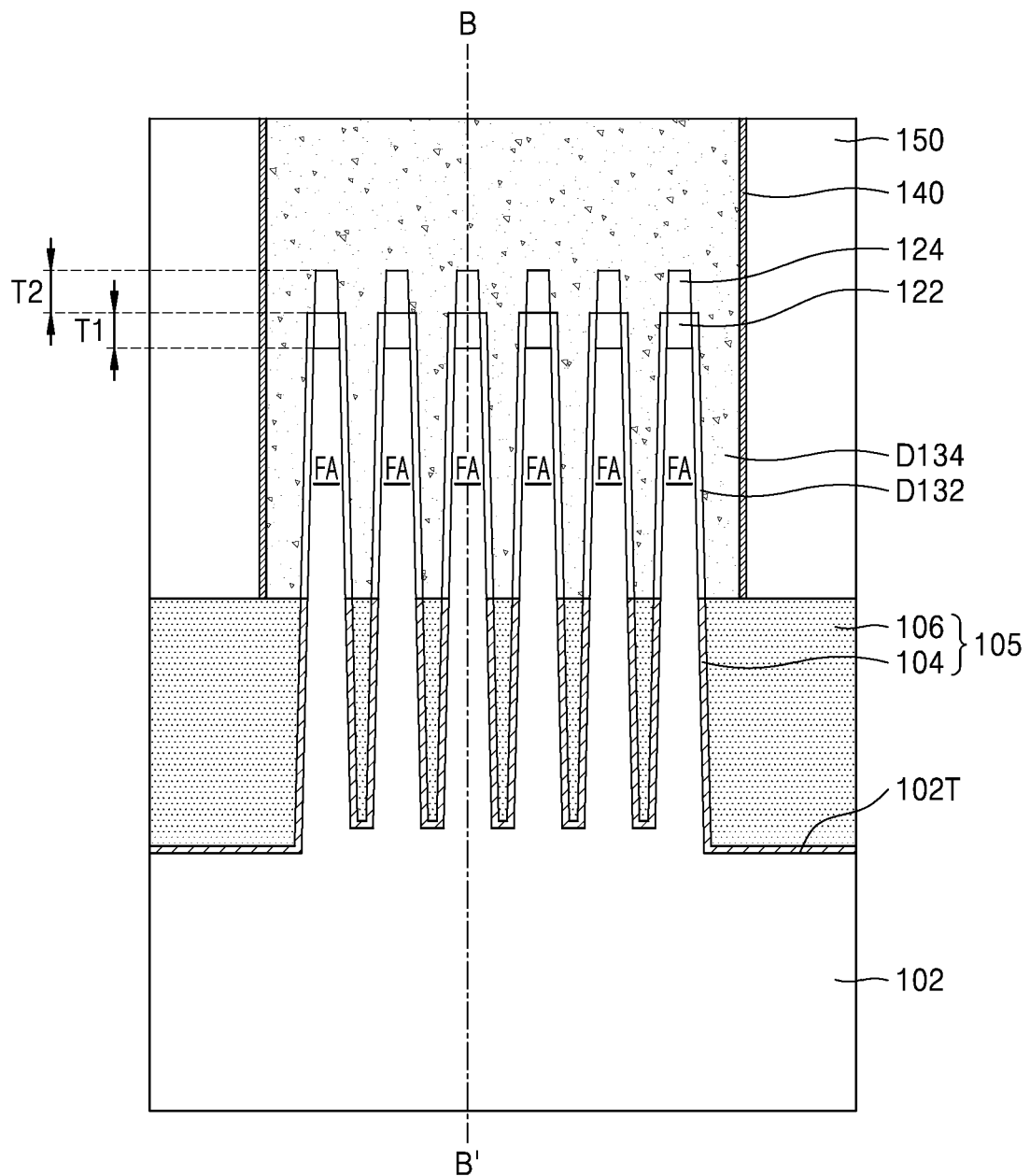
Figure 8B:
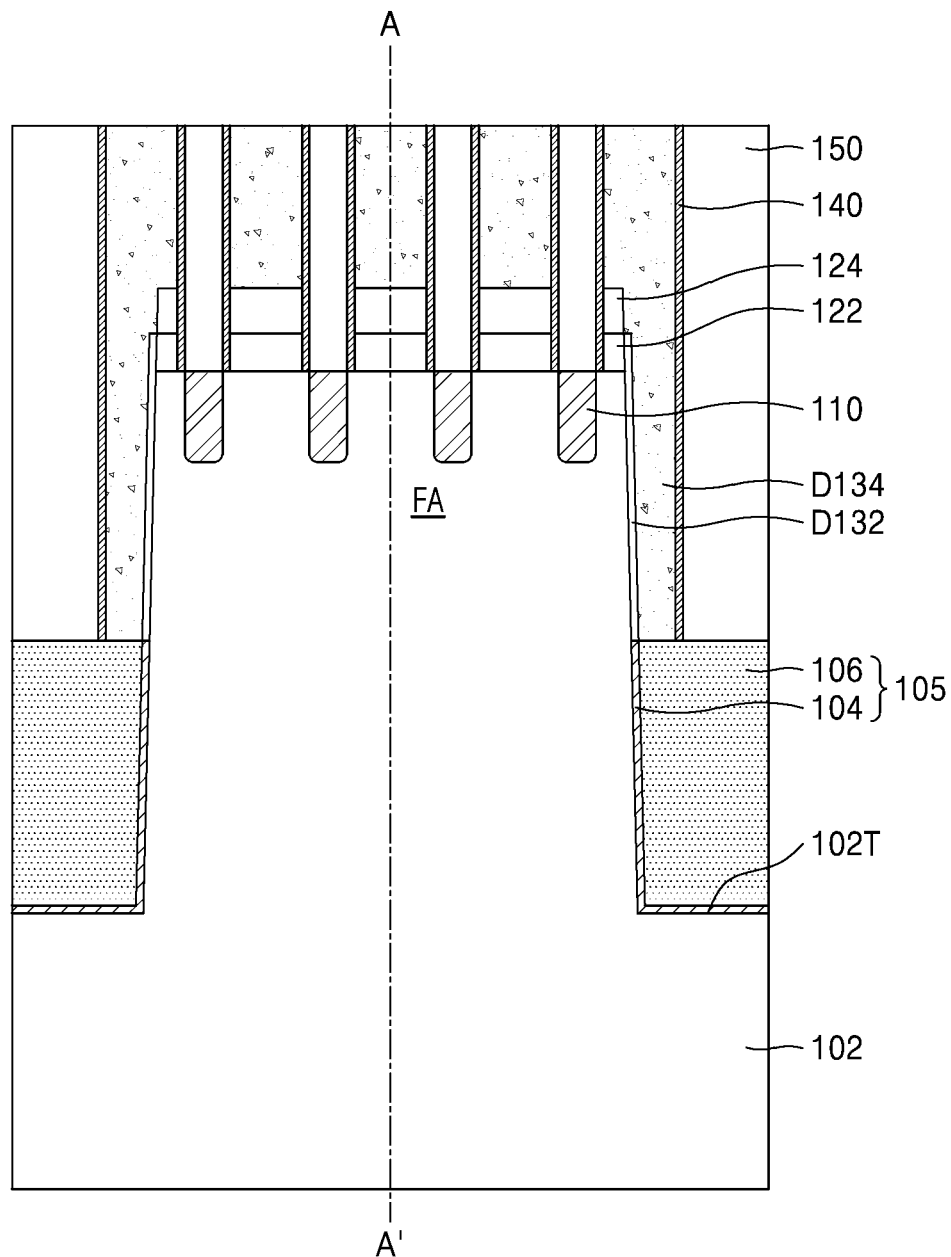

Referring to FIGS. 8A and 8B, an interlayer insulating layer 150 is formed by forming an interlayer insulating material layer covering the stacked structures of the plurality of dummy gate insulating material layers D132 and the plurality of dummy gate material layers D134, opposite side surfaces of the stacked structures being covered by the plurality of gate spacers 140, and then removing a partial upper portion of the interlayer insulating material layer to expose upper surfaces of the plurality of dummy gate material layers D134.

The interlayer insulating layer 150 may include an oxide, a nitride, or a combination thereof. The interlayer insulating layer 150 may be formed by performing, for example, a chemical mechanical polishing (CMP) process to remove the partial upper portion of the interlayer insulating material layer. In a process of removing the partial upper portion of the interlayer insulating material layer to form the interlayer insulating layer 150, partial upper portions of the plurality of gate spacers 140 and the plurality of second hard mask patterns 136 (FIGS. 7A and 7B) respectively remaining on the plurality of dummy gate material layers D134 may also be removed.

The upper surfaces of the plurality of dummy gate material layers D134, upper surfaces of the plurality of gate spacers 140, and an upper surface of the interlayer insulating layer 150 may be coplanar.

Referring to FIGS. 8A to 9B, a gate space GS is formed by removing the plurality of dummy gate material layers D134 and the plurality of dummy gate insulating material layers D132. A portion of the surface of each of a plurality of stopper layers 124, a plurality of sacrificial layers 122, the plurality of fin-type active areas FA, and the plurality of gate spacers 140 may be exposed through the gate space GS.

As used herein, the term "stopper layers" refers to a plurality of stoppers (e.g., protective/etch-stop regions) that are horizontally spaced apart from each other. The stopper layers are not necessarily vertically spaced apart from each other (or otherwise vertically stacked). Rather, in some embodiments, upper surfaces of the stopper layers may be coplanar with each other.

Referring to FIGS. 9A to 10B, a plurality of gap spaces GP are formed by removing the plurality of sacrificial layers 122 through the gate space GS. The plurality of gap spaces GP may be formed by an isotropic etching process capable of removing the plurality of sacrificial layers 122 with an etch selectivity with respect to the plurality of fin-type active areas FA, the plurality of stopper layers 124, the plurality of gate spacers 140, and the interlayer insulating layer 150.

The plurality of gap spaces GP may be between upper surfaces of the plurality of fin-type active areas FA and lower surfaces of the plurality of stopper layers 124. The plurality of gap spaces GP may communicate/connect with the gate space GS. In the plurality of gap spaces GP, the plurality of stopper layers 124 may be supported by the plurality of gate spacers 140 covering a side surface of the interlayer insulating layer 150.

The plurality of gap spaces GP may have a gap distance G1 between the upper surfaces of the plurality of fin-type active areas FA and the lower surfaces of the plurality of stopper layers 124. In some embodiments, the gap distance G1 may have substantially the same value as the first thickness T1 shown in FIG. 9A because the plurality of gap spaces GP are formed by removing the plurality of sacrificial layers 122. For example, the gap distance G1 may be about 3 nm to about 10 nm.

Figure 9A:
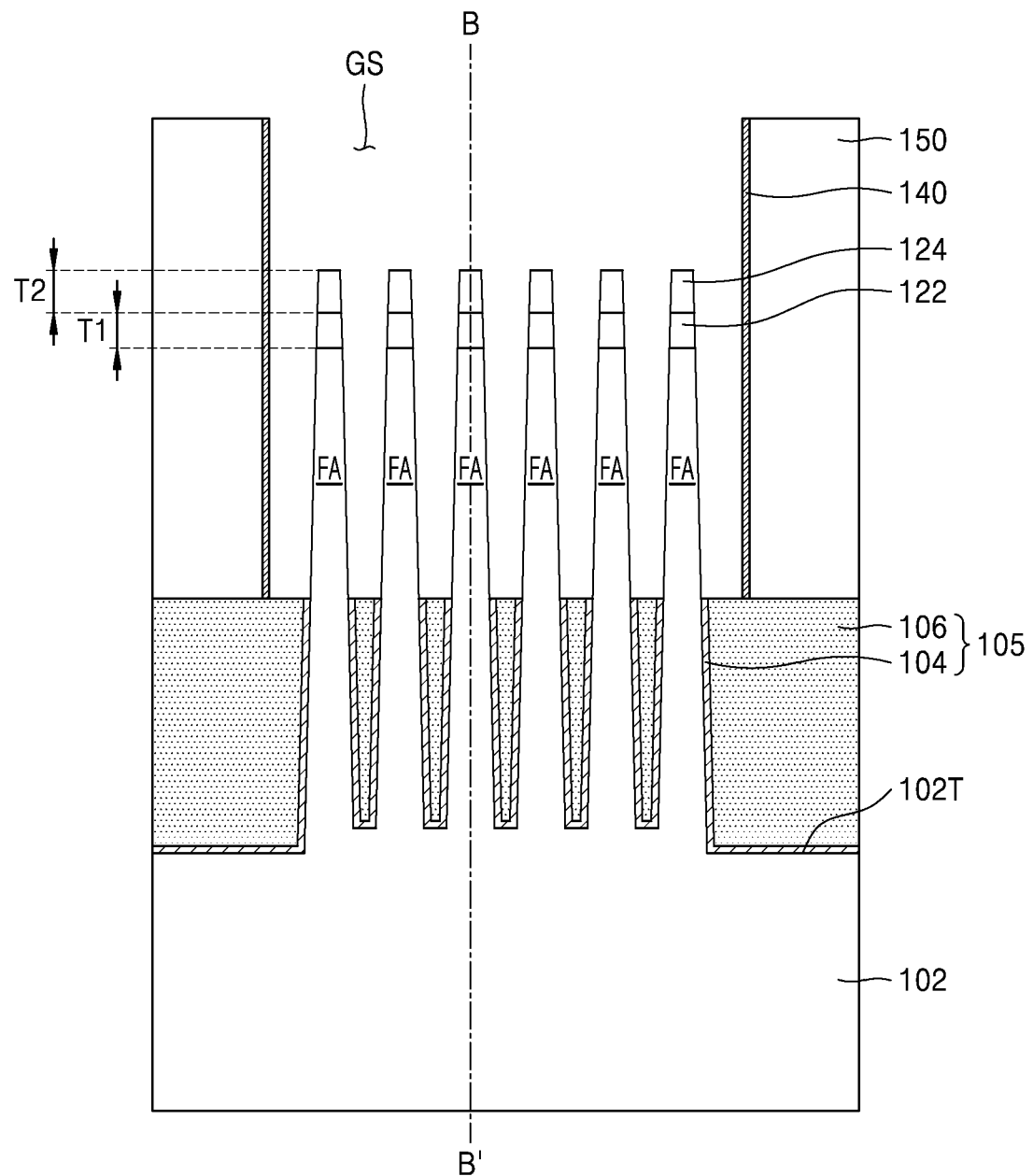
Figure 9B:
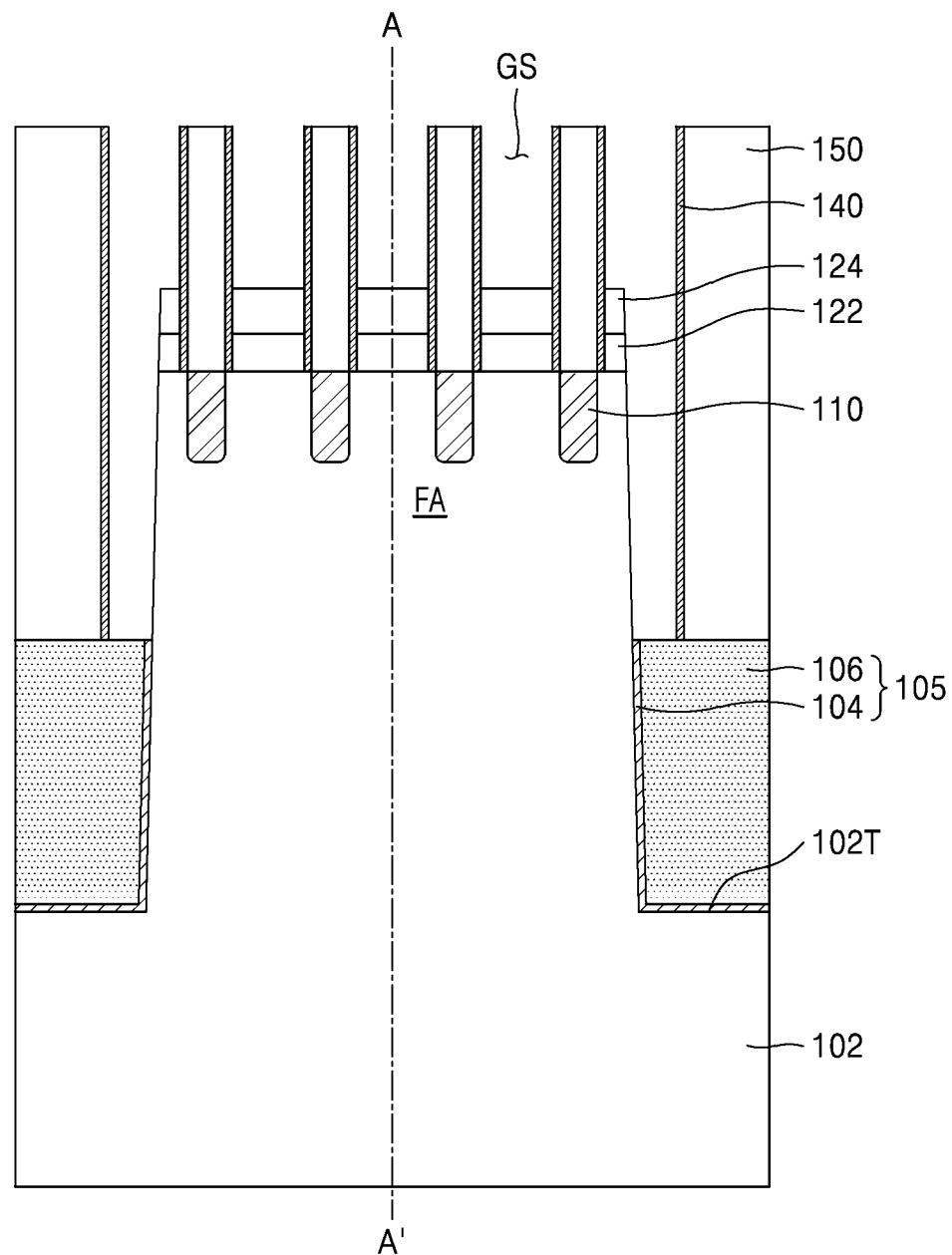
Figure 10A:
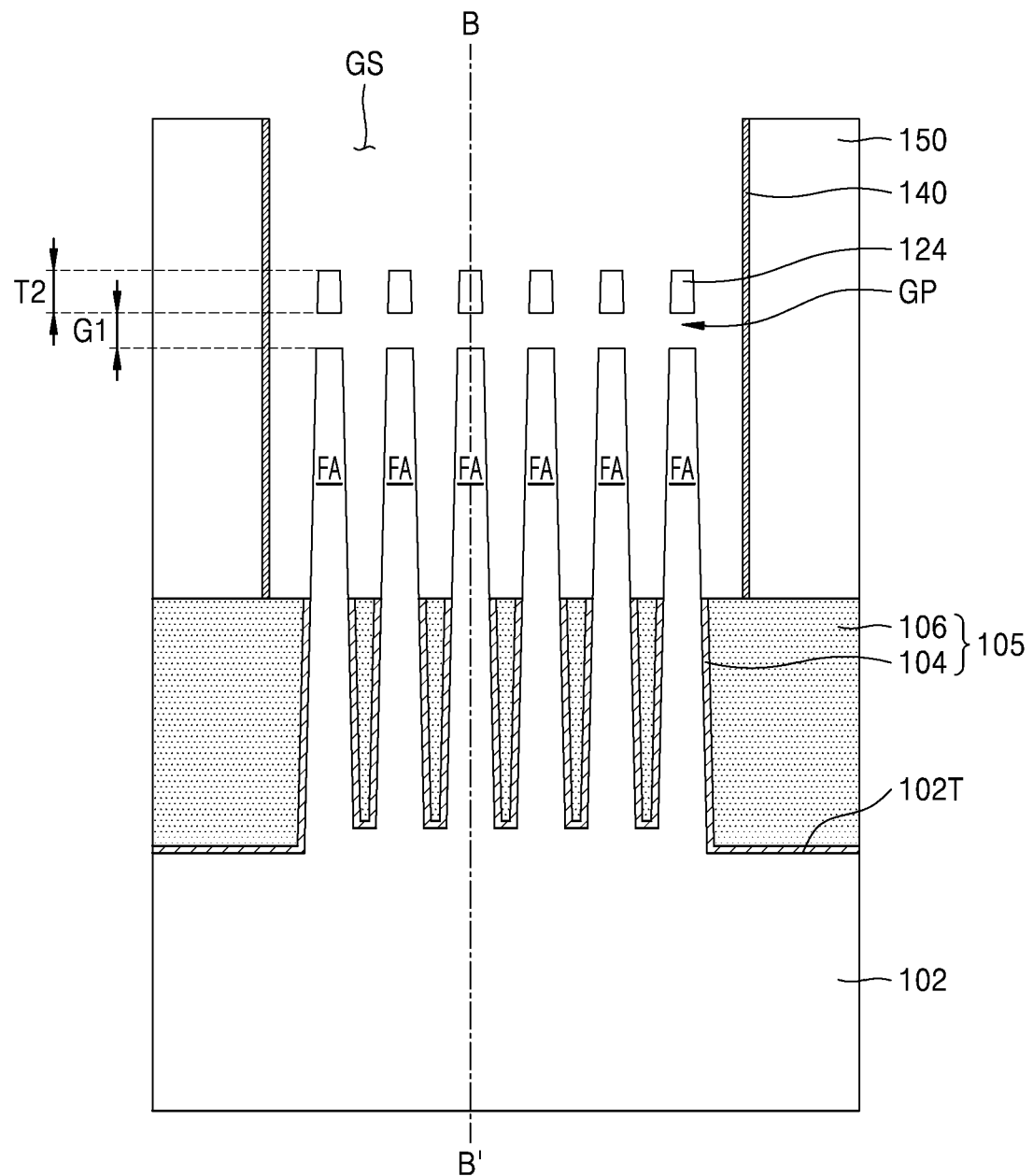
Figure 10B:
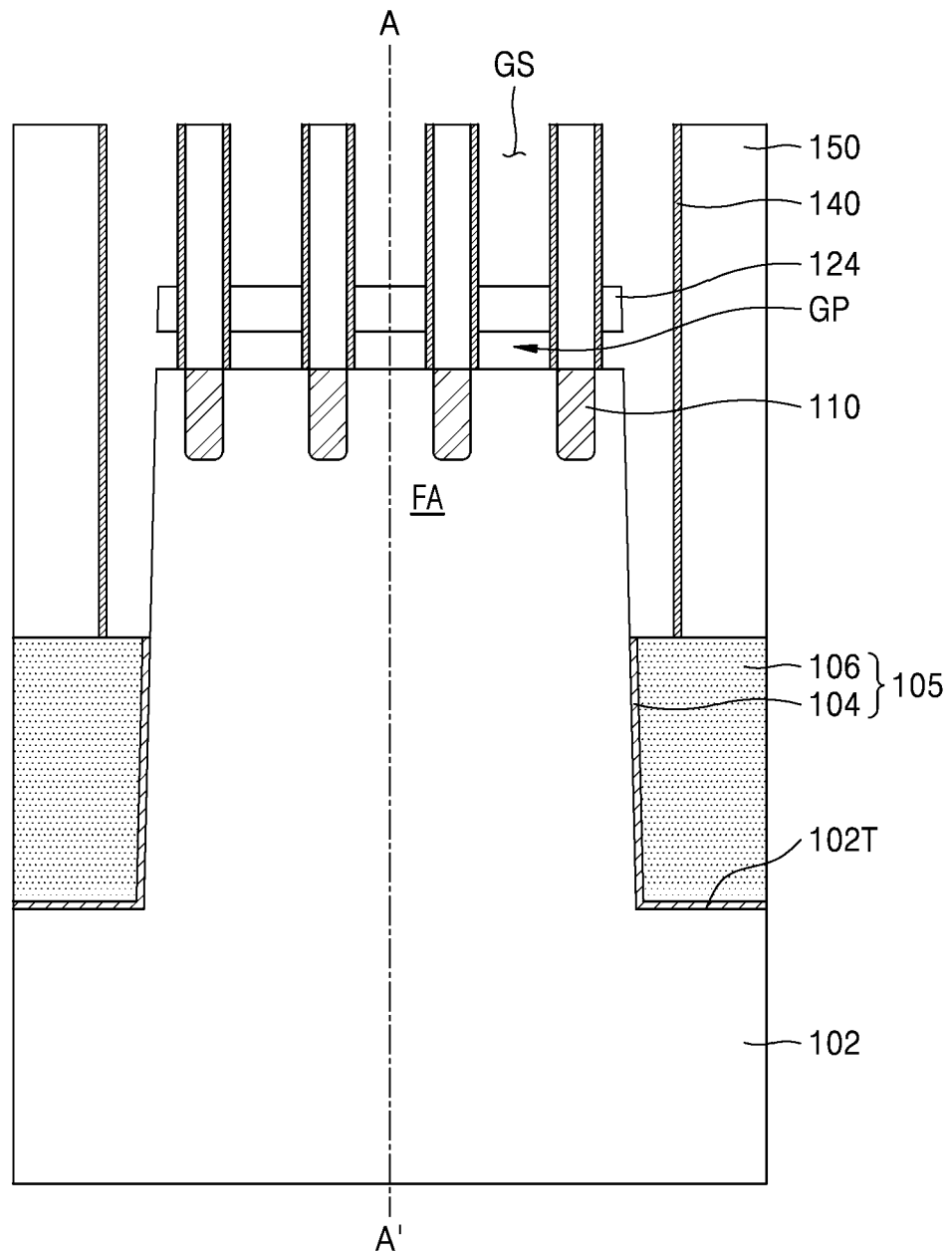

In some other embodiments, when a portion of the plurality of fin-type active areas FA and/or the plurality of stopper layers 124 is also removed in a process of forming the plurality of gap spaces GP, the gap distance G1 may be slightly greater than the first thickness T1 shown in FIG. 9A. For example, the gap distance G1 may be about 5 nm to about 12 nm.

Figure 11A:
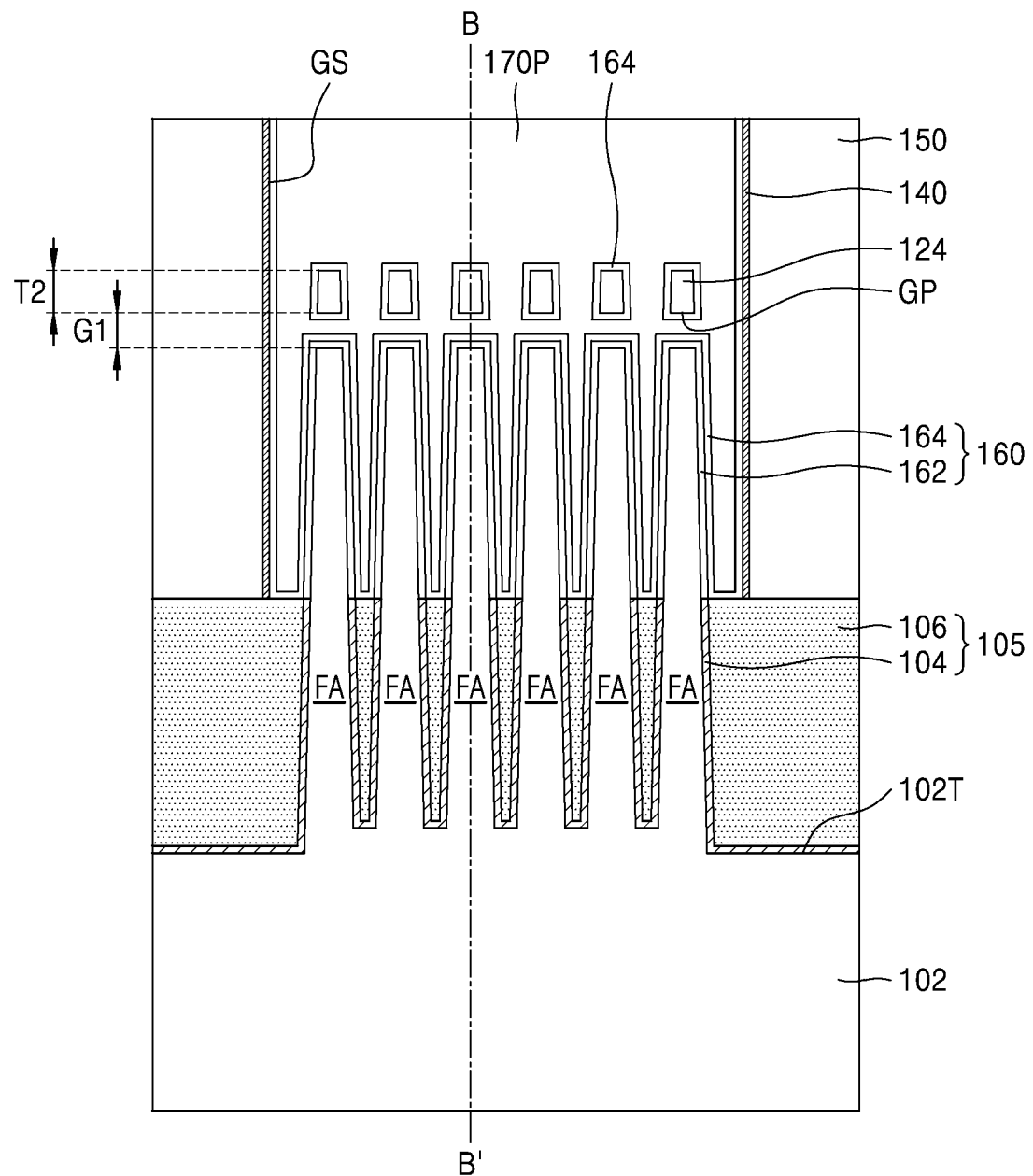
Figure 11B:
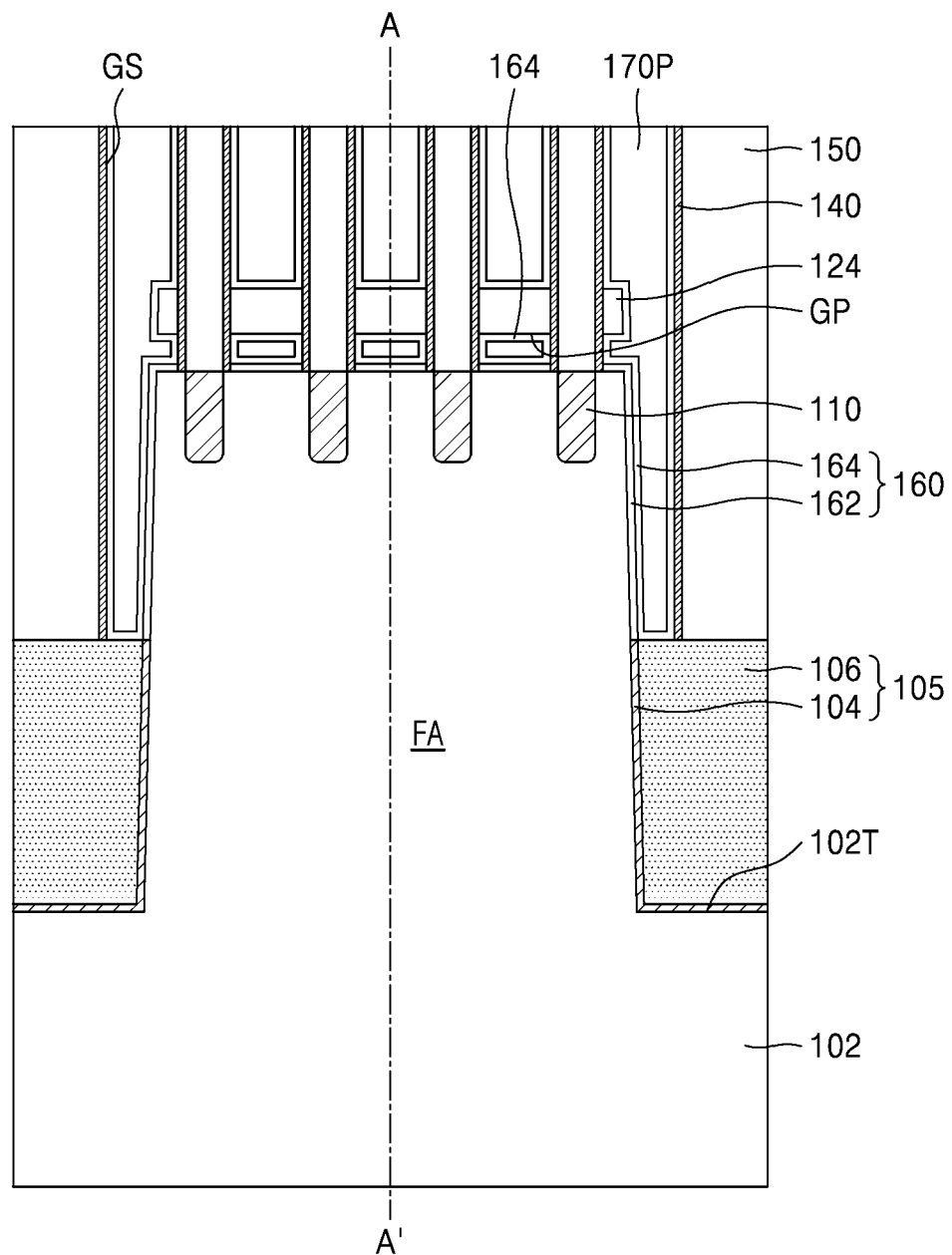
Figure 12A:
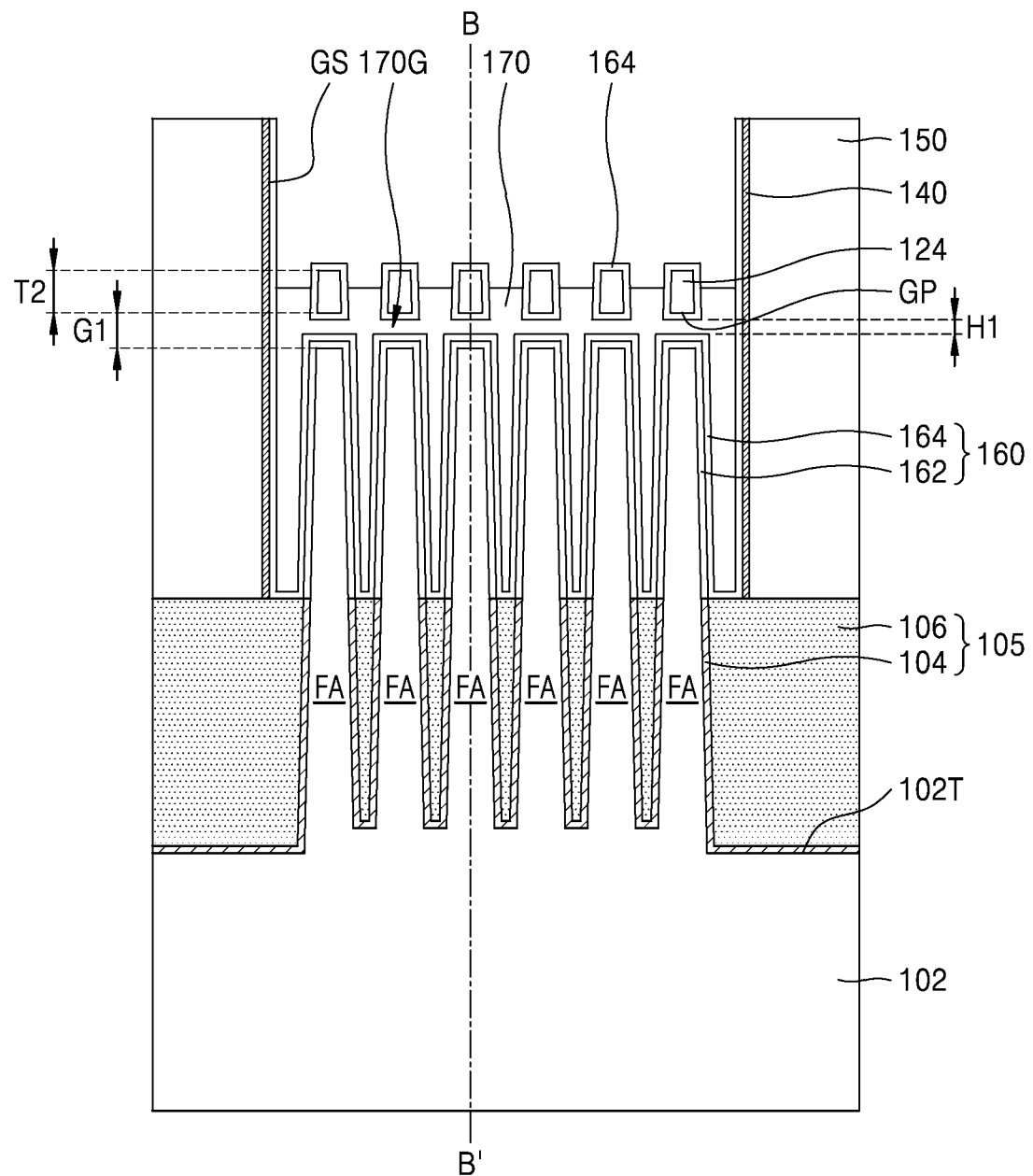
Figure 12B:
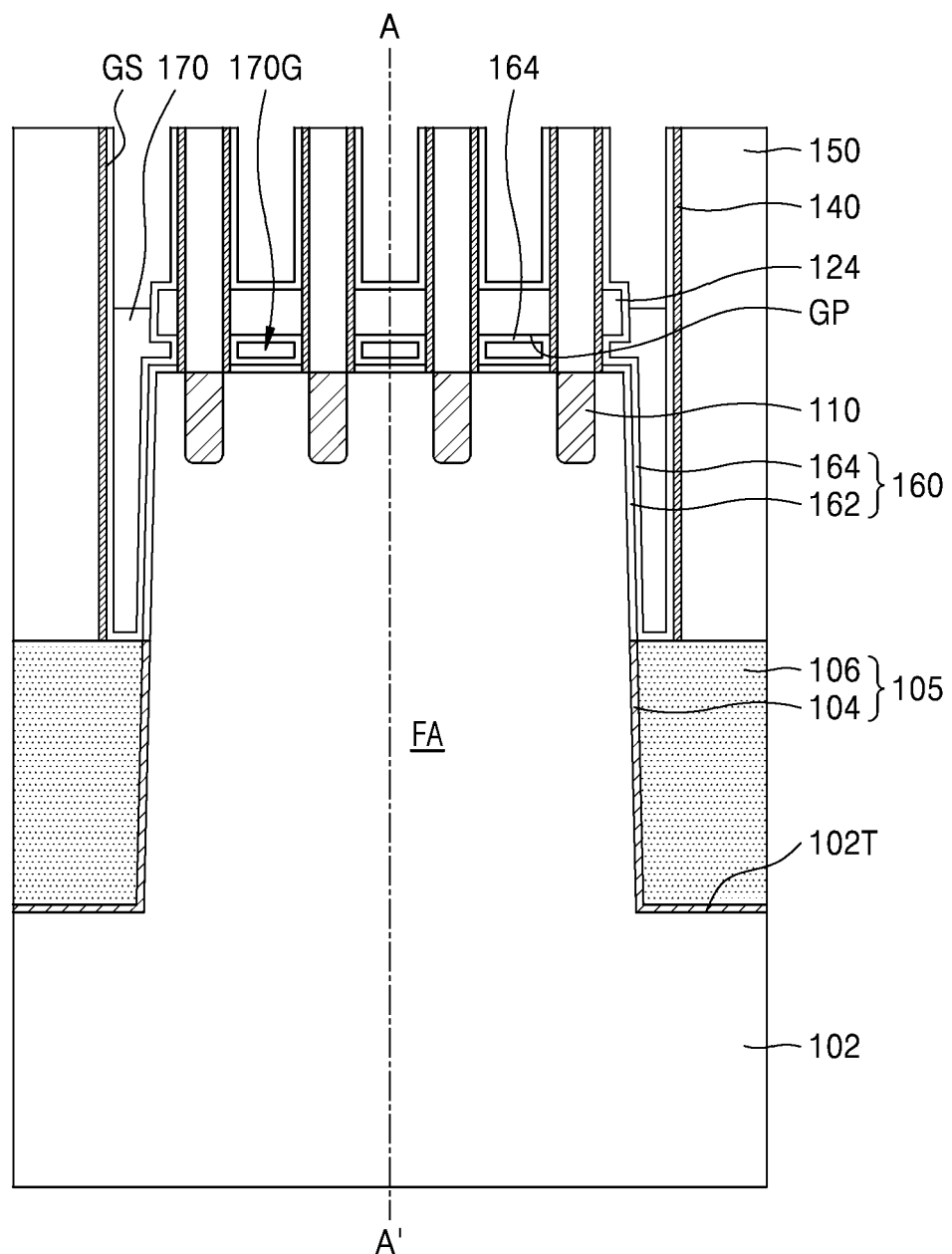

Referring to FIGS. 11A and 11B, a gate insulating layer 160 covering exposed surfaces in the gate space GS and the plurality of gap spaces GP and a preliminary gate electrode 170P covering the gate insulating layer 160 and filling the gate space GS and the plurality of gap spaces GP are formed.

Each of the gate insulating layer 160 and the preliminary gate electrode 170P may be formed by an atomic layer deposition (ALD) process, a chemical vapor deposition (CVD) process, a physical vapor deposition (PVD) process, a metal organic ALD (MOALD) process, or a metal organic CVD (MOCVD) process.

The gate insulating layer 160 may include a first dielectric layer 162 and a second dielectric layer 164. For example, the first dielectric layer 162 may conformally cover the surfaces of the plurality of fin-type active areas FA, which are exposed in the gate space GS and the plurality of gap spaces GP. The second dielectric layer 164 may conformally cover the exposed surfaces in the gate space GS and the plurality of gap spaces GP, on which the first dielectric layer 162 is formed. For example, the second dielectric layer 164 may conformally cover the surfaces of the device isolation layer 105, the plurality of stopper layers 124, the first dielectric layer 162, and the plurality of gate spacers 140, which are exposed in the gate space GS and the plurality of gap spaces GP.

The second dielectric layer 164 may include a material having a dielectric constant greater than that of a material forming the first dielectric layer 162. In some embodiments, the first dielectric layer 162 may be an interface film, and the second dielectric layer 164 may be a high-k dielectric film. For example, the first dielectric layer 162 may include an oxide layer, a nitride layer, or an oxynitride layer. For example, the second dielectric layer 164 may include a material having a dielectric constant greater than that of a silicon oxide layer. In some embodiments, the second dielectric layer 164 may include a metal oxide or a metal oxynitride. For example, the second dielectric layer 164 may have a dielectric constant of about 10 to about 25. In some embodiments, the second dielectric layer 164 may include at least one material selected from among hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the second dielectric layer 164 may include $HfO_2$, $Al_2O_3$, $HfAlO_3$, $Ta_2O_3$, or $TiO_2$.

The preliminary gate electrode 170P may have a structure in which a metal nitride layer, a metal layer, a conductive capping layer, and a gap-fill metal layer are sequentially stacked. The metal nitride layer and the metal layer may include at least one metal selected from among Ti, Ta, tungsten (W), rubidium (Ru), niobium (Nb), molybdenum (Mo), and Hf. The gap-fill metal layer may include a W layer or an Al layer. The preliminary gate electrode 170P may include a work function metal-containing layer. The work function metal-containing layer may include at least one metal selected from among Ti, W, Ru, Nb, Mo, Hf, nickel (Ni), cobalt (Co), platinum (Pt), ytterbium (Yb), terbium (Tb), dysprosium (Dy), erbium (Er), and palladium (Pd). In some embodiments, the preliminary gate electrode 170P may include a stacked structure of titanium aluminum carbide (TiAlC)/titanium nitride (TiN)/W, a stacked structure of TiN/tantalum nitride (TaN)/TiAlC/TiN/W, or a stacked structure of TiN/TaN/TiN/TiAlC/TiN/W but is not limited thereto.

Referring to FIGS. 11A to 12B, a plurality of gate electrodes 170 are formed by removing a partial upper portion of the preliminary gate electrode 170P. In some embodiments, the plurality of gate electrodes 170 may be formed by removing the partial upper portion of the preliminary gate electrode 170P until upper surfaces of the plurality of stopper layers 124 are exposed. For example, the uppermost ends/points of the plurality of gate electrodes 170 may be located at a vertical level lower than the upper surfaces of the plurality of stopper layers 124. In some embodiments, upper surfaces of the plurality of gate electrodes 170 may be located at a vertical level between the upper surfaces and lower surfaces of the plurality of stopper layers 124. For example, the lowermost portions (e.g., ends/points) of the upper surfaces of the plurality of gate electrodes 170 may be located at a vertical level higher than the lower surfaces of the plurality of stopper layers 124.

The plurality of gate electrodes 170 may include a plurality of gap electrode parts 170G filling the plurality of gap spaces GP. The plurality of gap spaces GP may be fully filled with the gate insulating layer 160 and the plurality of gap electrode parts 170G. The plurality of gap electrode parts 170G may have a gap electrode height H1 less than the gap distance G1. For example, the gap electrode height H1 may be about 2 nm to about 9 nm.

In some embodiments, parts of the second dielectric layer 164 covering the partial upper portions of the plurality of gate spacers 140 may remain on the plurality of gate spacers 140 without being removed in a process of removing the partial upper portion of the preliminary gate electrode 170P to form the plurality of gate electrodes 170. In some other embodiments, the uppermost end/point of the second dielectric layer 164 may be located in a lower level than the uppermost ends/points of the plurality of gate spacers 140 by removing the parts of the second dielectric layer 164 covering the partial upper portions of the plurality of gate spacers 140 in the process of removing the partial upper portion of the preliminary gate electrode 170P to form the plurality of gate electrodes 170.

In the process of removing the portion of the preliminary gate electrode 170P to form the plurality of gate electrodes 170, the preliminary gate electrode 170P may be exposed between the plurality of stopper layers 124 after the plurality of stopper layers 124 are exposed. In this case, when parts of the second dielectric layer 164 surrounding the surfaces of the plurality of stopper layers 124 are not removed, the preliminary gate electrode 170P may be exposed between the plurality of stopper layers 124 and the parts of the second dielectric layer 164 surrounding the plurality of stopper layers 124.

When the preliminary gate electrode 170P is exposed only in a relatively small two-dimensional area, parts of the preliminary gate electrode 170P may be removed by two-dimensionally receiving a small influence of location, so that vertical levels of the upper surfaces of the plurality of gate electrodes 170 have a relatively uniform two-dimensional distribution.

Therefore, the plurality of gate electrodes 170 may be formed to cover the plurality of fin-type active areas FA and the gate insulating layer 160 covering the plurality of fin-type active areas FA while maintaining the vertical levels of the upper surfaces of the plurality of gate electrodes 170 to be relatively low, so that the plurality of fin-type active areas FA and the gate insulating layer 160 are not exposed.

Referring to FIGS. 13A and 13B, a gate capping layer 180 filling the gate space GS is formed on the plurality of gate electrodes 170. In some embodiments, the gate capping layer 180 may include the same material as the stopper layer 124. For example, the gate capping layer 180 may include an insulating material such as SiN, SiON, or SiCN.

The gate capping layer 180 may be formed by forming a preliminary gate capping layer, which fills the gate space GS and covers the interlayer insulating layer 150, and then removing a partial upper portion of the preliminary gate capping layer until the interlayer insulating layer 150 is exposed. The gate capping layer 180 may be formed by performing, for example, a CMP process to remove the partial upper portion of the preliminary gate capping layer until the interlayer insulating layer 150 is exposed.

Referring to FIGS. 14A to 15, a plurality of first contact plugs 192 electrically connected to the plurality of source/drain areas 110 by passing through the interlayer insulating layer 150 and a plurality of second contact plugs 194 electrically connected to the plurality of gate electrodes 170 by passing through the gate capping layer 180 are formed.

Each of the plurality of first contact plugs 192 and the plurality of second contact plugs 194 may include a conductive barrier layer, and a plug material layer on the conductive barrier layer. The conductive barrier layer may include, for example, Ti, Ta, TiN, TaN, or a combination thereof. The plug material layer may include, for example, a metal material such as W, copper (Cu), Ti, Ta, Ru, manganese (Mn), or Co, a metal nitride such as TiN, TaN, cobalt nitride (CoN), or tungsten nitride (WN), or an alloy such as cobalt tungsten phosphide (CoWP), cobalt tungsten boron (CoWB), or cobalt tungsten boron phosphide (CoWBP).

In some embodiments, a silicide layer may be between each of the plurality of first contact plugs 192 and each the plurality of source/drain areas 110. The silicide layer may include, for example, tungsten silicide (WSi), titanium silicide (TiSi), cobalt silicide (CoSi), or nickel silicide (NiSi).

The integrated circuit device 1 according to an embodiment of the inventive concept may include the substrate 102 having the plurality of fin-type active areas FA limited/defined (e.g., bounded) by the substrate trench 102T, protruding from the main surface 102M of the substrate 102, extending in the first horizontal direction (the X direction), and arranged parallel to each other (e.g., spaced apart in the second horizontal direction (the Y direction)), the device isolation layer 105 filling a partial lower portion of the substrate trench 102T, the plurality of stopper layers 124 separated (i.e., spaced apart) from the plurality of fin-type active areas FA above the plurality of fin-type active areas FA, the gate insulating layer 160, which includes the first dielectric layer 162 conformally covering the surfaces of the plurality of fin-type active areas FA and the second dielectric layer 164 conformally covering the surfaces of the device isolation layer 105, the plurality of stopper layers 124, the first dielectric layer 162, and the plurality of gate spacers 140, the plurality of gate electrodes 170 filling a partial lower portion of the gate space GS, and the gate capping layer 180 filling, on the plurality of gate electrodes 170, a partial upper portion of the gate space GS. The plurality of gate spacers 140 may cover side surfaces of the plurality of gate electrodes 170. A portion of the gate insulating layer 160 may be interposed in at least portions between the plurality of gate spacers 140 and the side surfaces of the plurality of gate electrodes 170. In some embodiments, a portion of the second dielectric layer 164 may be interposed in at least a portion between the plurality of gate spacers 140 and the side surfaces of the plurality of gate electrodes 170.

The integrated circuit device 1 may further include the plurality of first contact plugs 192 electrically connected to the plurality of source/drain areas 110 by passing through the interlayer insulating layer 150, and the plurality of second contact plugs 194 electrically connected to the plurality of gate electrodes 170 by passing through the gate capping layer 180. The integrated circuit device 1 may further include the plurality of source/drain areas 110 formed on portions of the plurality of fin-type active areas FA, which are exposed between stacked structures of the gate insulating layer 160 and the plurality of gate electrodes 170, opposite side surfaces of the stacked structures being covered by the plurality of gate spacers 140.

Partial upper portions of the plurality of fin-type active areas FA may protrude in a fin shape upward from the device isolation layer 105. In some embodiments, the plurality of fin-type active areas FA may have a tapered shape in which a width in the second horizontal direction (the Y direction) gradually decreases away from the main surface 102M of the substrate 102.

The device isolation layer 105 may cover partial lower portions of sidewalls of the plurality of fin-type active areas FA. The device isolation layer 105 may include the liner layer 104 and the trench-buried layer 106 covering the liner layer 104.

The stopper layer 124 may include a material other than the material of the substrate 102 and a silicon oxide. For example, the stopper layer 124 may include an insulating material such as SiN, SiON, or SiCN. The stopper layer 124 may have the second thickness T2. The second thickness T2 may be about 7 nm to about 20 nm.

The gate insulating layer 160 may include the first dielectric layer 162 and the second dielectric layer 164. In some embodiments, the first dielectric layer 162 may be an interface film, and the second dielectric layer 164 may be a high-k dielectric film.

On the plurality of fin-type active areas FA, the plurality of gate electrodes 170 may extend in the second horizontal direction (the Y direction) intersecting with the first horizontal direction (the X direction) and be arranged parallel to each other. The upper surfaces of the plurality of gate electrodes 170 may be located at a vertical level between the upper surfaces and the lower surfaces of the plurality of stopper layers 124.

The gate capping layer 180 may cover the plurality of gate electrodes 170 and fill the gate space GS. In some embodiments, the gate capping layer 180 may include the same material as the stopper layer 124.

The plurality of gap spaces GP may be limited between the plurality of fin-type active areas FA and the plurality of stopper layers 124 which respectively correspond to each other. That is, the plurality of stopper layers 124 may be separated from the plurality of fin-type active areas FA with the plurality of gap spaces GP therebetween. The plurality of gap spaces GP may have the gap distance G1 between the upper surfaces of the plurality of fin-type active areas FA and the lower surfaces of the plurality of stopper layers 124. In some embodiments, the gap distance G1 may be about 3 nm to about 10 nm. In some other embodiments, the gap distance G1 may be about 5 nm to about 12 nm.

The plurality of gate electrodes 170 may include the plurality of gap electrode parts 170G filling the plurality of gap spaces GP. The plurality of gap spaces GP may be fully filled with the gate insulating layer 160 and the plurality of gap electrode parts 170G. The upper surfaces of the plurality of fin-type active areas FA may be covered by a portion of the first dielectric layer 162 and a portion of the second dielectric layer 164, and the lower surfaces of the plurality of stopper layers 124 may be covered by a portion of the second dielectric layer 164. Therefore, the plurality of gap electrode parts 170G may have the gap electrode height H1 less than the gap distance G1. For example, the gap electrode height H1 may be about 2 nm to about 9 nm.

The upper surfaces of the plurality of stopper layers 124 may be located at a first vertical level LV1, and the lower surfaces of the plurality of stopper layers 124 may be located at a second vertical level LV2 lower than the first vertical level LV1, i.e., closer to the substrate 102. The upper surfaces of the plurality of gate electrodes 170 may be located between the first vertical level LV1 and the second vertical level LV2, i.e., at a third vertical level LV3 lower than the first vertical level LV1 and higher than the second vertical level LV2. The upper surfaces of the plurality of fin-type active areas FA may be located at a fourth vertical level LV4 lower than the second vertical level LV2.

The integrated circuit device 1 according to the inventive concept may include the plurality of gate electrodes 170 of which the upper surfaces are located between the first vertical level LV1 and the second vertical level LV2, i.e., at a vertical level lower than the upper surfaces of the plurality of stopper layers 124 and higher than the lower surfaces of the plurality of stopper layers 124. In addition, the plurality of gate electrodes 170 may include the plurality of gap electrode parts 170G in (e.g., filling) the plurality of gap spaces GP, and the plurality of gap electrode parts 170G may be on (e.g., may cover) the upper surfaces of the plurality of fin-type active areas FA. The plurality of gap spaces GP may have the gap distance G1 that is a generally uniform gap between the plurality of fin-type active areas FA and the plurality of stopper layers 124, and each of the first dielectric layer 162 and the second dielectric layer 164, which fill a portion of the plurality of gap spaces GP, may have a generally uniform thickness in the plurality of gap spaces GP. Therefore, the gap electrode height H1 of the plurality of gap electrode parts 170G may also have a generally uniform value.

That is, the plurality of gate electrodes 170 may have the gate insulating layer 160 therebetween and may be on (e.g., may cover) the plurality of fin-type active areas FA with a thickness greater than or equal to the gap electrode height H1. Therefore, in the integrated circuit device 1 according to the inventive concept, the upper surfaces of the plurality of gate electrodes 170 may be located at a relatively low vertical level so that a height of the plurality of gate electrodes 170 is reduced, and the plurality of gate electrodes 170 cover the surfaces of the plurality of fin-type active areas FA with a certain thickness or more.

Therefore, for the integrated circuit device 1 according to the inventive concept, the height of the plurality of gate electrodes 170 may be reduced to make a manufacturing process easy and exhibit good alternating current (AC) characteristics, and the plurality of gate electrodes 170 may be on (e.g., may cover) the surfaces of the plurality of fin-type active areas FA with a certain thickness or more, thereby improving reliability.

Figure 16:
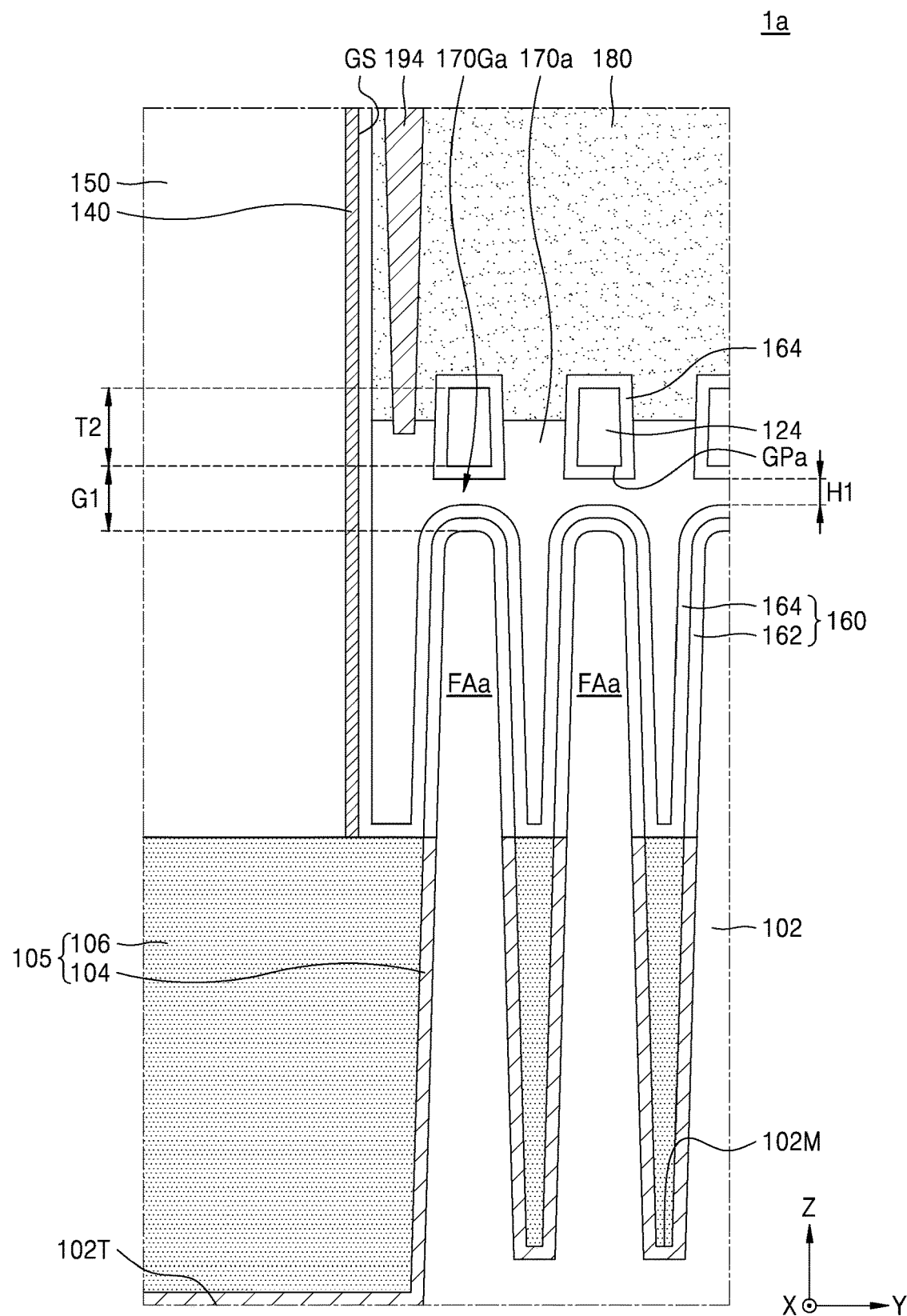
FIG. 16 is a magnified cross-sectional view of an integrated circuit device according to an embodiment of the inventive concept.

FIG. 16 is a magnified cross-sectional view of an integrated circuit device 1a according to an embodiment of the inventive concept and is particularly a magnified cross-sectional view of a part corresponding to the part PM1 of FIG. 14A.

Referring to FIG. 16, the integrated circuit device 1a according to the inventive concept may include the substrate 102 having a plurality of fin-type active areas FAa limited/defined (e.g., bounded) by the substrate trench 102T, protruding from the main surface 102M of the substrate 102, and extending in the first horizontal direction (the X direction), the device isolation layer 105 filling a partial lower portion of the substrate trench 102T, the plurality of stopper layers 124 separated from the plurality of fin-type active areas FAa above the plurality of fin-type active areas FAa, the gate insulating layer 160, which includes the first dielectric layer 162 conformally covering the surfaces of the plurality of fin-type active areas FAa and the second dielectric layer 164 conformally covering the surfaces of the device isolation layer 105, the plurality of stopper layers 124, the first dielectric layer 162, and the plurality of gate spacers 140, a plurality of gate electrodes 170a filling a partial lower portion of the gate space GS, and the gate capping layer 180 filling, on the plurality of gate electrodes 170a, a partial upper portion of the gate space GS. The plurality of gate spacers 140 may cover side surfaces of the plurality of gate electrodes 170a. A portion of the gate insulating layer 160 may be interposed in at least portions between the plurality of gate spacers 140 and the side surfaces of the plurality of gate electrodes 170a. In some embodiments, a portion of the second dielectric layer 164 may be interposed in at least a portion between the plurality of gate spacers 140 and the side surfaces of the plurality of gate electrodes 170a.

The integrated circuit device 1a may further include the plurality of second contact plugs 194 electrically connected to the plurality of gate electrodes 170a by passing through the gate capping layer 180 and further include, as shown in FIG. 14B, the plurality of first contact plugs 192 electrically connected to the plurality of source/drain areas 110 by passing through the interlayer insulating layer 150. The integrated circuit device 1a may further include the plurality of source/drain areas 110 formed on portions of the plurality of fin-type active areas FAa, which are exposed between stacked structures of the gate insulating layer 160 and the plurality of gate electrodes 170a, opposite side surfaces of the stacked structures being covered by the plurality of gate spacers 140.

The plurality of fin-type active areas FAa may have a shape in which upper corner portions are rounded. A plurality of gap spaces GPa may be restricted between the plurality of fin-type active areas FAa and the plurality of stopper layers 124 which respectively correspond to each other. Because the upper corner portions of the plurality of fin-type active areas FAa have a rounded shape, the plurality of gap spaces GPa may have a maximum gap greater than the gap distance G1 at the upper corner portions of the plurality of fin-type active areas FAa and have the gap distance G1 that is a minimum gap at upper central portions of the plurality of fin-type active areas FAa.

On the plurality of fin-type active areas FAa, the plurality of gate electrodes 170a may extend in the second horizontal direction (the Y direction) intersecting with the first horizontal direction (the X direction). The plurality of gate electrodes 170a may include a plurality of gap electrode parts 170Ga filling the plurality of gap spaces GPa, and the plurality of gap electrode parts 170Ga may cover upper surfaces of the plurality of fin-type active areas FAa. The plurality of gate electrodes 170a may have flat upper surfaces and concave lower surfaces. The plurality of gap electrode parts 170Ga may have a maximum height greater than the gap electrode height H1 at the upper corner portions of the plurality of fin-type active areas FAa and have the gap electrode height H1 that is a minimum height at the upper central portions of the plurality of fin-type active areas FAa.

Figure 17A:
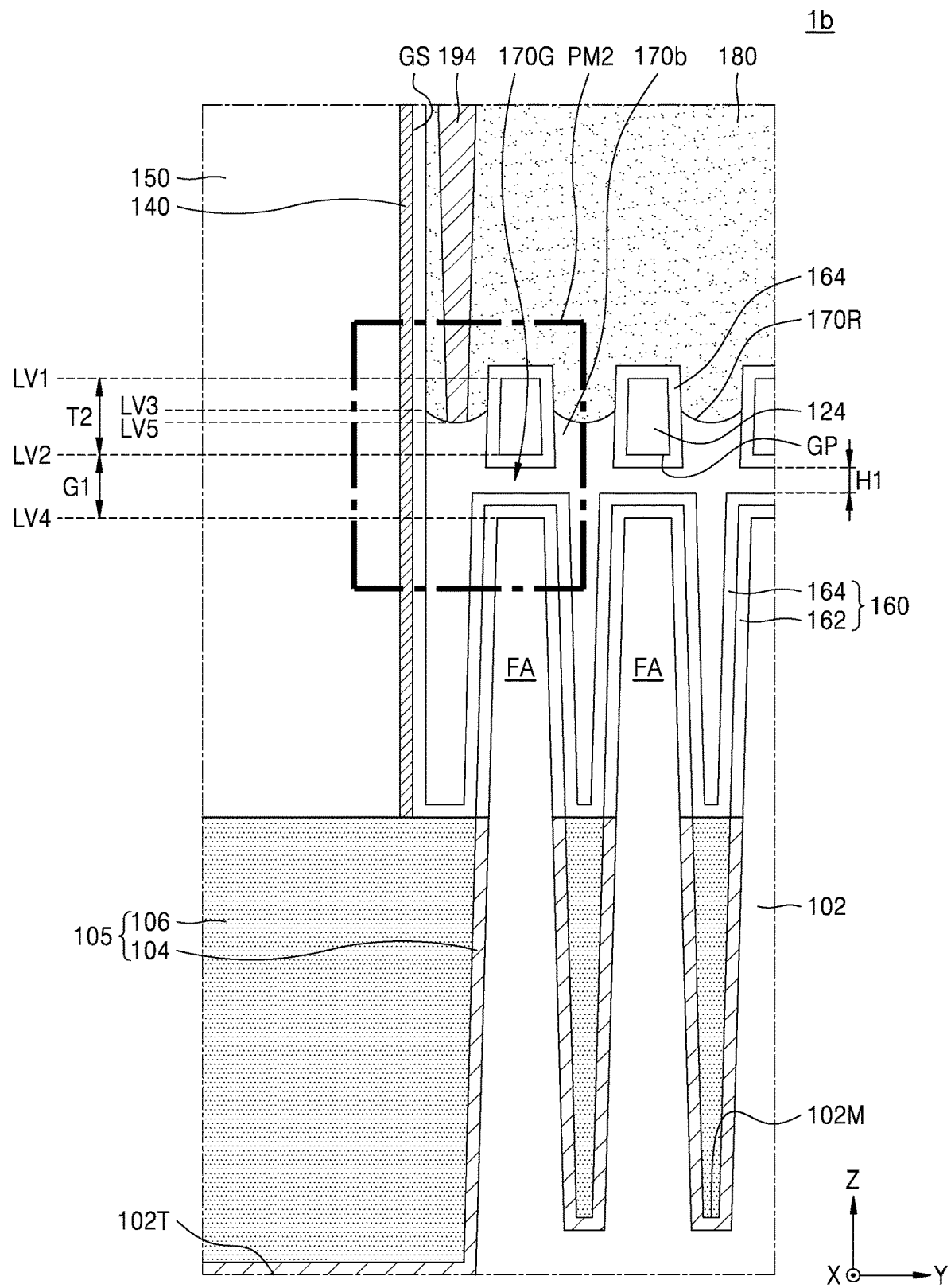
FIGS. 17A and 17B are magnified cross-sectional views of an integrated circuit device according to an embodiment of the inventive concept.
Figure 17B:
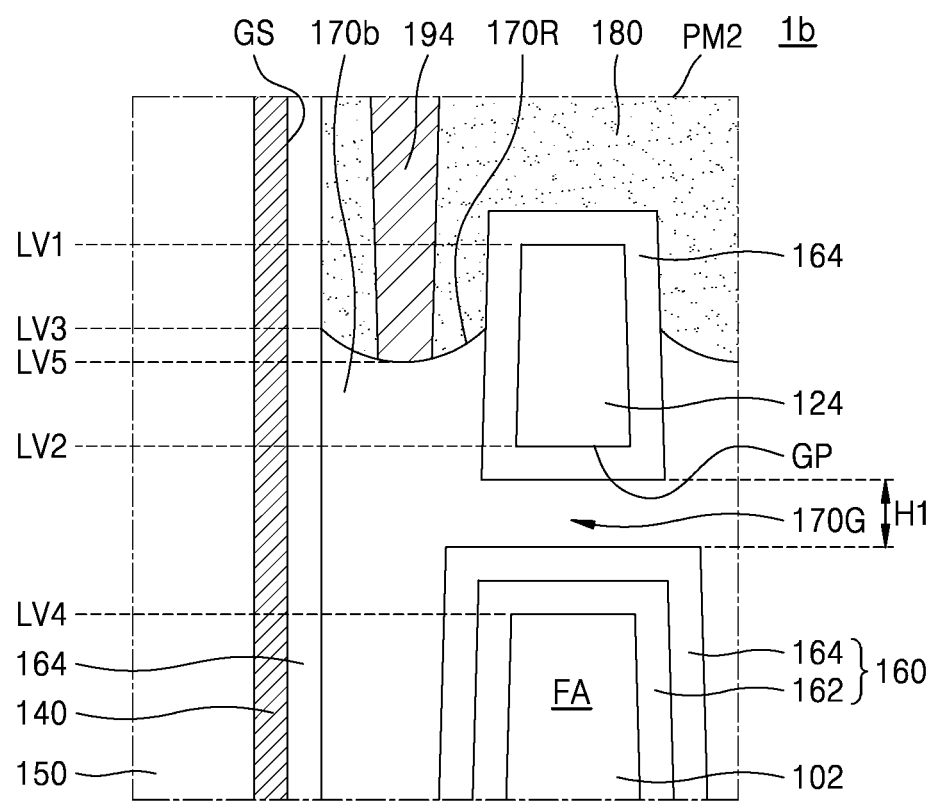

FIGS. 17A and 17B are magnified cross-sectional views of an integrated circuit device 1b according to an embodiment of the inventive concept, and particularly, FIG. 17A is a magnified cross-sectional view of a part corresponding to the part PM1 of FIG. 14A, and FIG. 17B is a magnified cross-sectional view of a part PM2 of FIG. 17A.

Referring to FIGS. 17A and 17B, the integrated circuit device 1b according to the inventive concept may include the substrate 102 having the plurality of fin-type active areas FA limited/defined (e.g., bounded) by the substrate trench 102T, protruding from the main surface 102M of the substrate 102, and extending in the first horizontal direction (the X direction), the device isolation layer 105 filling a partial lower portion of the substrate trench 102T, the plurality of stopper layers 124 separated from the plurality of fin-type active areas FA above (i.e., overlapping in the Z direction) the plurality of fin-type active areas FA, the gate insulating layer 160, which includes the first dielectric layer 162 conformally covering the surfaces of the plurality of fin-type active areas FA and the second dielectric layer 164 conformally covering the surfaces of the device isolation layer 105, the plurality of stopper layers 124, the first dielectric layer 162, and the plurality of gate spacers 140, a plurality of gate electrodes 170b filling a partial lower portion of the gate space GS, and the gate capping layer 180 filling, on the plurality of gate electrodes 170b, a partial upper portion of the gate space GS. The plurality of gate spacers 140 may cover side surfaces of the plurality of gate electrodes 170b. A portion of the gate insulating layer 160 may be interposed in at least portions between the plurality of gate spacers 140 and the side surfaces of the plurality of gate electrodes 170b. In some embodiments, a portion of the second dielectric layer 164 may be interposed in at least a portion between the plurality of gate spacers 140 and the side surfaces of the plurality of gate electrodes 170b.

The integrated circuit device 1b may further include the plurality of second contact plugs 194 electrically connected to the plurality of gate electrodes 170b by passing through the gate capping layer 180 and further include, as shown in FIG. 14B, the plurality of first contact plugs 192 electrically connected to the plurality of source/drain areas 110 by passing through the interlayer insulating layer 150. The integrated circuit device 1b may further include the plurality of source/drain areas 110 formed on portions of the plurality of fin-type active areas FA, which are exposed between stacked structures of the gate insulating layer 160 and the plurality of gate electrodes 170b, opposite side surfaces of the stacked structures being covered by the plurality of gate spacers 140.

On the plurality of fin-type active areas FA, the plurality of gate electrodes 170b may extend in the second horizontal direction (the Y direction) intersecting with the first horizontal direction (the X direction). The plurality of gate electrodes 170b may include the plurality of gap electrode parts 170G filling the plurality of gap spaces GP. The plurality of gate electrodes 170b may have a plurality of recesses 170R having a concave shape at upper central portions thereof between the plurality of stopper layers 124 and between the stopper layer 124 and the gate spacer 140. The gate capping layer 180 may fill the plurality of recesses 170R.

In the process of forming the plurality of gate electrodes 170, which has been described with reference to FIGS. 11A to 12B, the plurality of recesses 170R may be formed by removing portions of the preliminary gate electrode 170P located at central portions between the plurality of stopper layers 124 and a central portion between the stopper layer 124 and the gate spacer 140 more than portions of the preliminary gate electrode 170P located to be adjacent to the plurality of stopper layers 124 and the gate spacer 140.

The upper surfaces of the plurality of stopper layers 124 may be located at the first vertical level LV1, and the lower surfaces of the plurality of stopper layers 124 may be located at the second vertical level LV2 lower than the first vertical level LV1, i.e., closer to the substrate 102. The uppermost ends/points of upper surfaces of the plurality of gate electrodes 170b may be located between the first vertical level LV1 and the second vertical level LV2, i.e., at the third vertical level LV3 lower than the first vertical level LV1 and higher than the second vertical level LV2. The upper surfaces of the plurality of fin-type active areas FA may be located at the fourth vertical level LV4 lower than the second vertical level LV2. The lowermost portions (e.g., ends/points) of the upper surfaces of the plurality of gate electrodes 170*b* may be located at a fifth vertical level LV5 lower than the third vertical level LV3 and higher than the second vertical level LV2. The upper surfaces of the plurality of gate electrodes 170*b* may have the uppermost ends/points located at the highest vertical level at portions adjacent to the plurality of stopper layers 124 and the gate spacer 140. The uppermost portions (e.g., ends/points) of the upper surfaces of the plurality of gate electrodes 170*b* may be in contact with the second dielectric layer 164 surrounding the plurality of stopper layers 124 and covering the gate spacer 140.

Figure 18A:
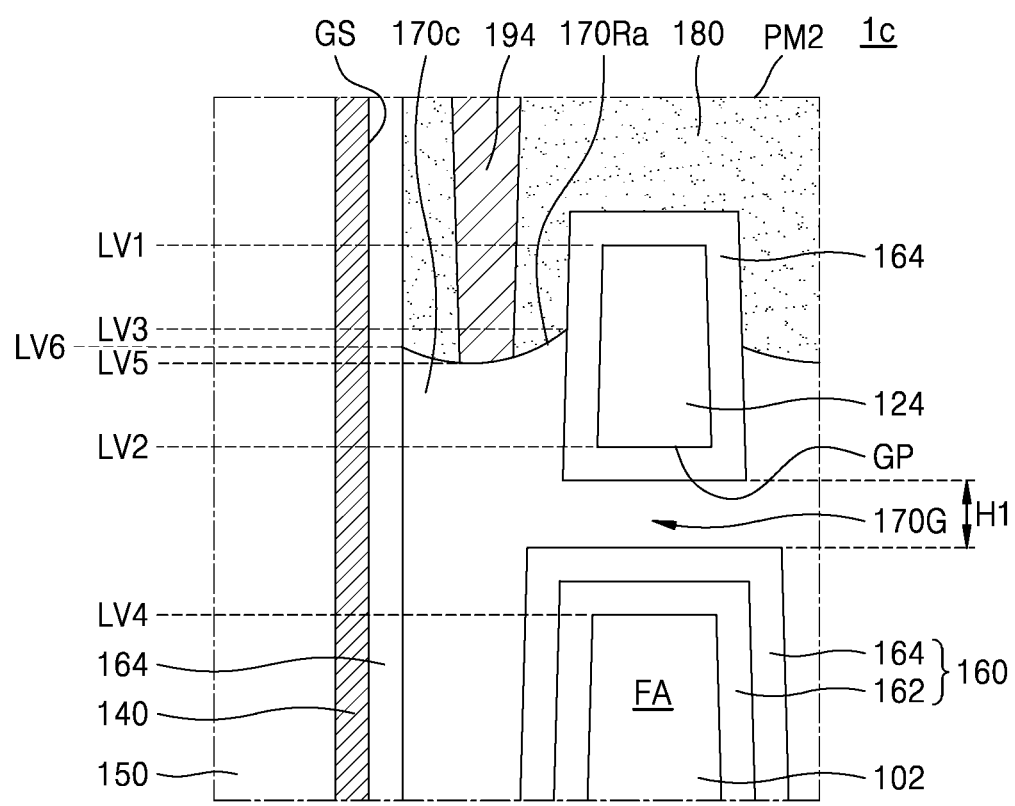
FIGS. 18A and 18B are magnified cross-sectional views of integrated circuit devices according to embodiments of the inventive concept.
Figure 18B:
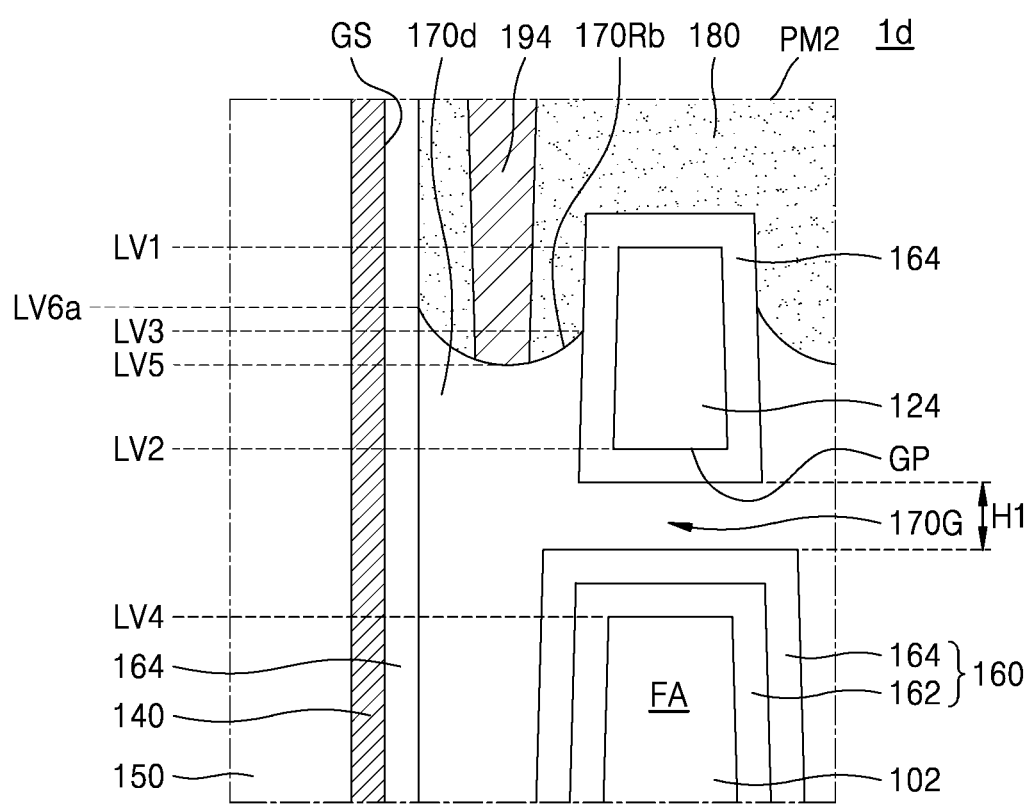

FIGS. 18A and 18B are magnified cross-sectional views of integrated circuit devices 1*c* and 1*d* according to embodiments of the inventive concept, respectively, and are particularly magnified cross-sectional views of parts corresponding to the part PM2 of FIG. 17A.

Referring to FIG. 18A, the integrated circuit device 1*c* according to the inventive concept may include the substrate 102 having the plurality of fin-type active areas FA limited/defined (e.g., bounded) by the substrate trench 102T, protruding from the main surface 102M of the substrate 102, and extending in the first horizontal direction (the X direction), the device isolation layer 105 filling a partial lower portion of the substrate trench 102T, the plurality of stopper layers 124 separated from the plurality of fin-type active areas FA above the plurality of fin-type active areas FA, the gate insulating layer 160, which includes the first dielectric layer 162 conformally covering the surfaces of the plurality of fin-type active areas FA and the second dielectric layer 164 conformally covering the surfaces of the device isolation layer 105, the plurality of stopper layers 124, the first dielectric layer 162, and the plurality of gate spacers 140, a plurality of gate electrodes 170*c* filling a partial lower portion of the gate space GS, and the gate capping layer 180 filling, on the plurality of gate electrodes 170*c*, a partial upper portion of the gate space GS. The plurality of gate spacers 140 may cover side surfaces of the plurality of gate electrodes 170*c*. A portion of the gate insulating layer 160 may be interposed in at least portions between the plurality of gate spacers 140 and the side surfaces of the plurality of gate electrodes 170*c*. In some embodiments, a portion of the second dielectric layer 164 may be interposed in at least a portion between the plurality of gate spacers 140 and the side surfaces of the plurality of gate electrodes 170*c*.

The integrated circuit device 1*c* may further include the plurality of second contact plugs 194 electrically connected to the plurality of gate electrodes 170*c* by passing through the gate capping layer 180 and further include, as shown in FIG. 14B, the plurality of first contact plugs 192 electrically connected to the plurality of source/drain areas 110 by passing through the interlayer insulating layer 150. The integrated circuit device 1*c* may further include the plurality of source/drain areas 110 formed on portions of the plurality of fin-type active areas FA, which are exposed between stacked structures of the gate insulating layer 160 and the plurality of gate electrodes 170*c*, opposite side surfaces of the stacked structures being covered by the plurality of gate spacers 140.

On the plurality of fin-type active areas FA, the plurality of gate electrodes 170*c* may extend in the second horizontal direction (the Y direction) intersecting with the first horizontal direction (the X direction). The plurality of gate electrodes 170*c* may include the plurality of gap electrode parts 170G filling the plurality of gap spaces GP. The plurality of gate electrodes 170*c* may have a plurality of recesses 170Ra having a concave shape at upper central portions thereof between the plurality of stopper layers 124 and between the stopper layer 124 and the gate spacer 140. The gate capping layer 180 may fill the plurality of recesses 170Ra.

In the process of forming the plurality of gate electrodes 170, which has been described with reference to FIGS. 11A to 12B, the plurality of recesses 170Ra may be formed by removing portions of the preliminary gate electrode 170P located at central portions between the plurality of stopper layers 124 and a central portion between the stopper layer 124 and the gate spacer 140 more than portions of the preliminary gate electrode 170P located to be adjacent to the plurality of stopper layers 124 and the gate spacer 140.

The upper surfaces of the plurality of stopper layers 124 may be located at the first vertical level LV1, and the lower surfaces of the plurality of stopper layers 124 may be located at the second vertical level LV2 lower than the first vertical level LV1, i.e., closer to the substrate 102. The uppermost ends/points of upper surfaces of the plurality of gate electrodes 170*c* may be located between the first vertical level LV1 and the second vertical level LV2, i.e., at the third vertical level LV3 lower than the first vertical level LV1 and higher than the second vertical level LV2. The upper surfaces of the plurality of fin-type active areas FA may be located at the fourth vertical level LV4 lower than the second vertical level LV2. The lowermost portions (e.g., ends/points) of the upper surfaces of the plurality of gate electrodes 170*c* may be located at the fifth vertical level LV5 lower than the third vertical level LV3 and higher than the second vertical level LV2.

Portions of the upper surfaces of the plurality of gate electrodes 170*c*, which are in contact with the second dielectric layer 164 surrounding the plurality of stopper layers 124, may be located at the third vertical level LV3, and a portion of the upper surfaces of the plurality of gate electrodes 170*c*, which is in contact with the second dielectric layer 164 covering the gate spacer 140, may be located at a sixth vertical level LV6 lower than the third vertical level LV3 and higher than the fifth vertical level LV5. The upper surfaces of the plurality of gate electrodes 170*c* may have the uppermost ends/points located at the highest vertical level at portions adjacent to the plurality of stopper layers 124. That is, the portions of the upper surfaces of the plurality of gate electrodes 170*c*, which are in contact with the second dielectric layer 164 surrounding the plurality of stopper layers 124, may be located at a vertical level higher than the portion of the upper surfaces of the plurality of gate electrodes 170*c*, which is in contact with the second dielectric layer 164 covering the gate spacer 140.

Referring to FIG. 18B, the integrated circuit device 1*d* according to the inventive concept may include the substrate 102 having the plurality of fin-type active areas FA limited/defined (e.g., bounded) by the substrate trench 102T, protruding from the main surface 102M of the substrate 102, and extending in the first horizontal direction (the X direction), the device isolation layer 105 filling a partial lower portion of the substrate trench 102T, the plurality of stopper layers 124 separated from the plurality of fin-type active areas FA above the plurality of fin-type active areas FA, the gate insulating layer 160, which includes the first dielectric layer 162 conformally covering the surfaces of the plurality of fin-type active areas FA and the second dielectric layer 164 conformally covering the surfaces of the device isolation layer 105, the plurality of stopper layers 124, the first dielectric layer 162, and the plurality of gate spacers 140, a plurality of gate electrodes 170*d* filling a partial lower portion of the gate space GS, and the gate capping layer 180 filling, on the plurality of gate electrodes 170*d*, a partial upper portion of the gate space GS. The plurality of gate spacers 140 may cover side surfaces of the plurality of gate electrodes 170*d*. A portion of the gate insulating layer 160 may be interposed in at least portions between the plurality of gate spacers 140 and the side surfaces of the plurality of gate electrodes 170*d*. In some embodiments, a portion of the second dielectric layer 164 may be interposed in at least a portion between the plurality of gate spacers 140 and the side surfaces of the plurality of gate electrodes 170*d*.

The integrated circuit device 1*d* may further include the plurality of second contact plugs 194 electrically connected to the plurality of gate electrodes 170*d* by passing through the gate capping layer 180 and further include, as shown in FIG. 14B, the plurality of first contact plugs 192 electrically connected to the plurality of source/drain areas 110 by passing through the interlayer insulating layer 150. The integrated circuit device 1*d* may further include the plurality of source/drain areas 110 formed on portions of the plurality of fin-type active areas FA, which are exposed between stacked structures of the gate insulating layer 160 and the plurality of gate electrodes 170*d*, opposite side surfaces of the stacked structures being covered by the plurality of gate spacers 140.

On the plurality of fin-type active areas FA, the plurality of gate electrodes 170*d* may extend in the second horizontal direction (the Y direction) intersecting with the first horizontal direction (the X direction). The plurality of gate electrodes 170*d* may include the plurality of gap electrode parts 170G filling the plurality of gap spaces GP. The plurality of gate electrodes 170*d* may have a plurality of recesses 170Rb having a concave shape at upper central portions thereof between the plurality of stopper layers 124 and between the stopper layer 124 and the gate spacer 140. The gate capping layer 180 may fill the plurality of recesses 170Rb.

In the process of forming the plurality of gate electrodes 170, which has been described with reference to FIGS. 11A to 12B, the plurality of recesses 170Rb may be formed by removing portions of the preliminary gate electrode 170P located at central portions between the plurality of stopper layers 124 and a central portion between the stopper layer 124 and the gate spacer 140 more than portions of the preliminary gate electrode 170P located to be adjacent to the plurality of stopper layers 124 and the gate spacer 140.

The upper surfaces of the plurality of stopper layers 124 may be located at the first vertical level LV1, and the lower surfaces of the plurality of stopper layers 124 may be located at the second vertical level LV2 lower than the first vertical level LV1, i.e., closer to the substrate 102. Portions of the upper surfaces of the plurality of gate electrodes 170*d*, which are in contact with the second dielectric layer 164 surrounding the plurality of stopper layers 124, may be located at the third vertical level LV3. The upper surfaces of the plurality of fin-type active areas FA may be located at the fourth vertical level LV4 lower than the second vertical level LV2. The lowermost portions (e.g., ends/points) of the upper surfaces of the plurality of gate electrodes 170*d* may be located at the fifth vertical level LV5 lower than the third vertical level LV3 and higher than the second vertical level LV2. A portion of the upper surfaces of the plurality of gate electrodes 170*d*, which is in contact with the second dielectric layer 164 covering the gate spacer 140, may be located at a sixth vertical level LV6*a* higher than the third vertical level LV3 and lower than the first vertical level LV1. The upper surfaces of the plurality of gate electrodes 170*d* may have the uppermost end/point located at the highest vertical level at a portion adjacent to the gate spacer 140. That is, portions of the upper surfaces of the plurality of gate electrodes 170*d*, which are in contact with the second dielectric layer 164 surrounding the plurality of stopper layers 124, may be located at a vertical level lower than the portion of the upper surfaces of the plurality of gate electrodes 170*d*, which is in contact with the second dielectric layer 164 covering the gate spacer 140.

The uppermost end/point of the upper surfaces of the plurality of gate electrodes 170*d* may be located at the sixth vertical level LV6*a* where the uppermost end/point is in contact with the second dielectric layer 164 covering the gate spacer 140.

Figure 19:
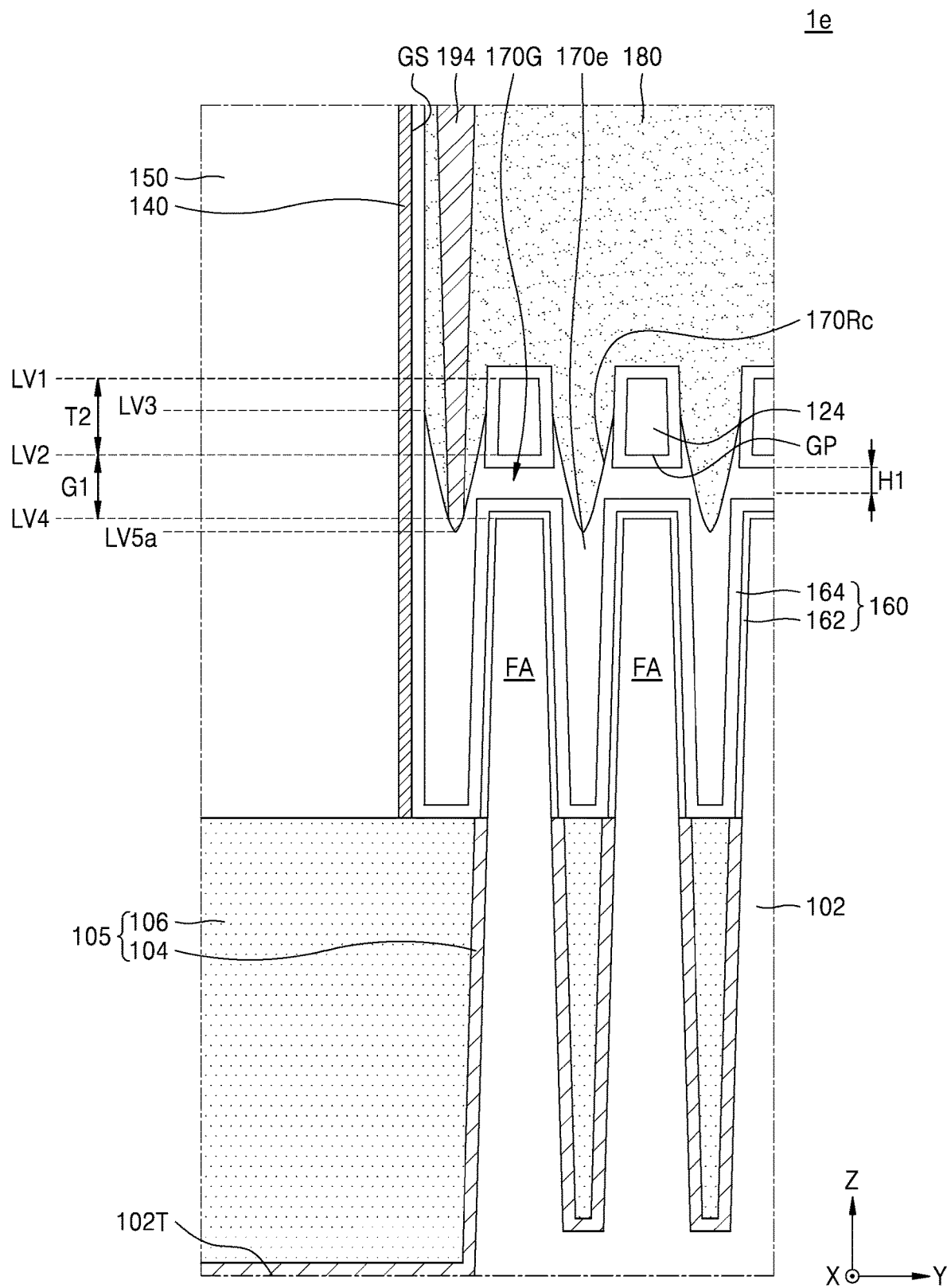
FIG. 19 is a magnified cross-sectional view of an integrated circuit device according to an embodiment of the inventive concept.

FIG. 19 is a magnified cross-sectional view of an integrated circuit device 1*e* according to an embodiment of the inventive concept, and is particularly a magnified cross-sectional view of a part corresponding to the part PM1 of FIG. 14A.

Referring to FIG. 19, the integrated circuit device 1*e* according to the inventive concept may include the substrate 102 having the plurality of fin-type active areas FA limited/defined (e.g., bounded) by the substrate trench 102T, protruding from the main surface 102M of the substrate 102, and extending in the first horizontal direction (the X direction), the device isolation layer 105 filling a partial lower portion of the substrate trench 102T, the plurality of stopper layers 124 separated from the plurality of fin-type active areas FA above the plurality of fin-type active areas FA, the gate insulating layer 160, which includes the first dielectric layer 162 conformally covering the surfaces of the plurality of fin-type active areas FA and the second dielectric layer 164 conformally covering the surfaces of the device isolation layer 105, the plurality of stopper layers 124, the first dielectric layer 162, and the plurality of gate spacers 140, a plurality of gate electrodes 170*e* filling a partial lower portion of the gate space GS, and the gate capping layer 180 filling, on the plurality of gate electrodes 170*e*, a partial upper portion of the gate space GS. The plurality of gate spacers 140 may cover side surfaces of the plurality of gate electrodes 170*e*. A portion of the gate insulating layer 160 may be interposed in at least portions between the plurality of gate spacers 140 and the side surfaces of the plurality of gate electrodes 170*e*. In some embodiments, a portion of the second dielectric layer 164 may be interposed in at least a portion between the plurality of gate spacers 140 and the side surfaces of the plurality of gate electrodes 170*e*.

The integrated circuit device 1*e* may further include the plurality of second contact plugs 194 electrically connected to the plurality of gate electrodes 170*e* by passing through the gate capping layer 180 and further include, as shown in FIG. 14B, the plurality of first contact plugs 192 electrically connected to the plurality of source/drain areas 110 by passing through the interlayer insulating layer 150. The integrated circuit device 1*e* may further include the plurality of source/drain areas 110 formed on portions of the plurality of fin-type active areas FA, which are exposed between stacked structures of the gate insulating layer 160 and the plurality of gate electrodes 170*e*, opposite side surfaces of the stacked structures being covered by the plurality of gate spacers 140.

On the plurality of fin-type active areas FA, the plurality of gate electrodes 170*e* may extend in the second horizontal direction (the Y direction) intersecting with the first horizontal direction (the X direction). The plurality of gate electrodes 170*e* may include the plurality of gap electrode parts 170G filling the plurality of gap spaces GP. The plurality of gate electrodes 170*e* may have a plurality of recesses 170Rc having a concave shape at upper central portions thereof between the plurality of stopper layers 124 and between the stopper layer 124 and the gate spacer 140. The gate capping layer 180 may fill the plurality of recesses 170Rc.

In the process of forming the plurality of gate electrodes 170, which has been described with reference to FIGS. 11A to 12B, the plurality of recesses 170Rc may be formed by removing portions of the preliminary gate electrode 170P located at central portions between the plurality of stopper layers 124 and a central portion between the stopper layer 124 and the gate spacer 140 more than portions of the preliminary gate electrode 170P located to be adjacent to the plurality of stopper layers 124 and the gate spacer 140.

The upper surfaces of the plurality of stopper layers 124 may be located at the first vertical level LV1, and the lower surfaces of the plurality of stopper layers 124 may be located at the second vertical level LV2 lower than the first vertical level LV1, i.e., closer to the substrate 102. The uppermost ends/points of upper surfaces of the plurality of gate electrodes 170e may be located between the first vertical level LV1 and the second vertical level LV2, i.e., at the third vertical level LV3 lower than the first vertical level LV1 and higher than the second vertical level LV2. The upper surfaces of the plurality of fin-type active areas FA may be located at the fourth vertical level LV4 lower than the second vertical level LV2. The lowermost portions (e.g., ends/points) of the upper surfaces of the plurality of gate electrodes 170e may be located at a fifth level LV5a lower than the fourth vertical level LV4. That is, the plurality of recesses 170Rc may extend from between the upper surfaces and the lower surfaces of the plurality of stopper layers 124 to locations at a vertical level lower than the upper surfaces of the plurality of fin-type active areas FA.

In some embodiments, the uppermost portions (e.g., ends/points) of the upper surfaces of the plurality of gate electrodes 170e may be in contact with the second dielectric layer 164 surrounding the plurality of stopper layers 124 and covering the gate spacer 140. In some other embodiments, like the plurality of gate electrodes 170c shown in FIG. 18A, the uppermost ends/points of the upper surfaces of the plurality of gate electrodes 170e may be in contact with the second dielectric layer 164 surrounding the plurality of stopper layers 124. In some other embodiments, like the plurality of gate electrodes 170d shown in FIG. 18B, the uppermost end/point of each of the upper surfaces of the plurality of gate electrodes 170e may be in contact with the second dielectric layer 164 covering the gate spacer 140.

Although not separately shown, the integrated circuit devices 1b, 1c, 1d, and 1e shown in FIGS. 17A to 19 may include the plurality of fin-type active areas FAa and the plurality of gap electrode parts 170Ga shown in FIG. 16 instead of the plurality of fin-type active areas FA and the plurality of gap electrode parts 170G.

Figure 20A:
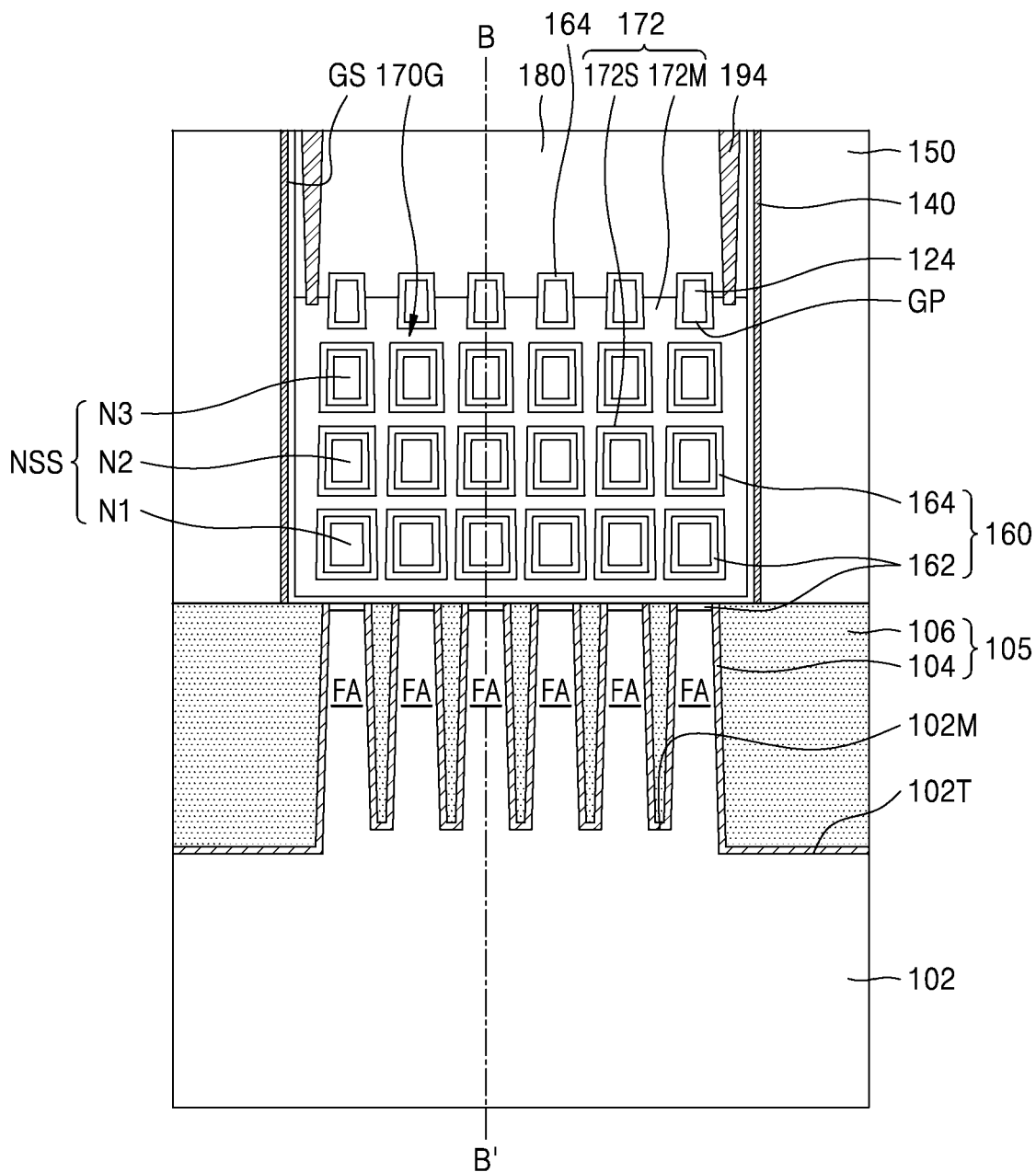
FIGS. 20A and 20B are cross-sectional views of an integrated circuit device according to an embodiment of the inventive concept.
Figure 20B:
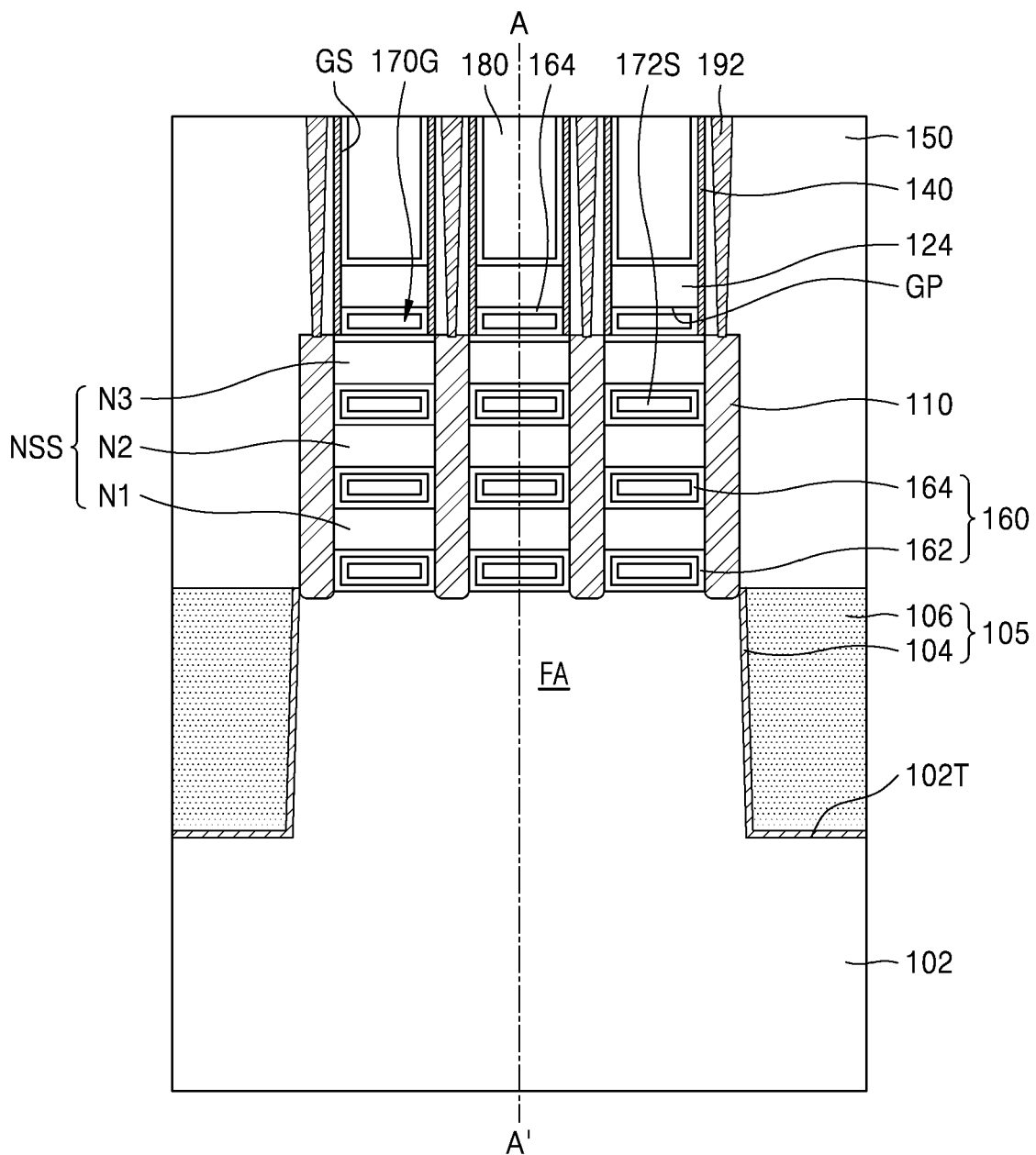

FIGS. 20A and 20B are cross-sectional views of an integrated circuit device 2 according to an embodiment of the inventive concept. Particularly, the integrated circuit device 2 having a transistor including a nanosheet will be described with reference to FIGS. 20A and 20B, and in FIGS. 20A and 20B, like reference numerals in FIGS. 14A and 14B denote substantially the same members, and a description made with reference to FIGS. 14A and 14B may be omitted.

Referring to FIGS. 20A and 20B, the integrated circuit device 2 may include the substrate 102 having the plurality of fin-type active areas FA limited/defined (e.g., bounded) by the substrate trench 102T, protruding from the main surface 102M of the substrate 102, and extending in the first horizontal direction (the X direction), a plurality of nanosheet stacked structures NSS facing the upper surfaces of the plurality of fin-type active areas FA at locations separated from the upper surfaces of the plurality of fin-type active areas FA, the plurality of stopper layers 124 separated from the plurality of fin-type active areas FA above the plurality of nanosheet stacked structures NSS, the gate insulating layer 160, which includes the first dielectric layer 162 conformally covering the surfaces of the plurality of fin-type active areas FA and the surfaces of the plurality of nanosheet stacked structures NSS and the second dielectric layer 164 conformally covering the surfaces of the device isolation layer 105, the plurality of stopper layers 124, the first dielectric layer 162, and the plurality of gate spacers 140, a plurality of gate electrodes 172 filling a partial lower portion of the gate space GS, and the gate capping layer 180 filling, on the plurality of gate electrodes 172, a partial upper portion of the gate space GS. The plurality of gate spacers 140 may cover side surfaces of the plurality of gate electrodes 172. A portion of the gate insulating layer 160 may be interposed in at least portions between the plurality of gate spacers 140 and the side surfaces of the plurality of gate electrodes 172. In some embodiments, a portion of the second dielectric layer 164 may be interposed in at least a portion between the plurality of gate spacers 140 and the side surfaces of the plurality of gate electrodes 172.

Each of the plurality of nanosheet stacked structures NSS may include a plurality of nanosheets N1, N2, and N3 extending above the substrate 102 to be in parallel to the upper surfaces of the plurality of fin-type active areas FA. The plurality of nanosheets N1, N2, and N3 constituting a single nanosheet stacked structure NSS are stacked one by one above the upper surface of the plurality of fin-type active area FA. Although the present embodiment illustrates a case in which a single nanosheet stacked structure NSS includes three nanosheets N1, N2, and N3, the technical idea of the inventive concept is not limited thereto, and a single nanosheet stacked structure NSS may include variously selected numbers of nanosheets in accordance with different circumstances. Each of the plurality of nanosheets N1, N2, and N3 may have a channel area.

The integrated circuit device 2 may further include the plurality of first contact plugs 192 electrically connected to the plurality of source/drain areas 110 by passing through the interlayer insulating layer 150, and the plurality of second contact plugs 194 electrically connected to the plurality of gate electrodes 172 by passing through the gate capping layer 180. The integrated circuit device 2 may further include the plurality of source/drain areas 110 on the plurality of fin-type active area FA. Each of the plurality of source/drain areas 110 is connected to one neighboring ends of the plurality of nanosheets N1, N2, and N3.

On the plurality of fin-type active areas FA, the plurality of gate electrodes 172 may extend in the second horizontal direction (the Y direction) intersecting with the first horizontal direction (the X direction). At least a portion of the plurality of gate electrodes 172 may overlap each of the plurality of nanosheet stacked structures NSS in a vertical direction (a Z direction). The plurality of gate electrodes 172 may surround the plurality of nanosheets N1, N2, and N3 constituting the plurality of nanosheet stacked structures NSS. The gate insulating layer 160 is formed between the plurality of nanosheets N1, N2, and N3 constituting the plurality of nanosheet stacked structures NSS and the plurality of gate electrodes 172.

Each of the plurality of gate electrodes 172 may include a main gate part 172M covering an upper surface of the nanosheet stacked structure NSS, and a plurality of sub-gate parts 172S connected to the main gate part 172M and formed in spaces between the fin-type active area FA and the plurality of nanosheets N1, N2, and N3, i.e., at respective lower sides of the plurality of nanosheets N1, N2, and N3.

In some embodiments, the plurality of nanosheets N1, N2, and N3 may include a single material. In some embodiments, the plurality of nanosheets N1, N2, and N3 may include the same material as that of the substrate 102.

In some embodiments, an insulating spacer in contact with the source/drain area 110 may be in spaces between the plurality of nanosheets N1, N2, and N3. The insulating spacer may be between the sub-gate part 172S and the source/drain area 110 in a space between the fin-type active area FA and each of the plurality of nanosheets N1, N2, and N3. In some embodiments, the insulating spacer may include a silicon nitride layer. The insulating spacer may cover sidewalls of at least a portion of the plurality of sub-gate parts 172S with the gate dielectric layer 160 therebetween.

Figure 21A:
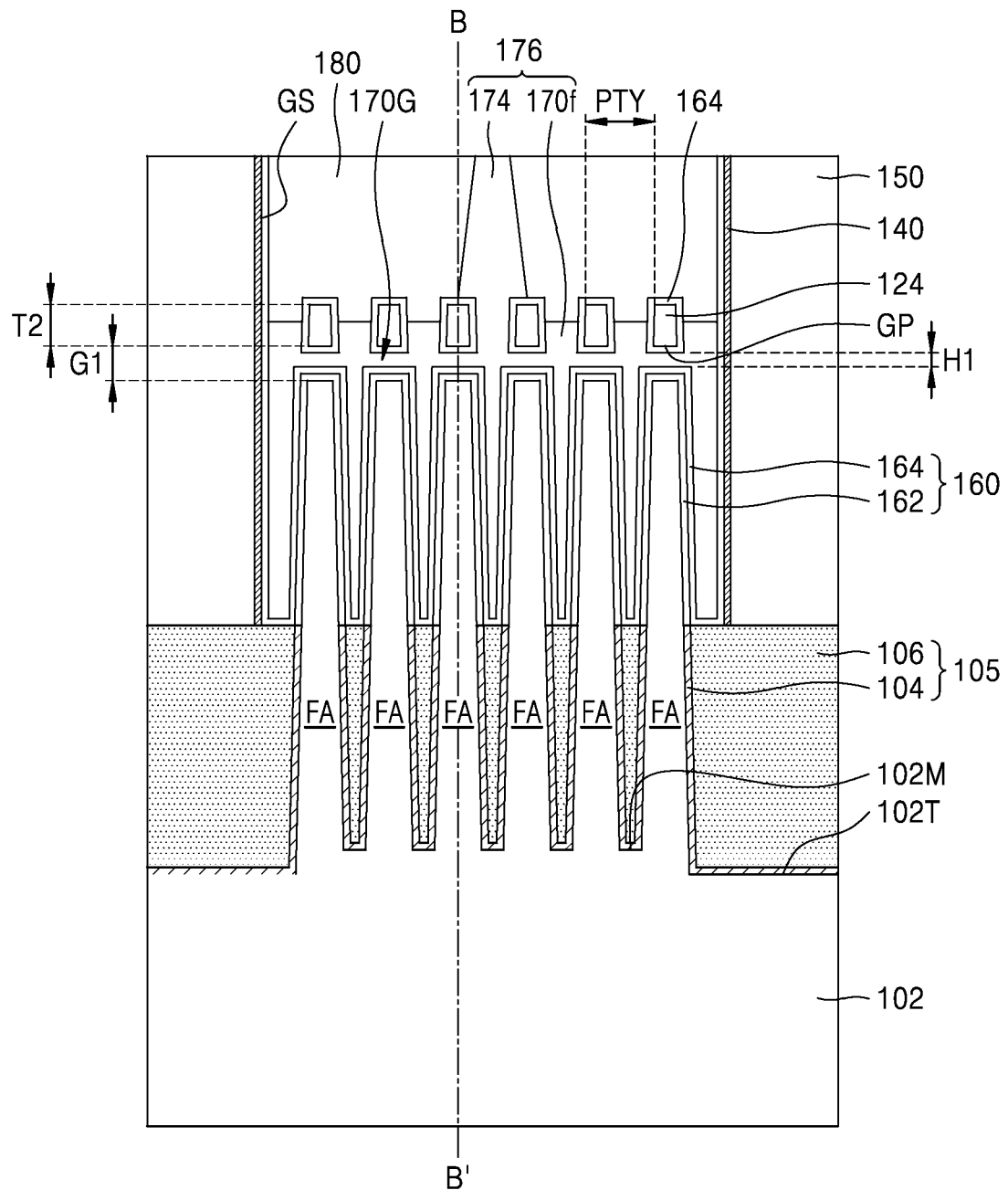
FIGS. 21A and 21B are cross-sectional views of integrated circuit devices according to embodiments of the inventive concept, respectively.
Figure 21B:
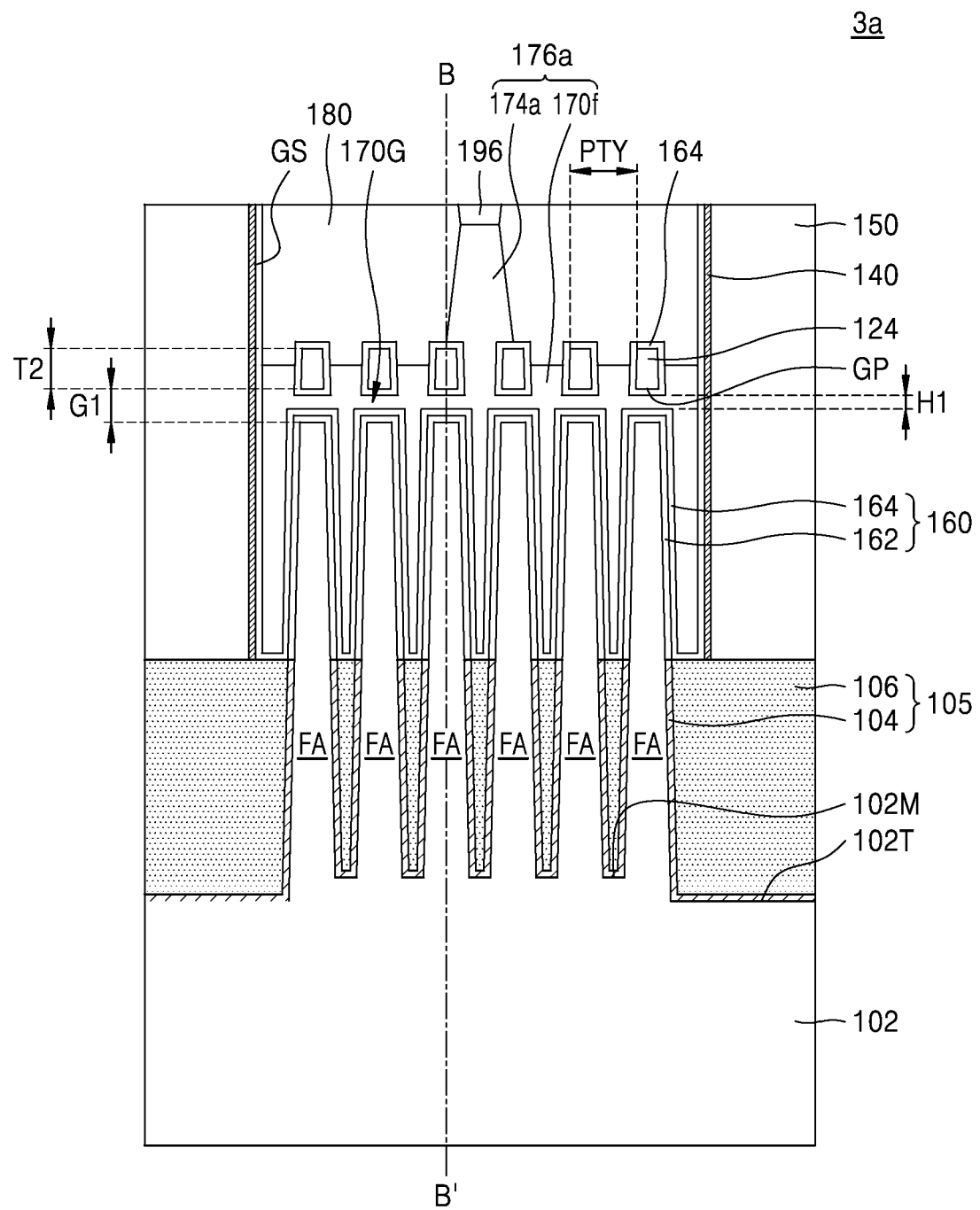

FIGS. 21A and 21B are cross-sectional views of integrated circuit devices 3 and 3a according to embodiments of the inventive concept, respectively.

Referring to FIG. 21A, the integrated circuit device 3 according to the inventive concept may include the substrate 102 having the plurality of fin-type active areas FA limited/defined (e.g., bounded) by the substrate trench 102T, protruding from the main surface 102M of the substrate 102, and extending in the first horizontal direction (the X direction), the device isolation layer 105 filling a partial lower portion of the substrate trench 102T, the plurality of stopper layers 124 separated from the plurality of fin-type active areas FA above the plurality of fin-type active areas FA, the gate insulating layer 160, which includes the first dielectric layer 162 conformally covering the surfaces of the plurality of fin-type active areas FA and the second dielectric layer 164 conformally covering the surfaces of the device isolation layer 105, the plurality of stopper layers 124, the first dielectric layer 162, and the plurality of gate spacers 140, a plurality of gate electrodes 176 filling a portion of the gate space GS, and the gate capping layer 180 filling, on the plurality of gate electrodes 176, a partial upper portion of the gate space GS. The plurality of gate spacers 140 may cover side surfaces of the plurality of gate electrodes 176. A portion of the gate insulating layer 160 may be interposed in at least portions between the plurality of gate spacers 140 and the side surfaces of the plurality of gate electrodes 176. In some embodiments, a portion of the second dielectric layer 164 may be interposed in at least a portion between the plurality of gate spacers 140 and the side surfaces of the plurality of gate electrodes 176.

The integrated circuit device 3 may further include the plurality of source/drain areas 110 formed on portions of the plurality of fin-type active areas FA, which are exposed between stacked structures of the gate insulating layer 160 and the plurality of gate electrodes 176, opposite side surfaces of the stacked structures being covered by the plurality of gate spacers 140.

On the plurality of fin-type active areas FA, the plurality of gate electrodes 176 may extend in the second horizontal direction (the Y direction) intersecting with the first horizontal direction (the X direction). Each of the plurality of gate electrodes 176 may include an electrode part 170f and a contact part 174. The electrode parts 170f of the plurality of gate electrodes 176 may include the plurality of gap electrode parts 170G filling the plurality of gap spaces GP, and the plurality of gap electrode parts 170G may cover the upper surfaces of the plurality of fin-type active areas FA. In the process of forming the plurality of gate electrodes 170, which has been described with reference to FIGS. 11A to 12B, the plurality of gate electrodes 176 may be formed by forming a contact mask pattern on the preliminary gate electrode 170P overlapping the contact parts 174 in the vertical direction (the Z direction), and then using the contact mask pattern as an etching mask to remove a portion of the preliminary gate electrode 170P. The electrode part 170f and the contact part 174 constituting each of the plurality of gate electrodes 176 are parts of the preliminary gate electrode 170P and may be thus integrated. The electrode part 170f may correspond to the gate electrode 170 shown in FIGS. 14A and 14B, and the contact part 174 may be on the electrode part 170f and be a part of the preliminary gate electrode 170P overlapping the contact mask pattern in the vertical direction (the Z direction).

The integrated circuit device 3 may further include the plurality of first contact plugs 192 electrically connected to the plurality of source/drain areas 110 by passing through the interlayer insulating layer 150 as shown in FIG. 14B. The contact parts 174 of the plurality of gate electrodes 176 may perform the same function as that of the plurality of second contact plugs 194 shown in FIG. 14A.

Referring to FIG. 21B, the integrated circuit device 3a according to the inventive concept may include the substrate 102 having the plurality of fin-type active areas FA limited/defined (e.g., bounded) by the substrate trench 102T, protruding from the main surface 102M of the substrate 102, and extending in the first horizontal direction (the X direction), the device isolation layer 105 filling a partial lower portion of the substrate trench 102T, the plurality of stopper layers 124 separated from the plurality of fin-type active areas FA above the plurality of fin-type active areas FA, the gate insulating layer 160, which includes the first dielectric layer 162 conformally covering the surfaces of the plurality of fin-type active areas FA and the second dielectric layer 164 conformally covering the surfaces of the device isolation layer 105, the plurality of stopper layers 124, the first dielectric layer 162, and the plurality of gate spacers 140, a plurality of gate electrodes 176a filling a portion of the gate space GS, a plurality of landing pads 196 arranged on the plurality of gate electrodes 176a and electrically connected to the plurality of gate electrodes 176a, and the gate capping layer 180 filling, on the plurality of gate electrodes 176a, a partial upper portion of the gate space GS. The plurality of gate spacers 140 may cover side surfaces of the plurality of gate electrodes 176a. A portion of the gate insulating layer 160 may be interposed in at least portions between the plurality of gate spacers 140 and the side surfaces of the plurality of gate electrodes 176a. In some embodiments, a portion of the second dielectric layer 164 may be interposed in at least a portion between the plurality of gate spacers 140 and the side surfaces of the plurality of gate electrodes 176a.

The integrated circuit device 3a may further include the plurality of source/drain areas 110 formed on portions of the plurality of fin-type active areas FA, which are exposed between stacked structures of the gate insulating layer 160 and the plurality of gate electrodes 176a, opposite side surfaces of the stacked structures being covered by the plurality of gate spacers 140.

On the plurality of fin-type active areas FA, the plurality of gate electrodes 176a may extend in the second horizontal direction (the Y direction) intersecting with the first horizontal direction (the X direction). Each of the plurality of gate electrodes 176a may include the electrode part 170f and a contact part 174a. The electrode parts 170f of the plurality of gate electrodes 176a may include the plurality of gap electrode parts 170G filling the plurality of gap spaces GP, and the plurality of gap electrode parts 170G may cover the upper surfaces of the plurality of fin-type active areas FA. With respect to the plurality of gate electrodes 176a and the plurality of landing pads 196, in the process of forming the plurality of gate electrodes 170, which has been described with reference to FIGS. 11A to 12B, a contact mask pattern may be formed on the preliminary gate electrode 170P overlapping the contact parts 174a in the vertical direction (the Z direction), and then a portion of the preliminary gate electrode 170P is removed by using the contact mask pattern as an etching mask. Thereafter, the plurality of gate electrodes 176a and the plurality of landing pads 196 may be formed by removing a portion of the gate capping layer 180 and a portion of the preliminary gate electrode 170P below the contact mask pattern and filling a part, from which the portion of the gate capping layer 180 and the portion of the preliminary gate electrode 170P below the contact mask pattern are removed, with a conductive material for forming the plurality of landing pads 196. The electrode part 170f and the contact part 174a constituting each of the plurality of gate electrodes 176a are parts of the preliminary gate electrode 170P and may be thus integrated. The contact parts 174a of the plurality of gate electrodes 176a may have a tapered shape of which a horizontal area gradually decreases away from the main surface 102M of the substrate 102, and the plurality of landing pads 196 may have a tapered shape of which a horizontal area gradually increases away from the main surface 102M of the substrate 102.

The electrode part 170f may correspond to the gate electrode 170 shown in FIGS. 14A and 14B, and the contact part 174a may be on the electrode part 170f and be a part of the preliminary gate electrode 170P overlapping the contact mask pattern in the vertical direction (the Z direction).

The integrated circuit device 3a may further include the plurality of first contact plugs 192 electrically connected to the plurality of source/drain areas 110 by passing through the interlayer insulating layer 150 as shown in FIG. 14B. The contact parts 174a of the plurality of gate electrodes 176a and the plurality of landing pads 196 may perform the same function as that of the plurality of second contact plugs 194 shown in FIG. 14A.

While the inventive concept has been particularly shown and described with reference to embodiments thereof, it will be understood that various changes in form and details may be made therein without departing from the scope of the following claims.

What is claimed is:

1. An integrated circuit device comprising:
a fin-type active area protruding from a substrate and extending in a first horizontal direction;
a stopper layer that is above and spaced apart from the fin-type active area;
a gate electrode extending in a second horizontal direction orthogonal to the first horizontal direction, on the fin-type active area, and in a space between the fin-type active area and the stopper layer; and
a gate capping layer on an upper surface of the gate electrode and an upper surface of the stopper layer,
wherein a vertical level of the upper surface of the gate electrode is higher than a lower surface of the stopper layer.

2. The integrated circuit device of claim 1, wherein the vertical level of the upper surface of the gate electrode is lower than the upper surface of the stopper layer.

3. The integrated circuit device of claim 2, wherein the gate capping layer is on at least an upper portion of a side surface of the stopper layer.

4. The integrated circuit device of claim 1, wherein the gate electrode has a recess having a concave shape on a central portion of the upper surface of the gate electrode.

5. The integrated circuit device of claim 4, further comprising a gate spacer on a side surface of the gate electrode,
wherein the upper surface of the gate electrode has an uppermost point at a portion adjacent to the stopper layer or a portion adjacent to the gate spacer, and
wherein the uppermost point of the upper surface of the gate electrode is located between the upper surface of the stopper layer and a lower surface of the stopper layer.

6. The integrated circuit device of claim 4, wherein a lowermost point of the upper surface of the gate electrode is located between the upper surface of the stopper layer and a lower surface of the stopper layer.

7. The integrated circuit device of claim 4, wherein a lowermost point of the upper surface of the gate electrode is located at a vertical level lower than an upper surface of the fin-type active area.

8. The integrated circuit device of claim 1,
wherein the fin-type active area has a rounded shape at upper corner portions thereof, and
wherein a portion of the gate electrode that is in the space between the fin-type active area and the stopper layer comprises a gap electrode part having a flat upper surface and a concave lower surface.

9. The integrated circuit device of claim 1, further comprising a plurality of nanosheets located between the fin-type active area and the stopper layer,
wherein the gate electrode surrounds the plurality of nanosheets.

10. An integrated circuit device comprising:
a plurality of fin-type active areas protruding from a substrate;
a plurality of stoppers that are above and spaced apart from the plurality of fin-type active areas;
a plurality of gate electrodes on the plurality of fin-type active areas and between the plurality of fin-type active areas and the plurality of stoppers;
a gate insulating layer between the plurality of gate electrodes and the plurality of fin-type active areas;
a plurality of gate spacers having the gate insulating layer therebetween, wherein the plurality of gate spacers are on side surfaces of the plurality of gate electrodes; and
a gate capping layer on upper surfaces of the plurality of gate electrodes, at least upper portions of side surfaces of the plurality of stoppers, and upper surfaces of the plurality of stoppers,
wherein the upper surfaces of the plurality of gate electrodes are located at a vertical level lower than the upper surfaces of the plurality of stoppers and have a plurality of recesses having a concave shape at central portions thereof, and the gate capping layer is in the plurality of recesses.

11. The integrated circuit device of claim 10, wherein the vertical level of the upper surfaces of the plurality of gate electrodes is higher than a vertical level of lower surfaces of the plurality of stoppers.

12. The integrated circuit device of claim 10, wherein a vertical level of first portions of the upper surfaces of the plurality of gate electrodes in contact with first portions of the gate insulating layer surrounding the plurality of stoppers is different from a vertical level of second portions of the upper surfaces of the plurality of gate electrodes in contact with second portions of the gate insulating layer on the plurality of gate spacers.

13. The integrated circuit device of claim 12, wherein uppermost ends of the upper surfaces of the plurality of gate electrodes are in contact with the first portions of the gate insulating layer surrounding the plurality of stoppers.

14. The integrated circuit device of claim 12, wherein uppermost ends of the upper surfaces of the plurality of gate electrodes are in contact with the second portions of the gate insulating layer on the plurality of gate spacers.

15. The integrated circuit device of claim 10, further comprising a contact plug that is on and electrically connected to a first recess of the plurality of recesses.

16. The integrated circuit device of claim 10, wherein the plurality of recesses extend from between the upper surfaces of the plurality of stoppers and lower surfaces of the plurality of stoppers to locations at a vertical level lower than upper surfaces of the plurality of fin-type active areas.

17. An integrated circuit device comprising:
- a plurality of fin-type active areas protruding from a substrate;
- a plurality of stoppers that are above and spaced apart from the plurality of fin-type active areas;
- a plurality of gate electrodes on the plurality of fin-type active areas, between the plurality of fin-type active areas and the plurality of stoppers, and having a plurality of recesses of a concave shape in upper surfaces of the plurality of gate electrodes located at a vertical level lower than upper surfaces of the plurality of stoppers and higher than lower surfaces of the plurality of stoppers;
- a plurality of gate spacers on side surfaces of the plurality of gate electrodes;
- a first dielectric layer between the plurality of gate electrodes and the plurality of fin-type active areas;
- a second dielectric layer on the first dielectric layer between the plurality of gate electrodes and the plurality of fin-type active areas, surrounding the plurality of stoppers, between the plurality of gate electrodes and the plurality of gate spacers, and comprising a material having a dielectric constant greater than that of a material of the first dielectric layer; and
- a gate capping layer in the plurality of recesses, on upper portions of side surfaces of the plurality of stoppers, and on the upper surfaces of the plurality of stoppers.

18. The integrated circuit device of claim 17, wherein a thickness of each of the plurality of stoppers is greater than each of a plurality of gaps between the lower surfaces of the plurality of stoppers and the plurality of fin-type active areas.

19. The integrated circuit device of claim 17, wherein the plurality of stoppers includes silicon nitride (SiN), silicon oxynitride (SiON), or silicon carbonitride (SiCN).

* * * * *